United States Patent
Shiino et al.

(10) Patent No.: US 12,080,361 B2
(45) Date of Patent: Sep. 3, 2024

(54) MEMORY DEVICE AND MEMORY SYSTEM

(71) Applicant: Kioxia Corporation, Tokyo (JP)

(72) Inventors: Yasuhiro Shiino, Fujisawa Kanagawa (JP); Masahiko Iga, Yokohama Kanagawa (JP); Shinji Suzuki, Sagamihara Kanagawa (JP)

(73) Assignee: Kioxia Corporation, Tokyo (JP)

( * ) Notice: Subject to any disclaimer, the term of this patent is extended or adjusted under 35 U.S.C. 154(b) by 139 days.

(21) Appl. No.: 17/686,835

(22) Filed: Mar. 4, 2022

(65) Prior Publication Data

US 2023/0064140 A1 Mar. 2, 2023

(30) Foreign Application Priority Data

Aug. 27, 2021 (JP) ................... 2021-138940

(51) Int. Cl.
| | |
|---|---|
| *G11C 16/34* | (2006.01) |
| *G11C 7/08* | (2006.01) |
| *G11C 7/10* | (2006.01) |
| *G11C 16/10* | (2006.01) |
| *G11C 16/26* | (2006.01) |

(52) U.S. Cl.
CPC ............ *G11C 16/3459* (2013.01); *G11C 7/08* (2013.01); *G11C 7/1063* (2013.01); *G11C 16/102* (2013.01); *G11C 16/26* (2013.01)

(58) Field of Classification Search
CPC ..... G11C 16/3459; G11C 7/08; G11C 7/1063; G11C 16/102
See application file for complete search history.

(56) References Cited

U.S. PATENT DOCUMENTS

| | | | |
|---|---|---|---|
| 7,889,558 B2 | 2/2011 | Kanda | |
| 8,179,721 B2 | 5/2012 | Han | |
| 10,354,989 B1* | 7/2019 | Billingsley | ............ H10B 43/35 |
| 2013/0339603 A1 | 12/2013 | Zhu et al. | |
| 2016/0343718 A1* | 11/2016 | Lu | ............ H10B 43/27 |
| 2019/0198515 A1* | 6/2019 | Hosoda | ............ H10B 43/35 |
| 2023/0145681 A1* | 5/2023 | Joe | ............ G11C 16/10 |
| | | | 365/189.011 |

FOREIGN PATENT DOCUMENTS

JP          5111882 B2    10/2012

* cited by examiner

*Primary Examiner* — Han Yang
(74) *Attorney, Agent, or Firm* — Holtz, Holtz & Volek PC

(57) ABSTRACT

A second conductor, third conductor, and fourth conductor sandwiches a first layer together with a first semiconductor. The fourth conductor is positioned farther from the first conductor than the third conductor, which is positioned farther from first conductor than the second conductor. A first circuit is configured to apply a first potential to the first and second conductors, apply a second potential lower than the first potential to the third conductor in parallel with the application of the first potential, and apply a third potential higher than the second potential and lower than the first potential to the fourth conductor in parallel with the application of the first potential.

18 Claims, 42 Drawing Sheets

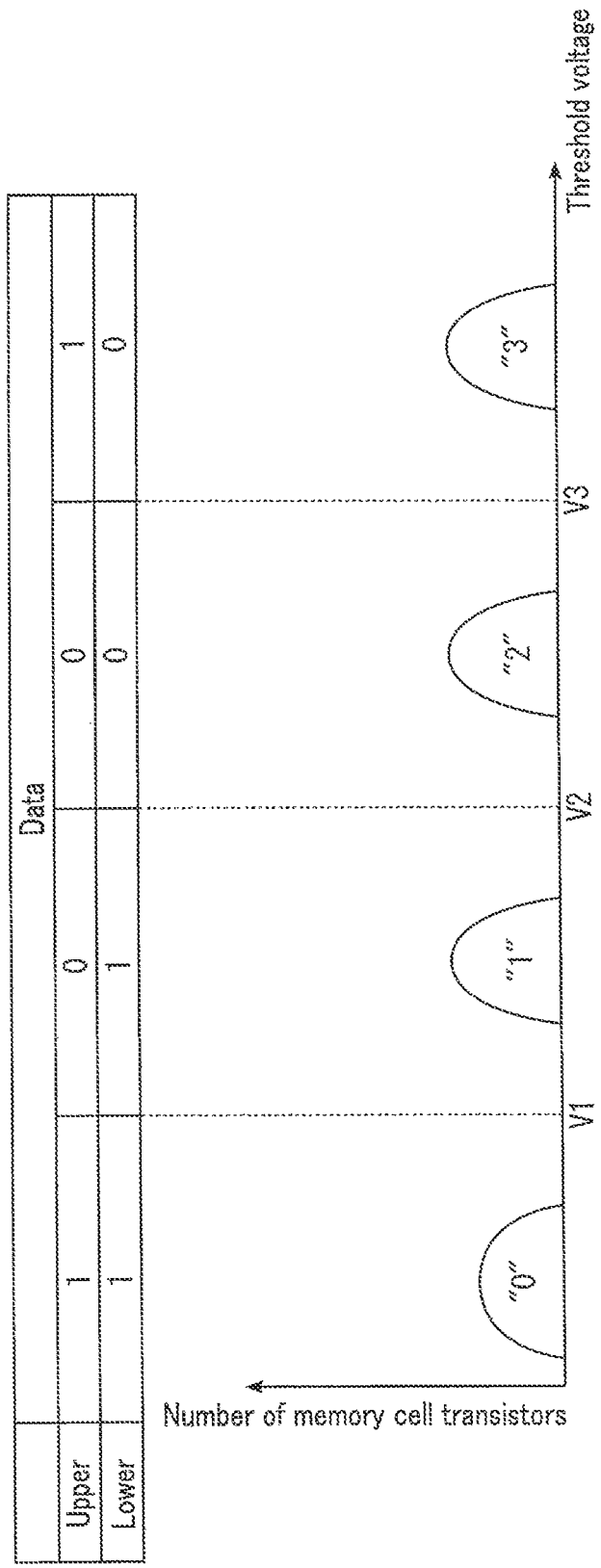
F I G. 14

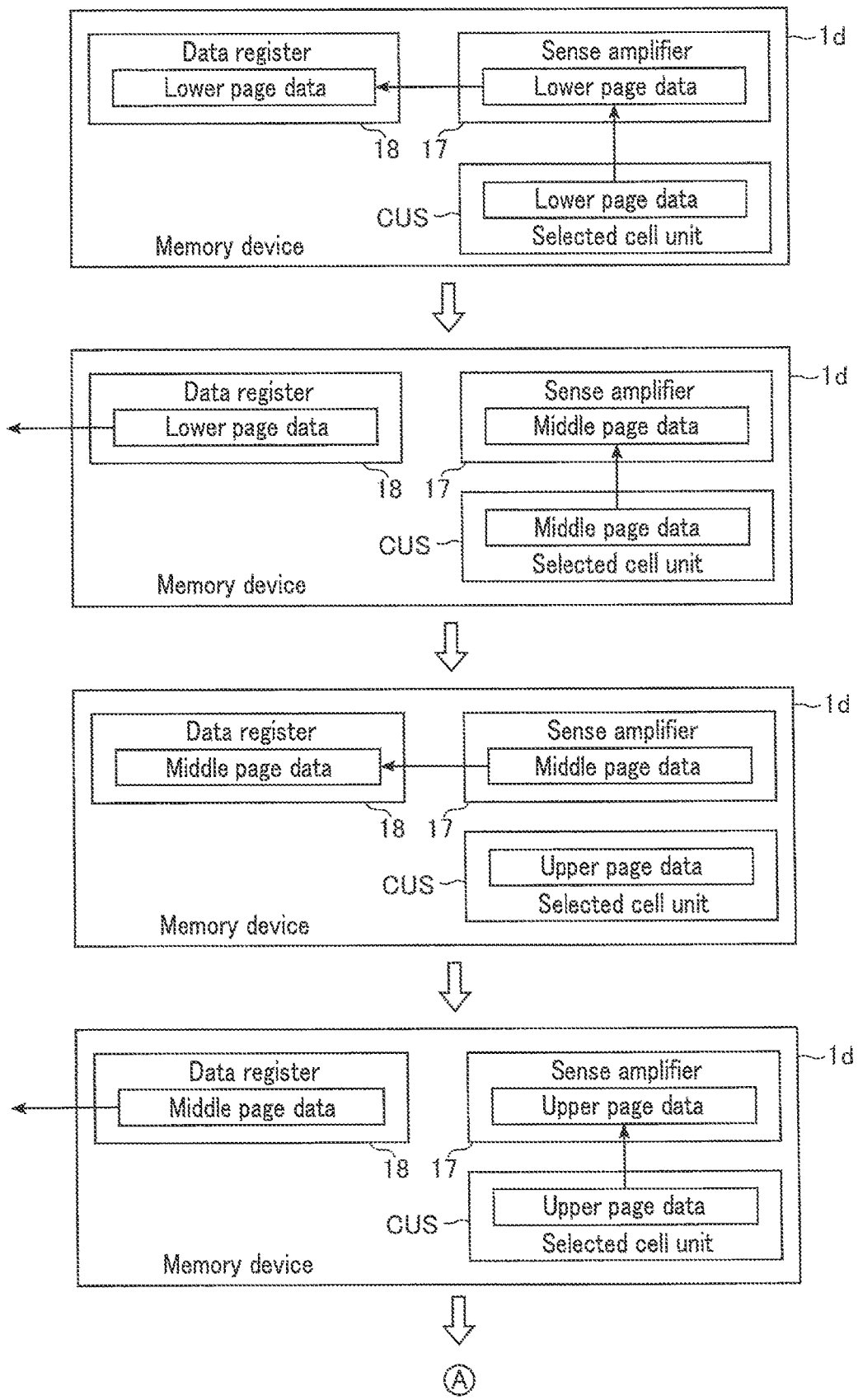
F I G. 26

MEMORY DEVICE AND MEMORY SYSTEM

CROSS-REFERENCE TO RELATED APPLICATIONS

This application is based upon and claims the benefit of priority from Japanese Patent Application No. 2021-138940, filed Aug. 27, 2021, the entire contents of which are incorporated herein by reference.

FIELD

Embodiments described herein relate generally to memory devices and memory systems.

BACKGROUND

A memory system including a memory device and a controller that controls the memory device is known. The memory system is required to be able to hold data with high reliability.

BRIEF DESCRIPTION OF THE DRAWINGS

FIG. 14 illustrates another example of the distribution of the threshold voltages of the memory cell transistors of the memory system according to the second embodiment;

FIG. 26 illustrates an example of the generation and movement of data during D4 reading in the memory system according to the fourth embodiment;

DETAILED DESCRIPTION

Figure 1:
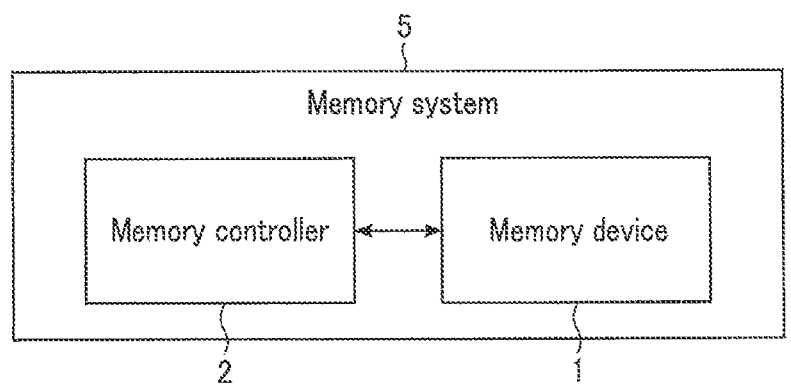
FIG. 1 illustrates components and a coupling of a memory system according to a first embodiment, and related components.

In general, according to one embodiment, a memory device includes: a first conductor; a first semiconductor; a first layer; a second conductor; a third conductor; a fourth conductor; and a first circuit.

The first semiconductor extends along a first axis and is in contact with the first conductor at an end. The first layer is spaced from the first semiconductor, extends along the first axis, and is made of an insulator or a conductor. The second conductor faces the first conductor and sandwiches the first layer together with the first semiconductor. The third conductor sandwiches the first layer together with the first semiconductor and is positioned farther from the first conductor than the second conductor is. The fourth conductor sandwiches the first layer together with the first semiconductor, is positioned farther from the first conductor than the third conductor is, and is aligned with the third conductor. The first circuit is configured to apply a first potential to the first conductor and the second conductor, apply a second potential lower than the first potential to the third conductor in parallel with the application of the first potential, and apply a third potential higher than the second potential and lower than the first potential to the fourth conductor in parallel with the application of the first potential.

Embodiments will now be described with reference to the figures. In the following description, components with substantially the same functionalities and configurations will be referred to with the same reference symbols, and repeated descriptions may be omitted. In order to distinguish components having substantially the same function and configuration from each other, an additional numeral or letter may be added to the end of each reference numeral. For components with substantially the same function and configuration in one embodiment and a subsequent embodiment, an additional number or letter will be appended at the end of a reference numeral indicating the component in the subsequent embodiment for distinction from the component in the preceding embodiment. For example, a specific component 1 in a second embodiment may be referred to as a "component 1b."

With respect to matters other than those described in a certain embodiment regarding a certain component, all the matters discussed in the preceding embodiment regarding a component with substantially the same function and configuration apply.

In an embodiment subsequent to an embodiment that has already been described, matters that differ from the already described embodiment will mainly be discussed. The entire description of a particular embodiment also applies to another embodiment unless explicitly mentioned otherwise or obviously eliminated.

Each functional block can be implemented as hardware, computer software, or a combination of both. It is not necessary that functional blocks be distinguished as in the following examples. For example, some of the functions may be implemented by functional blocks different from those illustrated below. Furthermore, an illustrated functional block may be divided into functional sub-blocks.

In the specification and the claims, a phrase of a particular first component being "coupled" to another second component includes the first component being coupled to the second component either directly or via one or more components which are always or selectively conductive.

1. First Embodiment

1.1. Structure (Configuration)
1.1.1. Memory System

FIG. 1 illustrates an example of components and a coupling of a memory system 5 according to the first embodiment.

The memory system 5 is a system that receives requests to process data from a host device (not illustrated) and performs various processes including storage of data and reading of data based on the received request. Examples of the memory system 5 include a solid state drive (SSD) and various memory cards.

As illustrated in FIG. 1, the memory system 5 includes a memory device 1 and a memory controller 2. The memory device 1 is a memory that stores data in a nonvolatile manner. The memory device 1 includes one or more semiconductor chips. The memory device 1 is, for example, a NAND flash memory. The following description is based on an example in which the memory device 1 is a NAND flash memory.

The memory controller 2 is a controller that controls the memory device 1. The memory controller 2 controls the memory device 1 so as to perform the processes indicated by the requests from the host device. Examples of the form of the memory controller 2 include a semiconductor chip and a system on a chip (SoC).

1.1.2. Memory Controller

Figure 2:
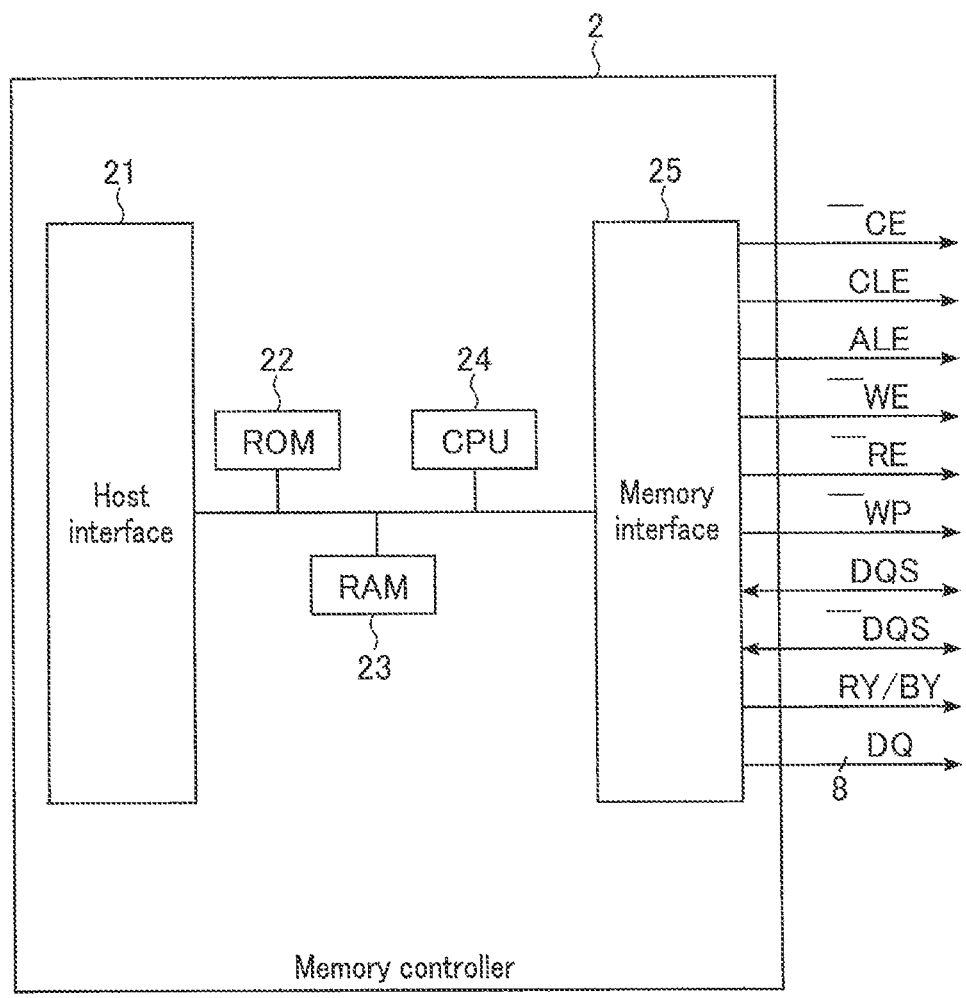
FIG. 2 illustrates an example of components and couplings of a memory controller according to the first embodiment.

FIG. 2 illustrates an example of components and couplings of the memory controller 2 according to the first embodiment.

The memory controller 2 includes a host interface 21, a read only memory (ROM) 22, a random access memory (RAM) 23, a central processing unit (CPU) 24, and a memory interface 25.

The host interface 21 is an interface for the memory controller 2 to communicate with the host device. The host interface 21 can include hardware or a combination of hardware and software. The host interface 21 is coupled to the host device according to the communication standard with which the host interface 21 is compliant.

The ROM 22 is a nonvolatile memory. Examples of the ROM 22 include an electrically erasable programmable read only memory (EEPROM). The ROM 22 stores a program including firmware.

The RAM 23 is a volatile memory. The RAM 23 temporarily stores data, and stores a program stored in the ROM 22 while the memory system 5 is supplied with power.

The CPU 24 is a circuit that controls the entire operation of the memory controller 2. The memory controller 2 performs various operations by the CPU 24 executing a program stored in the ROM 22 and loaded in the RAN 23. The firmware is configured to cause the CPU 24 to perform operations described in the embodiments.

The memory interface 25 is an interface for the memory controller 2 to communicate with the memory device 1. The memory interface 25 can include hardware or a combination of hardware and software. The memory interface 25 is coupled to the memory device 1 by interconnects for enabling communication of a type based on the type of the memory device 1. Based on an example in which the memory device 1 is a NAND flash memory, the memory interface 25 is a NAND memory interface.

A set of interconnects based on the NAND memory interface transmits a plurality of control signals and an input/output signal DQ. The control signals include signals ⁻CE, CLE, ALE, ⁻WE, ⁻RE, and ⁻WP, data strobe signals DQS and ⁻DQS, and a ready/busy signal RY/BY. The sign "⁻" indicates logic obtained by inverting logic of a signal having a name without the sign "⁻". The memory device 1 receives the input/output signal DQ and transmits the input/ output signal DQ. The input/output signal DQ has, for example, an 8-bit width and includes a command (CMD), write data or read data (DAT), address information (ADD), and a status (STA).

The signal ⁻CE enables the memory device 1. The signal CLE notifies the memory device 1 of the transmission of the command by the input/output signal DQ. The signal ALE notifies the memory device 1 of the transmission of the address information by the input/output signal DQ. The signal ⁻WE instructs the memory device 1 to capture the input/output signal DQ. The signal ⁻RE instructs the memory device 1 to output the input/output signal DQ. The ready/busy signal RY/BY indicates whether the memory device 1 is in a ready state or a busy state, and indicates the busy state by a low level. The memory device 1 receives a command in the ready state, and does not receive a command in the busy state.

1.1.3. Memory

Figure 3:
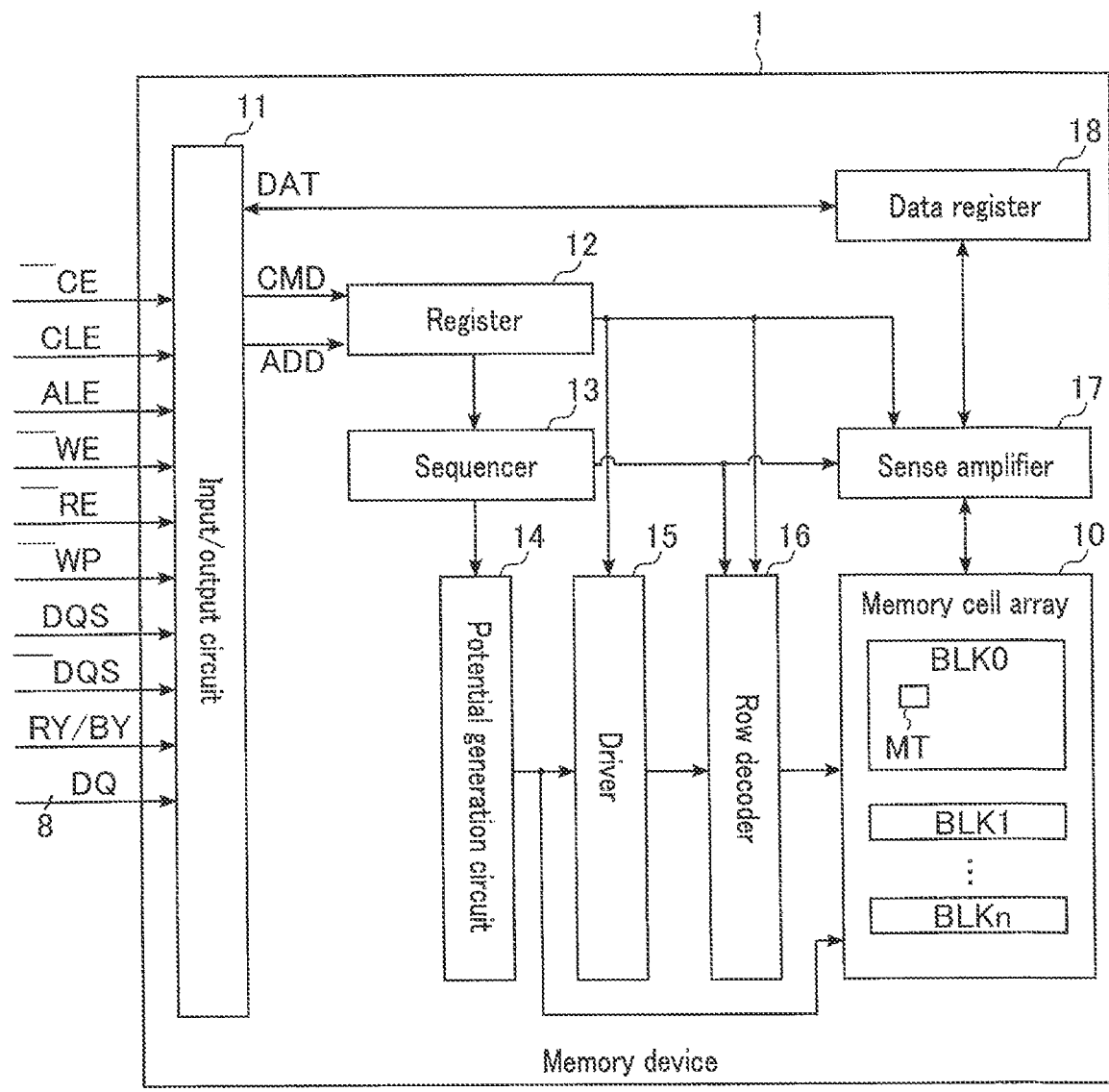
FIG. 3 illustrates an example of components and couplings of a memory device according to the first embodiment.

FIG. 3 illustrates an example of components and couplings of the memory device 1 according to the first embodiment. The memory device 1 includes components such as a memory cell array 10, an input/output circuit 11, a register 12, a sequencer 13, a potential generation circuit 14, a driver 15, a row decoder 16, a sense amplifier 17, and a data register (data cache) 18.

The memory cell array 10 is a set of arrayed memory cells. The memory cell array 10 includes a plurality of memory blocks (block) BLK (BLK0, BLK1, ... ). Each block BLK includes a plurality of memory cell transistors MT. Word lines WL (not illustrated) and bit lines BL (not illustrated) are also positioned in the memory cell array 10.

The input/output circuit 11 is coupled to the memory controller 2 by the interconnects based on the NAND memory interface.

The register 12 is a circuit that holds the command CMD and the address information ADD received by the memory controller 2. The command CMD instructs the sequencer 13 to perform various operations including data reading, data writing, and data erasing. The address information ADD includes, for example, block address, a page address, and a column address. The block address, the page address, and the column address designate a block BLK, a word line WL, and a bit line BL, respectively.

The sequencer 13 is a circuit that controls the entire operation of the memory device 1. The sequencer 13 controls the potential generation circuit 14, the row decoder 16, and the sense amplifier 17 based on the command CMD received from the register 12 to perform various operations including data reading, data writing, and data erasing.

The potential generation circuit 14 is a circuit that generates potentials (voltages) having a plurality of different magnitudes. The potential generation circuit 14 receives a power supply potential from the outside of the memory device 1 and generates a plurality of potentials from the power supply potential. The generated potentials are supplied to components such as the memory cell array 10 and the driver 15. By applying various potentials, voltages are applied to various components and wirings in the memory device 1.

The driver 15 is a circuit that applies various potentials necessary for the operation of the memory device 1 to some of the components. The driver 15 receives a plurality of potentials from the potential generation circuit 14 and supplies a selected one of the plurality of potentials to the row decoder 16.

The row decoder 16 is a circuit for selecting a block BLK. The row decoder 16 transfers the potentials supplied from the driver 15 to a single block BLK selected based on the block address received from the register 12.

The sense amplifier 17 is a circuit that determines data stored in the memory cell array 10. The sense amplifier 17 senses the states of the memory cell transistors MT and generates read data or transfers write data to the memory cell transistors MT based on the sensed states.

The data register 18 is a circuit that holds data for data input and output by the memory device 1. The data register 18 receives the data DAT received by the memory device 1 and provides data based on the received data DAT to the sense amplifier 17. The data register 18 receives data from the sense amplifier 17 and supplies the data DAT based on the received data to the input output circuit 11.

1.1.4. Memory Cell Array

Figure 4:
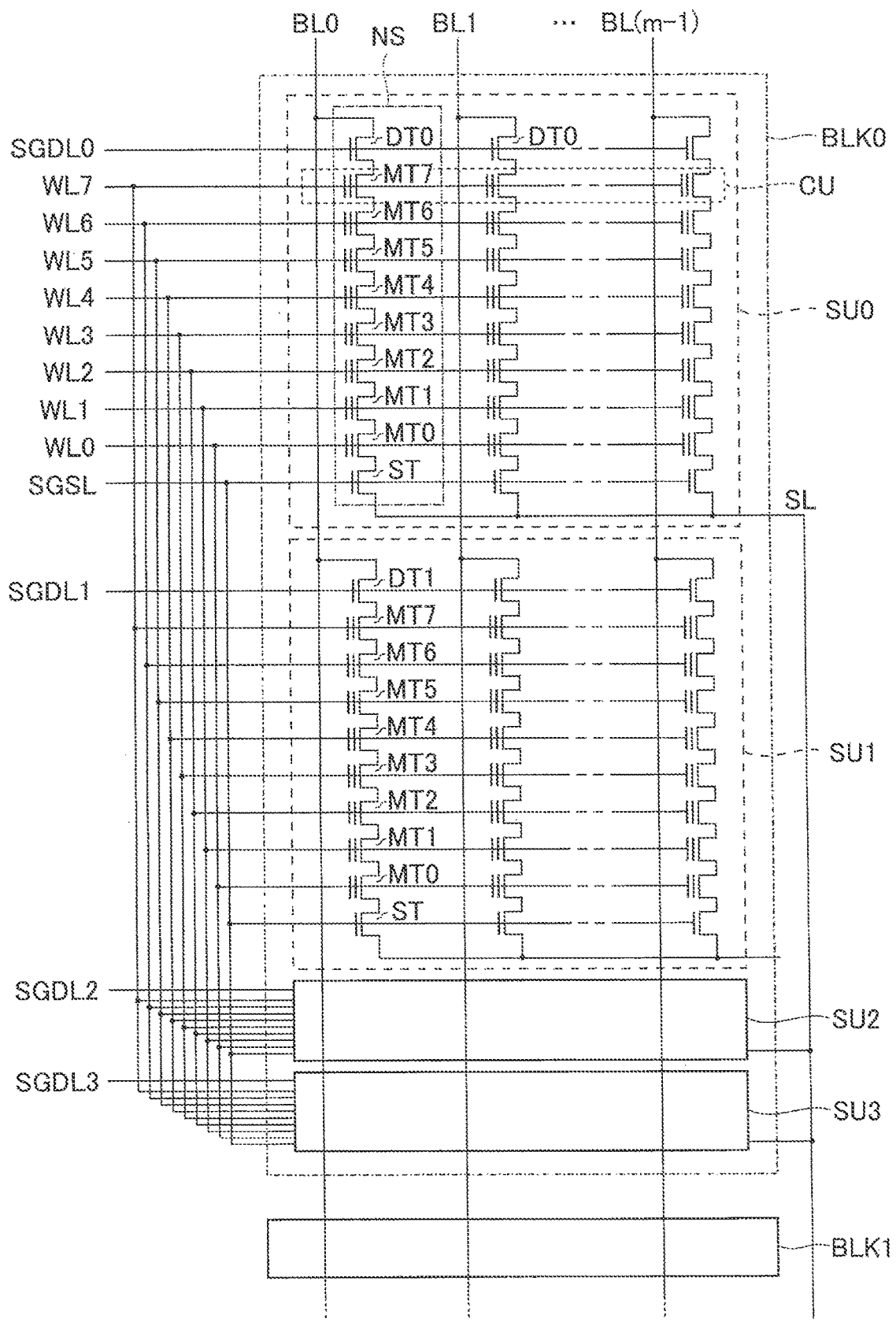
FIG. 4 illustrates an example of components and couplings in a part of a memory cell array according to the first embodiment.

FIG. 4 illustrates an example of some components and couplings of a part of the memory cell array 10 according to the first embodiment, and illustrates components and couplings of a single block BLK0 and related components. The plurality of blocks BLK, for example, all the blocks BLK, include components and couplings illustrated in FIG. 4.

A single block BLK includes a plurality of (for example, four) string units SU0 to SU3.

Each of a number m (m is a natural number) of bit lines BL0 to BL(m−1) is coupled to a single NAND string NS from each of the string units SU0 to SU3 in each block BLK.

Each of NAND strings NS includes a single select gate transistor ST, a plurality of (for example, eight) memory cell transistors MT (MT0 to MT7), and a single select gate transistor DT (DT0, DT1, DT2, or DT3). The transistors ST, MT, and DT are coupled in series between a source line SL and a single bit line BL in this order. Each memory cell transistor MT includes a control gate electrode (word line WL) and a charge storage layer insulated from the surroundings, and can store data in a nonvolatile manner based on the amount of charges in the charge storage layer.

NAND strings NS coupled to the plurality of different bit lines BL constitute a single string unit SU. In each string unit SU, the control gate electrodes of the memory cell transistors MT0 to MT7 are coupled to the word lines WL0 to WL7, respectively. A set of memory cell transistors MT sharing a word line WL in a single string unit SU is referred to as a cell unit CU.

The select gate transistors DT0 to DT3 (FIG. 4 does not illustrate DT2 and DT3) belong to the string units SU0 to SU3, respectively. The gate of the select gate transistor DT0 of each of the plurality of NAND strings NS of the string unit SU0 is coupled to a select gate line SGDL0. Similarly, the gates of the select gate transistors DT1, DT2, and DT3 of the plurality of NAND strings NS of the string units SU1, SU2, and SU3 are coupled to select gate lines SGDL1, SGDL2, and SGDL3, respectively.

The gate of the select gate transistor ST is coupled to a select gate line SGSL.

Figure 5:
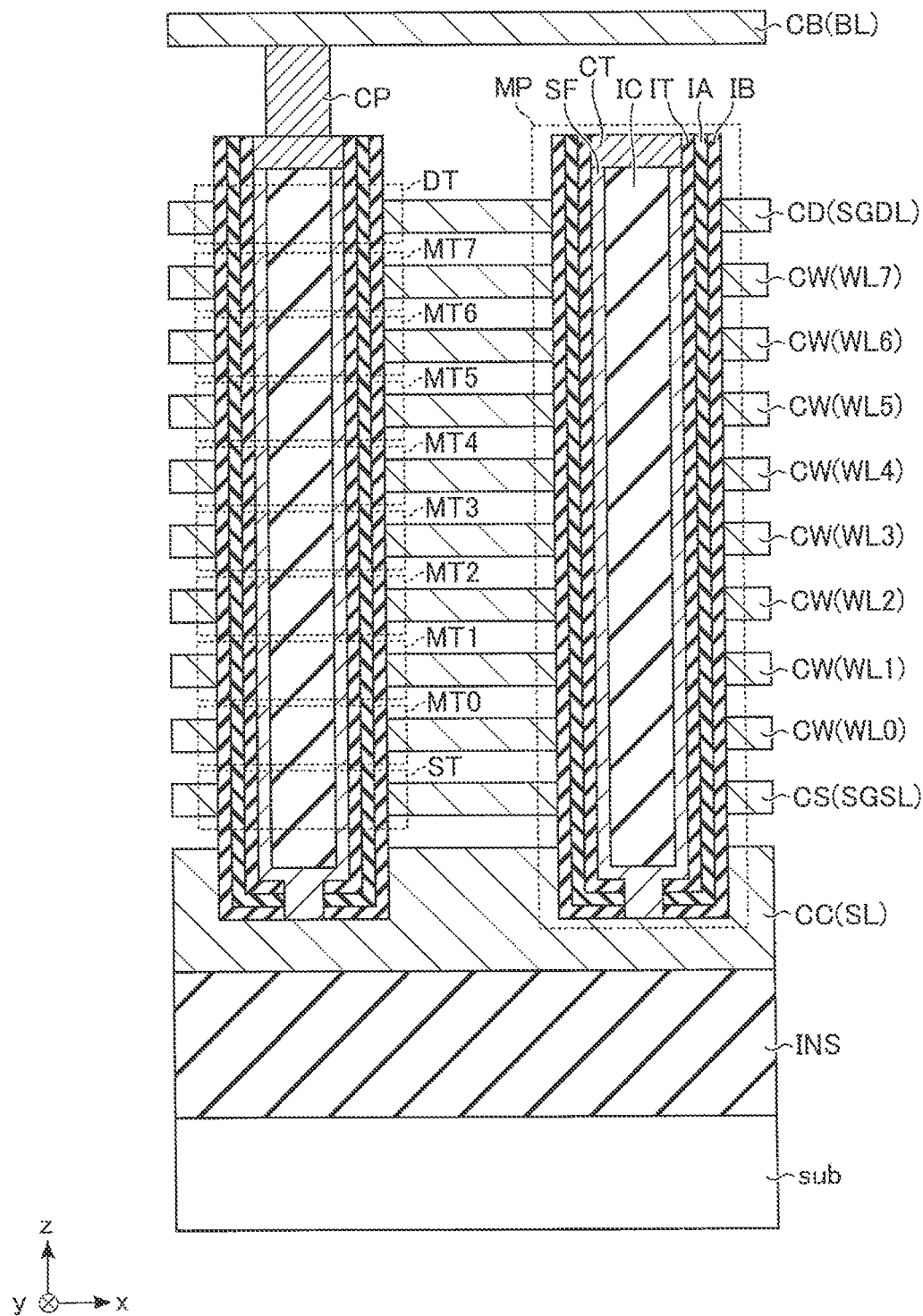
FIG. 5 schematically illustrates an example of the structure of a part of the memory cell array according to the first embodiment.

Each block BLK may have any structure as long as the circuit illustrated in FIG. 4 is implemented. As an example, each block BLK may have a structure illustrated in FIG. 5. FIG. 5 schematically illustrates an example of the structure of a part of the memory cell array according to the first embodiment. FIG. 5 illustrates the structure using an xyz Cartesian coordinate system. In the following description, the expression "below", its derivatives, and related words refer to the position of smaller coordinates on the z-axis, and the expression "above", its derivatives, and related words refer to the position of larger coordinates on the z-axis.

As illustrated in FIG. 5, an insulator INS is provided on the upper surface of a substrate sub. A conductor CC is provided on the upper surface of the insulator INS. The conductor CC functions as a part of the source line SL.

A conductor CS, a plurality of (for example, eight) conductors CW, and a conductor CD are provided above the conductor CC. The conductors CS, CW, and CD are arranged along the z-axis at intervals in this order and extend along the y-axis. The conductors CS, CW, and CD function as a select gate line SGSL, word lines WL0 to WL7, and a select gate line SGDL of each NAND string NS, respectively.

A memory pillar MP is provided above the conductor CC. The memory pillar MP penetrates the conductors CS, CW, and CD. The lower surface of the memory pillar MP is positioned in the conductor CC. The memory pillar MP includes an insulator IC, a semiconductor (layer) SF, a tunnel insulator (layer) IT, a charge storage layer IA, a block insulator (layer) IB, and a conductor (layer) CT.

The insulator IC has a columnar shape extending along the z axis and is positioned at the center of the memory pillar MP. The semiconductor SF covers a side surface of the insulator IC. The semiconductor SF is in contact with the conductor CC at a part of the lower surface. The semiconductor SF functions as a channel region and a body of the memory cell transistors MT and the select gate transistors DT and ST. The channel region is a region where a channel is formed.

The tunnel insulator IT covers a side surface of the semiconductor SF. The charge storage layer IA is an insulator or a conductor, and covers a side surface of the tunnel insulator IT. The block insulator IB covers a side surface of the tunnel insulator IT.

The conductor CT covers the upper surface of the insulator IC and the upper surface of the semiconductor SF.

The upper surfaces of some conductors CT are coupled to a conductor CB via a conductive plug CP. The conductor CB extends along the x-axis, functions as a single bit line BL, and has a spacing from a conductor CB positioned at another coordinate on the y-axis.

Portions of the memory pillars MP intersecting the conductors CS, CW, and CD function as the select gate transistor ST, the memory cell transistors MT, and the select gate transistor DT, respectively.

1.1.5. Potential Generation Circuit and Driver

Figure 6:
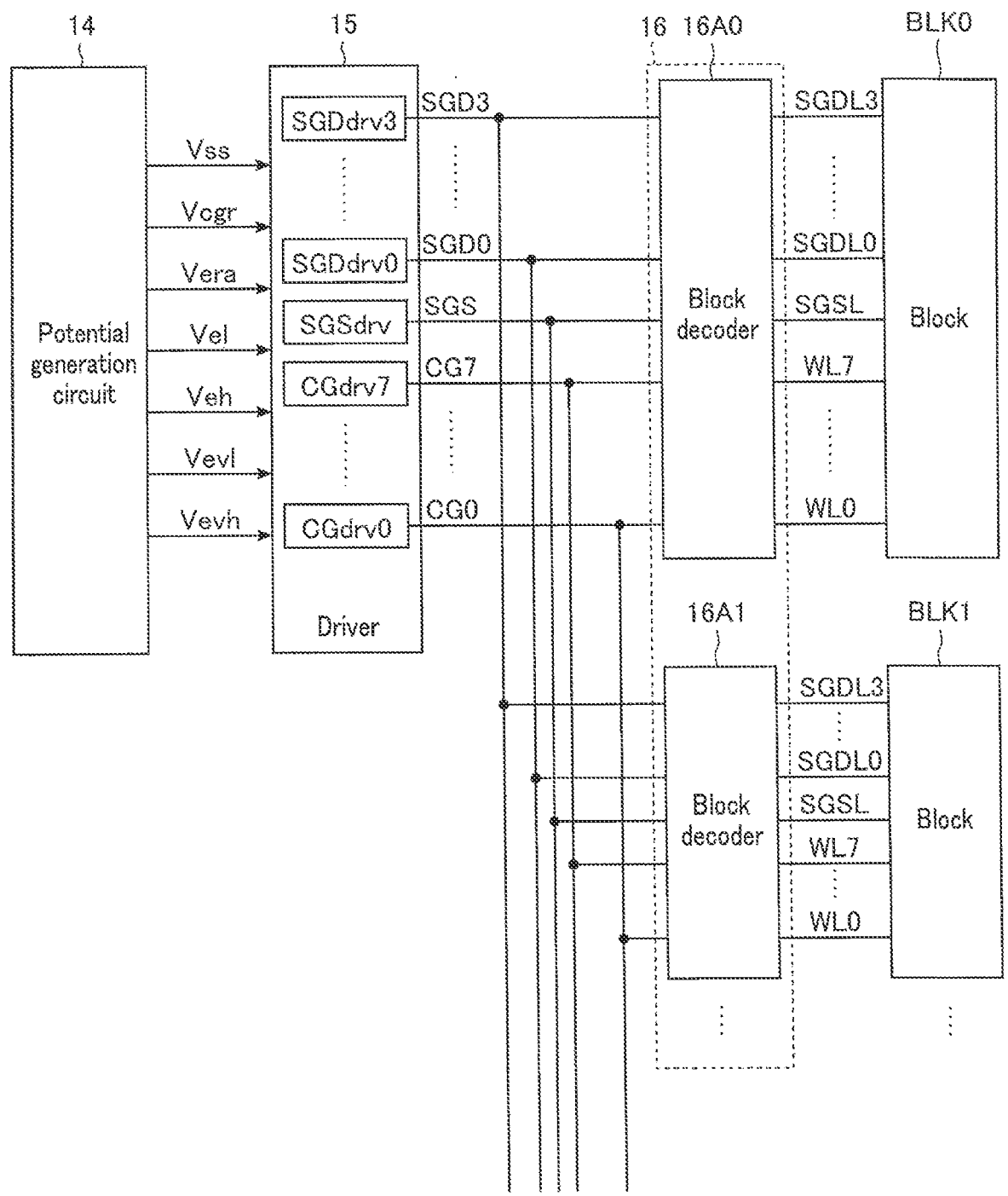
FIG. 6 illustrates an example of a driver and a row decoder according to the first embodiment, and related functional blocks.

FIG. 6 illustrates an example of the driver 15 and the row decoder 16 according to the first embodiment, and related functional blocks. As illustrated in FIG. 6, the potential generation circuit 14 generates a ground potential (common potential) Vss, a read potential Vcgr, an erase potential Vera, a low erase potential Vel, a high erase potential Veh, a low erase verify potential Vevl, and a high erase verify potential Vevh, and supplies these potentials to the driver 15. The potential generation circuit 14 includes, for example, a plurality of sub-potential generation circuits that output the ground potential Vss, the read potential Vcgr, the erase potential Vera the low erase potential Vel, the high erase potential Veh, the low erase verify potential Vevl, and the high erase verify potential Vevh.

The ground potential Vss is, for example, 0 V. The read potential Vcgr is a potential applied to the control gate electrode of the memory cell transistor MT during data reading from the memory cell transistor MT as described later.

The erase potential Vera has a magnitude to allow electrons held in a portion (hereinafter, it may be simply referred to as a charge storage layer IA) included in the memory cell transistor MT in the charge storage layer IA to pulled off into the channel when the erase potential Vera is applied to the channel of the memory cell transistor MT that receives a potential lower than the erase potential at its control gate electrode (word line WL). The erase potential Vera is, for example, 20 V.

The low erase potential Vel and the high erase potential Veh are potentials applied to the control gate electrode of the memory cell transistor MT during data erasing from the memory cell transistor MT as described later. The low erase potential Vel is lower than the high erase potential Veh.

The low erase verify potential Vevl and the high erase verify potential Vevh are potentials applied to the control gate electrode of the memory cell transistor MT during verify of data erasing from the memory cell transistor MT as described later. The low erase verify potential Vevl is lower than the high erase verify potential Vevh.

The driver 15 includes as many drivers SGDdrv (SGDdrv0 to SGDdrv3) as string units SU included in a single block BLK, and a single driver SGSdrv. The driver 15 also includes as many drivers CGdrv (CGdrv0 to CGdrv7) as word lines WL included in a single NAND string NS.

Each of the drivers SGDdrv0 to SGDdrv3, SGSdrv, and CGdrv0 to CGdrv7 receives a potential from the potential generation circuit 14. The drivers SGDdrv0 to SGDdrv3, SGSdrv, and CGdrv0 to CGdrv7 supply one of the received potentials indicated by the sequencer 13 to the interconnects SGD0 to SGD3, SGS, and CG0 to CG7, respectively.

The row decoder 16 includes, for example, as many block decoders 16A (16A0, 16A1, . . . ) as the blocks BLK. Each block decoder 16A is associated with a single block BLK. Each block decoder 16A is coupled to the interconnects SGD0 to SGD3, SGS, and CG0 to CG7 of the associated block BLK. Each block decoder 16A is selected based on a block address BA. The selected block decoder 16A couples the interconnects SGD0 to SGD3, SGS, and CG0 to CG7 to the select gate lines SGDL0 to SGDL3, the select gate line SGSL, and the word lines WL0 to WL7 coupled to the block decoder 16A, respectively. Due to the coupling by the block decoder 16A, the potentials of the wirings SGD0 to SGD3, SGS, and CG0 to CG7 are transferred to the select gate lines SGDL0 to SGDL3, the select gate line SGSL, and the word lines WL0 to WL7, respectively.

1.2. Operation 1.2.1. Data Storage by Memory Cell Transistors

Figure 7:
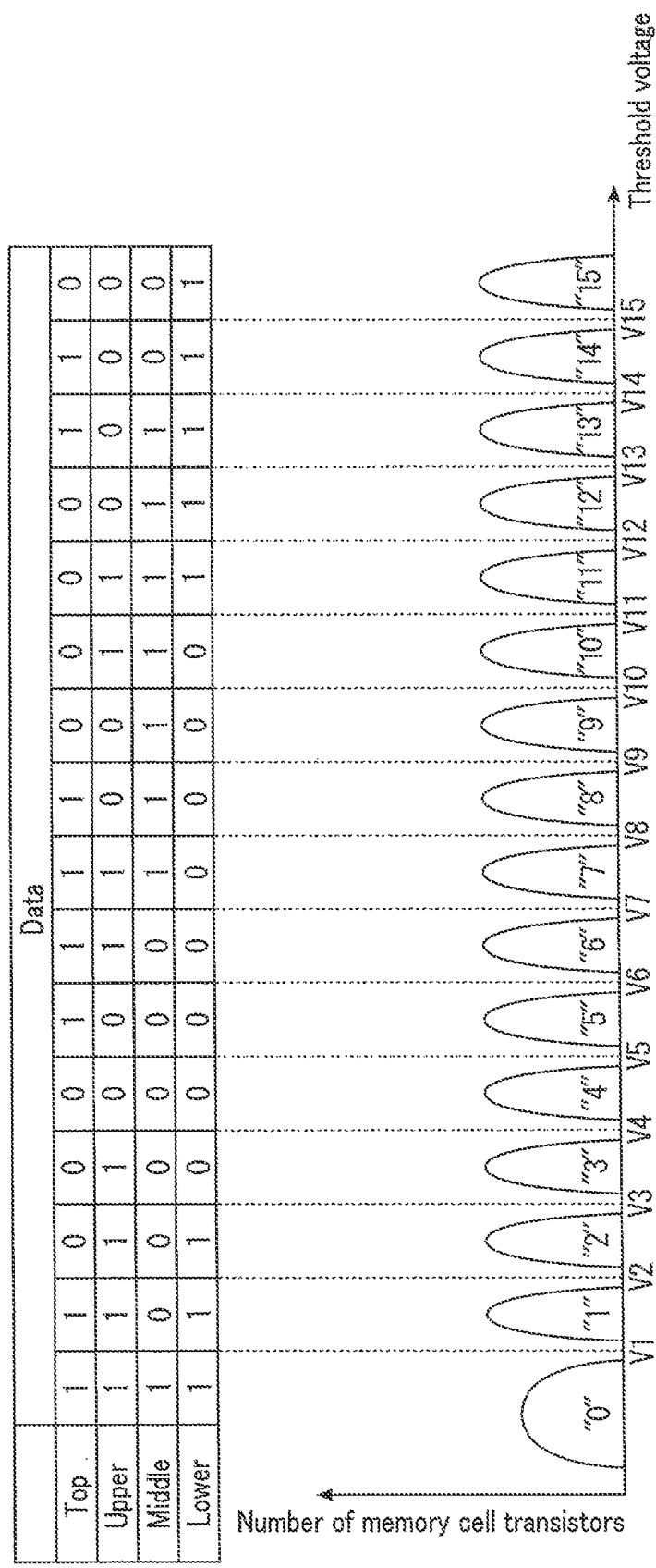
FIG. 7 illustrates an example of distribution of threshold voltages of memory cell transistors of the memory system according to the first embodiment.

The memory device 1 can store two or more bits of data in a single memory cell transistor MT. FIG. 7 illustrates an example of distribution of threshold voltages of the memory cell transistors MT storing 4-bit data per memory cell transistor MT of the memory system 5 according to the first embodiment and the mapping of the data. The threshold voltage of each memory cell transistor MT has a magnitude corresponding to the stored data based on the amount of electrons in the charge storage layer IA. In the case where 4 bits are stored per memory cell transistor MT, each memory cell transistor MT can be in a single state according to the threshold voltage among 16 states. The 16 states are referred to as "0", "1", "2", "3", "4", "5", "6", "7", "8", "9", "10", "11", "12", "13", "14", and "15" states. The memory cell transistors MT in the "0" state, the "1" state, the "2" state, the "3" state, the "4" state, the "5" state, the "6" state, the "7" state, the "8" state, the "9" state, the "10" state, the "11" state, the "12" state, the "13" state, the "14" state, and the "15" state have higher threshold voltages in this order. The "0" state corresponds to a state in which data is erased, and may be referred to as an erased state.

By data writing, a write target memory cell transistor MT is kept in the "0" state or shifted to any one of the "1" state, the "2" state, the "3" state, the "4" state, the "5" state, the "6"

state, the "7" state, the "8" state, the "9" state, the "10" state, the "11" state, the "12" state, the "13" state, the "14" state, and the "15" state based on the data to be written. The threshold voltage of the memory cell transistor MT in the "0" state is not increased by data writing. However, hereinafter, keeping the memory cell transistor MT in the "0" state by data writing may be also referred to as data writing.

4-bit data can be assigned to each state in any form. An example will be described below. As an example, the memory cell transistor MT in each state is treated as having the following 4-bit data. Regarding "ABCD" in the following description, A, B, C, and D indicate values of top, upper, middle, and lower bits, respectively.

The "0" state: "1111"
The "1" state: "1101"
The "2" state: "0101"
The "3" state: "0100"
The "4" state: "0000"
The "5" state: "1000"
The "6" state: "1100"
The "7" state: "1110"
The "8" state: "1010"
The "9" state: "0010"
The "10" state: "0110"
The "11" state: "0111"
The "12" state: "0011"
The "13" state: "1011"
The "14" state: "1001"
The "15" state: "0001"

Hereinafter, the writing of 4-bit data to a single memory cell transistor MT or each of the memory cell transistors MT of the cell unit CU may be referred to as D4 writing. Similarly, the writing of H-bit (H is a positive integer) data to one memory cell transistor MT or each of the memory cell transistors MT of the cell unit CU may be referred to as DR writing.

Even a plurality of memory cell transistors MT that store the same 4-bit data may have different threshold voltages due to variations in characteristics of the memory cell transistors MT. In distribution of the threshold voltages, a portion including a set of threshold voltages belonging to each state may be referred to as a lobe of the threshold voltages or a threshold voltage lobe.

The state of a read target memory cell transistor MT is determined in order to determine data stored in the memory cell transistor MT as the data read target. A plurality of read voltages Vcgr having different magnitudes are used to determine which state the read target memory cell transistor MT is in. The range of the threshold voltage of the read target memory cell transistor MT is used to determine the state of the read target memory cell transistor MT. In order to determine the range of the threshold voltage of the read target memory cell transistor MT, it is determined whether the read target memory cell transistor MT has a threshold voltage equal to or higher than a certain read voltage Vcgr. The memory cell transistor MT having a threshold voltage equal to or higher than the read voltage Vcgr remains OFF even while the memory cell transistor MT is receiving the read voltage Vcgr at its control gate electrode. On the other hand, the memory cell transistor MT having a threshold voltage lower than the read voltage Vcgr remains ON while the memory cell transistor MT is receiving the read voltage Vcgr at its control gate electrode. Based on this, it can be determined that the read target memory cell transistor MT that is receiving the read voltage Vcgr of a certain magnitude but remains OFF has a threshold voltage higher than the read voltage Vcgr.

Read voltages V1, V2, V3, V4, V5, V6, V7, V8, V9, V10, V11, V12, V13, V14, and V15 are used in order to determine whether the read target memory cell transistors MT is in a state higher than the "0" state, the "1" state, the "2" state, the "3" state, the "4" state, the "5" state, the "6" state, the "7" state, the "8" state, the "9" state, the "10" state, the "11" state, the "12" state, the "13" state, and the "14" state. The read target memory cell transistor MT that is receiving the read voltages V1, V2, V3, V4, V5, V6, V7, V8, V9, V10, V11, V12, V13, V14, and V15 at the control gate but remains OFF is respectively the "1" state, the "2" state, the "3" state, the "4" state, the "5" state, the "6" state, the "7" state, the "8" state, the "9" state, the "10" state, the "11" state, the "12" state, the "13" state, the "14" state, the "15" state, or a higher state.

A set of data of bits at the same position (digit) in the memory cell transistors MT of a single cell unit CU constitutes one page. A set of data of the least significant (first digit from the bottom) bits, or lower bits, of the memory cell transistors MT of each cell unit CU is referred to as a lower page. A set of data of the second least significant bits, or middle bits, of the memory cell transistors MT of each cell unit CU is referred to as a middle page. A set of data of the third least significant bits, or upper bits, of the memory cell transistors MT of each cell unit CU is referred to as an upper page. A set of data of the most significant (fourth digit from the bottom) bits, or top bits, of the memory cell transistors MT of each cell unit CU is referred to as a top page.

By data erasing, the threshold voltage of an erase target memory cell transistor MT is lowered and the erase target memory cell transistor MT is shifted to the "0" state.

Hereinafter, the reading of 4-bit data from the memory cell transistor MT storing 4-bit data and each of the memory cell transistors MT of the cell unit CU may be referred to as D4 reading. Similarly, the reading of H-bit data from the memory cell transistor MT storing H-bit data and each of the memory cell transistors MT of the cell unit CU may be referred to as DH reading.

1.2.2. Erase Operation

An erase operation may include applying an erase bias voltage and erase verify. The application of the erase bias voltage refers to the application of a bias voltage for erasing data by lowering the threshold voltage of the erase target memory cell transistor MT. The erase verify refers to confirmation as to whether data erasing has been completed. The erase verify may be performed immediately after the application of the erase bias voltage.

1.2.2.1. Voltage Bias

Figure 8:
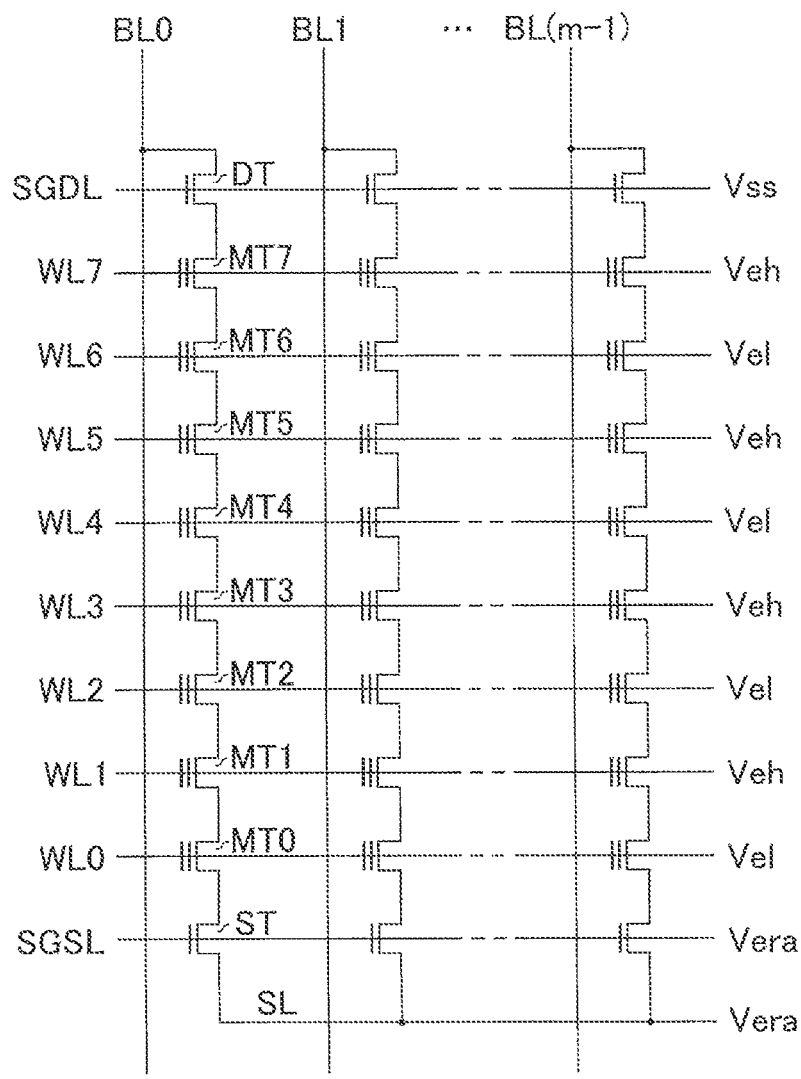
FIG. 8 illustrates potentials applied to some interconnects during an operation in the memory device according to the first embodiment.

FIG. 8 illustrates potentials applied to some interconnects during an operation in the memory device 1 according to the first embodiment. Specifically, FIG. 8 illustrates potentials applied to some interconnects during the application of the erase bias voltage in the block BLK as a data erase target, or erase target block BLKS. The sequencer 13, the potential generation circuit 14, the driver 15, and the row decoder 16 operate so that potentials described below are applied.

For data erasing, both of certain two conditions are formed in the erase target block BLKS. When the both two conditions are formed together, electrons in the charge storage layer IA of the memory cell transistors MT in the erase target block BLKS are pulled off the charge storage layer IA. The first condition is a condition in which the channel region (portion facing the control gate electrode in the semiconductor portion of each of the memory cell transistors MT) of each of the memory cell transistors MT in the erase target block BLKS has a high potential. An example for forming the first condition is described below.

In order to form the first condition, as illustrated in FIG. 8, the following potentials are applied to interconnects other than the word lines WL. The ground potential Vss is applied to the select gate line SGDL. The erase potential Vera is applied to the select gate line SGSL and the source line SL.

The second condition is a condition in which a potential lower than the erase potential Vera is applied to the word lines WL of the cell unit CU as a data erase target in the erase target block BLKS. For example, in order to erase data of all the cell units CU of the erase target block BLKS, a potential lower than the erase potential Vera is applied to all the word lines WL of the erase target block BLKS.

The erase potential Vera and a potential applied to each word line WL have a combination of magnitudes that allows a high potential difference to be formed between the word line WL and the channel region by the formation of both the first condition and the second condition, and that allows electrons in the charge storage layer IA to be pulled off to the channel region due to the potential difference and/or allows holes in the channel to be drawn into the charge storage layer IA. As long as such charge transfer is possible, any method of forming the first condition, any magnitude of the erase potential Vera, and any magnitude of the potential applied to the word line WL for forming the second condition can be selected. As an example, the erase potential Vera is 20V as described above, and the potential applied to the word line WL for forming the second condition has a magnitude close to the magnitude of the ground potential Vss.

In addition, as illustrated in FIG. 8, for the formation of the second condition, the potentials applied to the word lines WL have two different magnitudes. Specifically, the low erase potential Vel and the high erase potential Veh are applied to the word lines WL. The low erase potential Vel is, for example, 0 V, and the high erase potential Veh is, for example, 1 V.

The low erase potential Vel is applied to a word line WL in the erase target block BLKS. In addition, the high erase potential Veh is applied to one or both of word lines WL adjacent to the word line WL to which the low erase potential Vel is applied. A word line WL adjacent to a target word line WL has an address larger or smaller by 1 than the address (identified by "N" of WLN) of the target word line WL. In the example of the structure illustrated in FIG. 5, the adjacent word line WL is positioned in a layer present directly above or below a layer in which the target word line WL is present.

As a more specific example, the low erase potential Vel is applied to word lines WL belonging to a first group among all the word lines WL in the erase target block BLKS, and the high erase potential Veh is applied to word lines WL belonging to a second group among all the word lines WL in the erase target block BLKS. For example, the first group is word lines WL having even-number addresses, and the second group is word lines WL having odd-number addresses. FIG. 8 illustrates this case as an example. However, the first group may be word lines WL having odd-number addresses, and the second group may be word lines WL having even-number addresses.

By the application of such potentials, in the cell unit CU coupled to each word line WL of the first group, a potential difference VD1 of a certain magnitude is applied between the word line WL (control gate electrode) and each channel region. On the other hand, in the cell unit CU coupled to each word line WL of the second group, a potential difference VD2 of a certain magnitude is applied between the word line WL and each channel region. Due to the potential differences VD1 and VD2, electrons leave the charge storage layer IA of the memory cell transistor MT so as to enter the channel region, and/or holes enter the charge storage layer IA from the channel region. As described above, the low erase potential Vel and the high erase potential Veh are applied to the word lines WL of the first and second groups, respectively, and the high erase potential Veh is higher than the low erase potential Vel. Therefore, the potential difference VD2 in the memory cell transistor MT coupled to the word line WL to which the high erase potential Veh is applied is smaller than the potential difference VD1 in the memory cell transistor MT coupled to the word line WL to which the low erase potential Vel is applied. Therefore, the amount of electrons that have left and/or holes that have entered in the memory cell transistor MT coupled to the word line WL to which the high erase potential Veh is applied is smaller than the amount of electrons that have left and/or holes that have entered in the memory cell transistor MT coupled to the word line WL to which the low erase potential Vel is applied.

Figure 9:
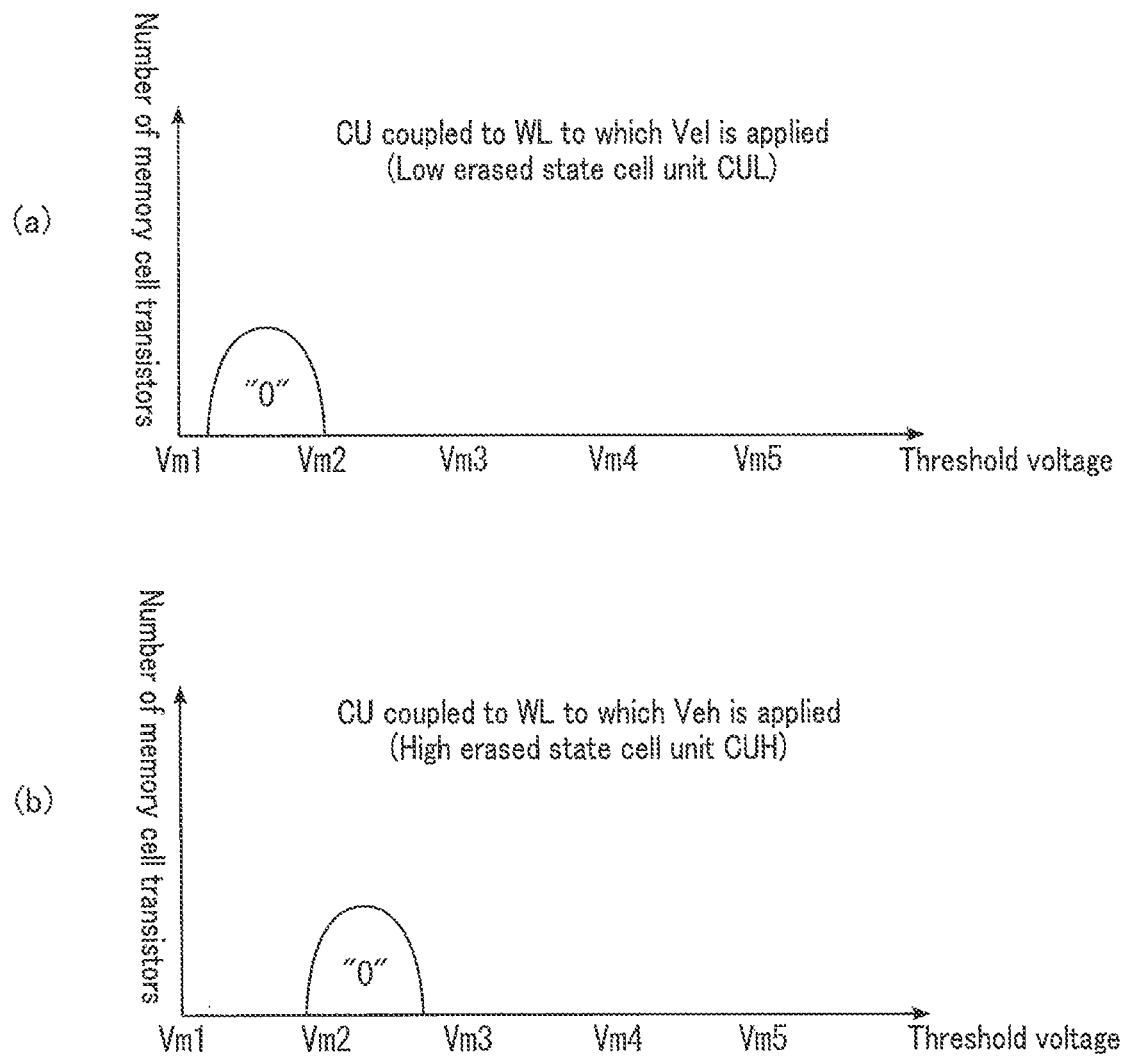
FIG. 9 illustrates an example of distribution of threshold voltages of memory cell transistors of an erase target block after an erase operation in the memory device according to the first embodiment.

FIG. 9 illustrates an example of distribution of threshold voltages of the memory cell transistors MT of the erase target block BLKS after an erase operation in the memory device 1 according to the first embodiment. More specifically, FIG. 9 illustrates the memory cell transistor MT coupled to the word line WL to which the low erase potential Vel is applied in a part (a). More specifically, FIG. 9 illustrates the memory cell transistor MT coupled to the word line WL to which the high erase potential Veh is applied in a part (b). Values (Vm1, Vm2, . . . , etc.) on the horizontal axis in FIG. 9 indicate specific values. These values are described only for the purpose of indicating that separate graphs (for example, the graph illustrated in the part (a) of FIG. 9 and the graph illustrated in the part (b) of FIG. 9) lie in the same range identified by these values.

As illustrated in the part (a) of FIG. 9, the threshold voltage lobe of the memory cell transistor MT in the "0" state is distributed over a certain size range.

On the other hand, as described above, the amount of electrons that have left and/or holes that have entered in the memory cell transistor MT coupled to the word line WL to which the high erase potential Veh is applied is smaller than the amount of electrons that have left and/or holes that have entered in the memory cell transistor MT coupled to the word line WL to which the low erase potential Vel is applied. Therefore, as illustrated in the part (b) of FIG. 9, the threshold voltage lobe of the memory cell transistor MT in the "0" state is positioned at a position corresponding to a threshold voltage higher than the threshold voltage lobe of the memory cell transistor MT in the "0" state in the cell unit CU coupled to the word line WL of the first group. Hereinafter, the position of an entire threshold voltage lobe (or average) higher or lower than another threshold voltage lobe on the axis of the threshold voltage may be referred to as a higher or lower position of the threshold voltage lobe, respectively. More specifically, the highest threshold voltage among the threshold voltages of the memory cell transistors MT in the "0" state coupled to the word lines WL to which the high erase potential Veh is applied is higher than the highest threshold voltage among the threshold voltages of the memory cell transistors MT coupled to the word lines WL to which the low erase potential Vel is applied. Hereinafter, the cell unit CU coupled to the word line WL to which the low erase potential Vel is applied and having the threshold voltage lobe of the memory cell transistor MT in the "0" state at a lower position may be referred to as a low erased state cell unit CUL. Similarly, the cell unit CU coupled to the word line WL to which the high erase potential Veh is applied and having the threshold voltage lobe of the memory cell transistor MT in the "0" state at a higher position may be referred to as a high erased state cell unit CUL.

As described above, the position of the threshold voltage lobe of the "0" state in each cell unit CU depends on the potential applied to the word line WL of this cell unit CU during the application of the erase bias voltage. For this reason, the magnitude of the low erase potential Vel is determined based on the desired position of the threshold voltage lobe of the "0" state of the low erased state cell unit CUL. The high erase potential Veh has a magnitude determined based on the desired position of the threshold voltage lobe of the "0" state of the high erased state cell unit CUL.

Figure 10:
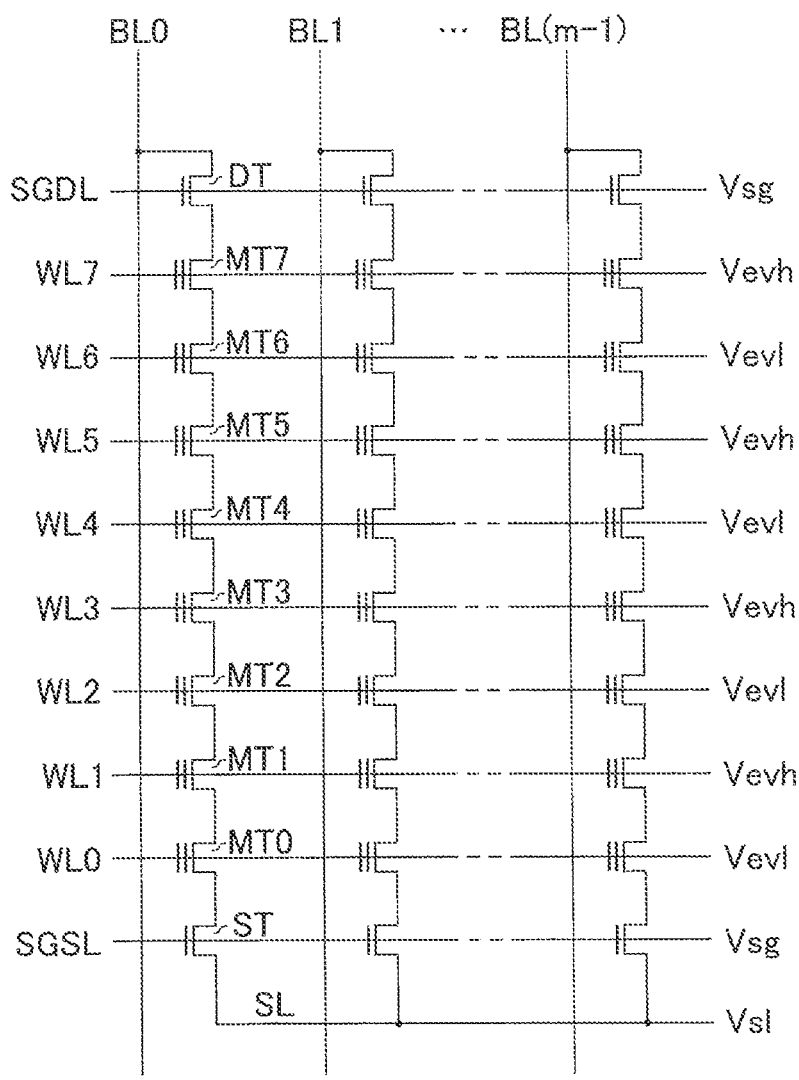
FIG. 10 illustrates potentials applied to some interconnects during an operation in the memory device according to the first embodiment.

FIG. 10 illustrates potentials applied to some interconnects during an operation in the memory device 1 according to the first embodiment. Specifically, FIG. 10 illustrates potentials applied to some interconnects during the erase verify in the erase target block BLKS. The sequencer 13, the potential generation circuit 14, the driver 15, and the row decoder 16 operate so that potentials described below are applied.

As illustrated in FIG. 10, the potential Vsg is continuously applied to the select gate lines SGDL and SGSL. The potential Vsg has a magnitude that enables the select gate transistors DT and ST to remains ON and enables each of the select gate transistors DT and ST to sufficiently transfer the potential between its own two ends (source and drain). A potential Vsl is applied to the source line SL. The potential Vsl is equal to the ground potential Vss or slightly higher than the ground potential Vss.

While the above-described potentials are being applied to the select gate lines SGDL and SGSL and the source line SL, a certain potential is applied to the word lines WL of the block BLK as an erase verify target, that is, the erase target block BLKS. The potentials applied to the word lines WL have two different magnitudes. Specifically, the low erase verify potential Vevl and the high erase verify potential Vevh are applied to the word lines WL. The low erase verify potential Vevl is lower than the high erase verify potential Vevh.

The low erase verify potential Vevl is used for erase verify of the low erased state cell unit CUL. The high erase verify potential Vevh is used for erase verify of the high erased state cell unit CUH.

As described with reference to FIG. 7, each memory cell transistor MT remains ON while a voltage higher than its own threshold voltage is being applied to its control gate electrode, and remains OFF while a voltage lower than its threshold voltage is being applied to its control gate. Therefore, a voltage higher than a threshold voltage that the memory cell transistor MT desirably has is applied to the control gate electrode of the memory cell transistor MT after the erase bias voltage is applied, and it is therefore possible to determine whether or not the memory cell transistor MT has a threshold voltage less than an intended magnitude, that is, whether or not the erasing has been completed via determination of whether or not the memory cell transistor MT is turned on. The potential applied to the word line WL for the erase verify is referred to as an erase verify potential.

As described with reference to FIG. 9, the highest threshold voltage among the threshold voltages of the memory cell transistors MT in the "0" state in the high erased state cell unit CUH is higher than the highest threshold voltage among the threshold voltages of the memory cell transistors MT in the "0" state in the low erased state cell unit CUL. Based on this, the low erase verify potential Vevl is applied to the word line WL to which the low erase potential Vel is applied, and the high erase verify potential Vevh is applied to the word line WL to which the high erase potential Veh is applied. The high erase verify potential Vevh is higher than the low erase verify potential Vevl.

The low erase verify potential Vevl has a magnitude slightly higher than a desired highest threshold voltage among threshold voltages that the memory cell transistors MT belonging to the low erased state cell unit CUL have immediately after the application of the erase bias voltage. The low erase verify potential Vevl is, for example, 0.5 V.

The high erase verify potential Vevh has a magnitude slightly higher than the desired highest threshold voltage among threshold voltages that the memory cell transistors MT belonging to the high erased state cell unit CUH have immediately after the application of the erase bias voltage. The high erase verify potential Vevh is, for example, 1.5 V.

1.3. Advantages (Advantageous Effects)

According to the first embodiment, a memory device having a high data retention characteristic can be provided as described below.

Figure 11:
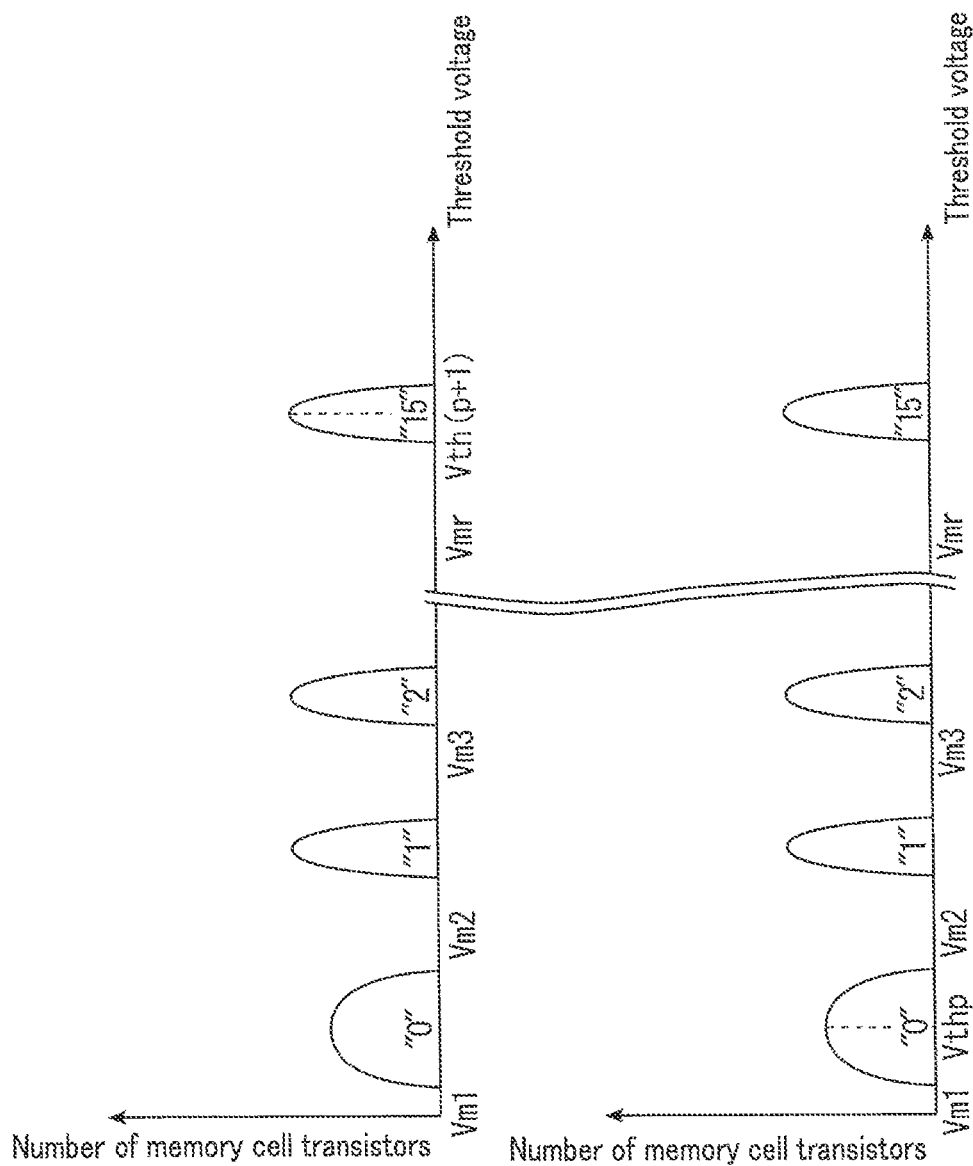
FIG. 11 illustrates one state in a reference memory device.
Figure 11:
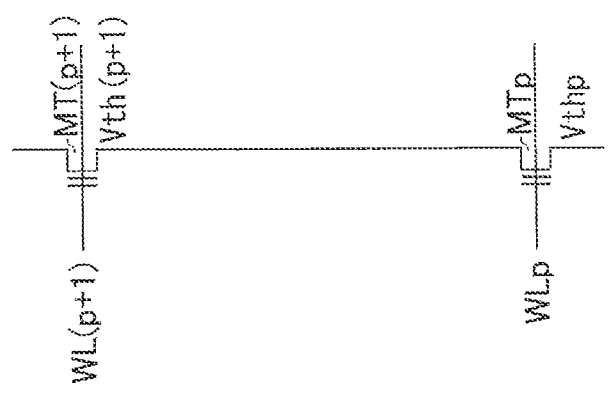

As a reference and comparative example, a memory device 100 is briefly described with reference to FIG. 11. In the memory device 100, a single common potential is applied to all word lines WL in an erase target block BLKS during the application of the erase bias voltage. Therefore, in any cell unit CU immediately after the application of the erase bias voltage, threshold voltage lobes of memory cell transistors MT in an erased state are positioned at the same position. As illustrated in FIG. 11, it is assumed that memory cell transistors MT of a certain NAND string NS are shifted to the following state due to writing after data erasing. FIG. 11 illustrates, on the left side, certain memory cell transistors MTp (p is an integer of 0 or more) and MT(p+1) coupled in series. FIG. 11 illustrates, on the lower right side, a threshold voltage distribution of memory cell transistors MT of a cell unit CU including the memory cell transistor MTp. FIG. 11 illustrates, on the upper right side, a threshold voltage distribution of memory cell transistors MT of a cell unit CU including the memory cell transistor MT(p+1).

As an example, the memory cell transistor MTp is in the "0" state, and the memory cell transistor MT(p+1) is in the highest state (For example, the "15" state). Therefore, the memory cell transistor MTp has a certain threshold voltage Vthp included in the threshold voltage lobe of the memory cell transistor MT in the "0" state. On the other hand, the memory cell transistor MT(p+1) has a certain threshold voltage Vthp (p+1) included in the threshold voltage lobe of the memory cell transistor MT in the "15" state. For the sake of understanding, as an example, the threshold voltages Vthp and Vth(p+1) have central magnitudes of threshold voltage lobes of the memory cell transistors MT in the "0" state and the "15" state, respectively.

Due to the difference between the threshold voltages, there is a large difference between the number of electrons in the charge storage layer IA of the memory cell transistor MTp and the number of electrons in the charge storage layer IA of the memory cell transistor MT(p+1). As described with reference to FIG. 5, the charge storage layer IA of each of the memory cell transistors MT in a single NAND string NS is made of a part of a single material. Therefore, the large difference between the numbers of electrons in the different portions can approach an equilibrium state in which the difference is small. This may cause a decrease in the number of electrons in the memory cell transistor MT(p+1), and eventually, a decrease in the threshold voltage of the memory cell transistor MT(p+1). This lowers the data retention characteristic of the memory cell transistor MT(p+1). Even when the memory cell transistor MT(p+1) is in a lower state, the number of electrons can decrease, but the larger the difference between the threshold voltages of the adjacent memory cell transistors MT, the more easily the number of electrons decreases.

According to the first embodiment, during the application of the erase bias voltage, the low erase potential Vel is applied to one of two adjacent word lines WL, and the high erase potential Veh is applied to the other. As a more specific example, the low erase potential Vel is applied to the first group of word lines WL (having even (or odd) addresses), and the high erase potential Veh is applied to the second group of word lines WL (having odd (or even) addresses). The position of the threshold voltage lobe of the memory cell transistor MT in the "0" state in the high erased state cell unit CUH is higher than the position of the threshold voltage lobe of the memory cell transistor MT in the "0" state in the low erased state cell unit CUL.

Figure 12:
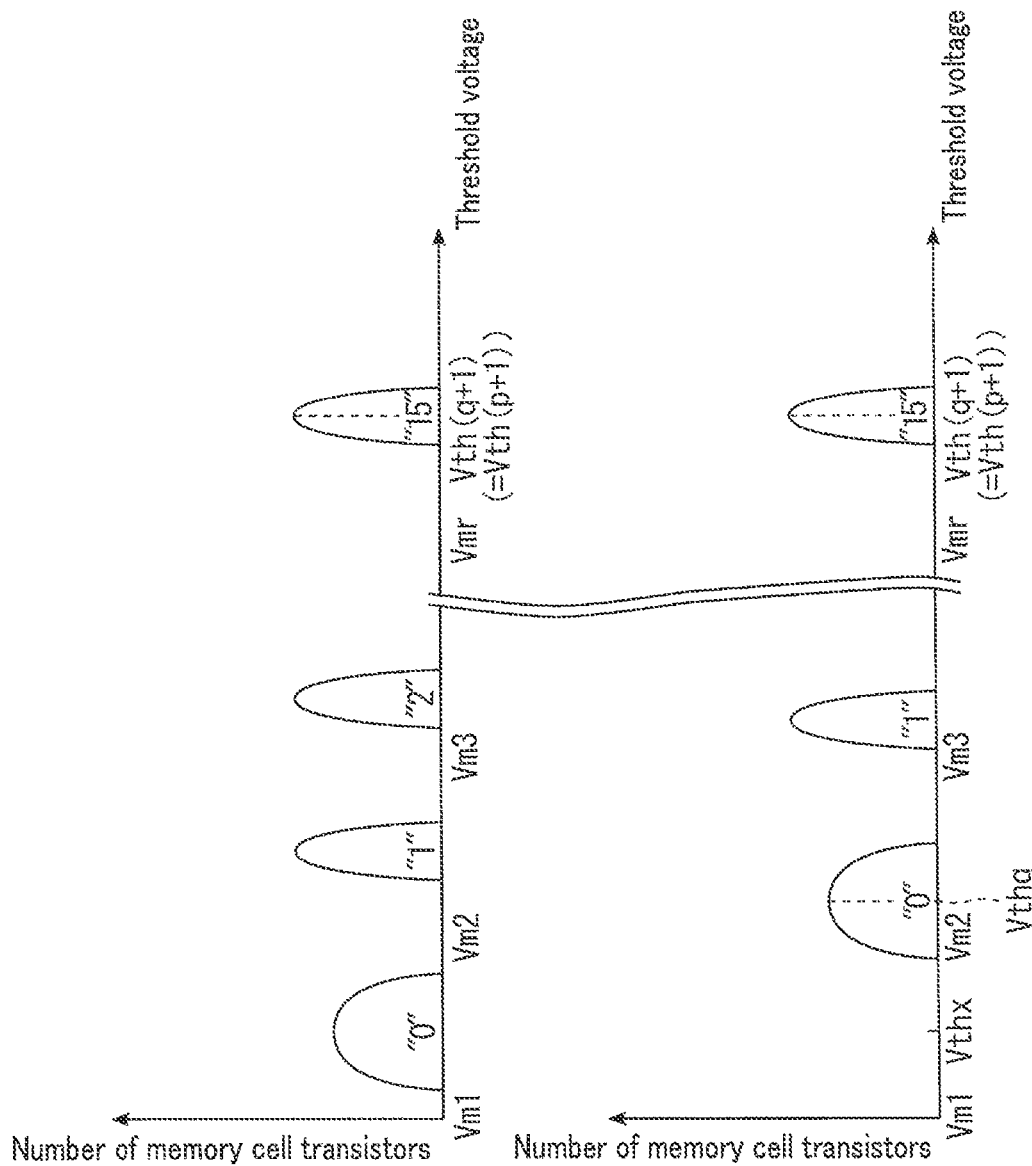
FIG. 12 illustrates one state in the memory device according to the first embodiment.
Figure 12:
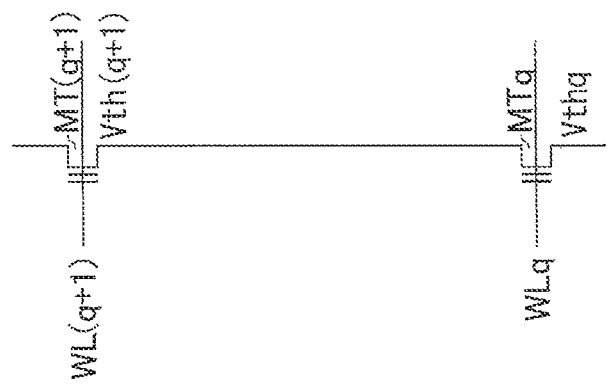

This reduces the difference between the threshold voltages of two series-coupled memory cell transistors MT in which data has been written, as illustrated in FIG. 12. FIG. 12 illustrates, on the left side, a part of the memory device 1 according to the first embodiment, specifically, certain memory cell transistors MTq (q is an integer of 0 or more) and MT(q+1) coupled in series. FIG. 12 illustrates, on the lower right side, a threshold voltage distribution of memory cell transistors MT of a cell unit CU including the memory cell transistor MTq. FIG. 12 illustrates, on the upper right side, a threshold voltage distribution of memory cell transistors MT of a cell unit CU including the memory cell transistor MT(p+1).

As illustrated in FIG. 12, the memory cell transistors MTq and MT(q+1) are in the "0" state and the highest state (in this example, the "15" state), respectively. The memory cell transistors MTq and MT(q+1) belong to the high erased state cell unit CUH and the low erased state cell unit CUL, respectively. Therefore, as described with reference to FIG. 9, the position of the threshold voltage lobe of the memory cell transistor MT in the "0" state in the high erased state cell unit CUH is higher than the position of the threshold voltage lobe of the memory cell transistor MT in the "0" state in the low erased state cell unit CUL. Therefore, the difference between the threshold voltages of the memory cell transistors MTq and MT(q+1) is smaller than the corresponding difference between threshold voltages in the reference memory device 100. More specifically, it is as follows. Similarly to the description made with reference to FIG. 11, it is assumed that the memory cell transistors MTq and MT(q+1) have threshold voltages Vthq and Vth(q+1) with the central magnitudes of the threshold voltage lobes of the memory cell transistors MT in the "0" state and the "15" state, respectively, and the threshold voltage Vth(q+1) is equal to the threshold voltage Vth(p+1). Then, the difference between the threshold voltage Vth(q+1) and the threshold voltage Vthq is smaller than the difference between the threshold voltage Vth(p+1) and the threshold voltage Vthp (that is, the difference between the threshold voltage Vth(q+1) and the threshold voltage Vthp) in the reference memory device 100. Therefore, since the data retention characteristic of the memory cell transistor MT(q+1) in such a case is high, the memory device 1 has a data retention characteristic higher than the data retention characteristic of the reference memory device 100.

1.4. Modification

As described with reference to FIG. 8, a first condition in which the channel regions of the memory cell transistors MT of the erase target block BLKS have a high potential is formed during the erase operation. The first condition can be formed by any method that enables data erasing, and is not limited to the example described with reference to FIG. 8. For example, the erase potential Vera may be applied to the select gate line SGDL.

Furthermore, the example of FIG. 8 results from the blocks BLK having the structure illustrated in FIG. 5. The structure of the blocks BLK is not limited to the structure illustrated in FIG. 5. For example, a well region (for example, a p-type well region) is formed in a portion including the surface of the substrate sub, the insulator INS and the conductor CC are not provided, and a portion including the bottom surface of the memory pillar MP is positioned in the well region. The well region is coupled to the contact and functions as a part of the source line. In the case of such a structure, the first condition can be formed by applying the erase potential Vera to the contact coupled to the well region. In this case, the select gate line SGSL is kept at the ground potential Vss.

2. Second Embodiment

The second embodiment is implemented in combination with the first embodiment. The second embodiment relates to writing of data.

A memory controller 2b according to the second embodiment is configured to perform an operation described below. That is, for example, a ROM 22 included in the memory controller 2b stores a program that is executed by the CPU 24 to cause the memory controller 2b to perform the operation described below.

2.1. Operation 2.1.1. Data Storage by Memory Cell Transistors

The memory device 1 can perform D3 writing and D2 writing in addition to performing D4 writing as in the example described with reference to FIG. 7.

Figure 13:
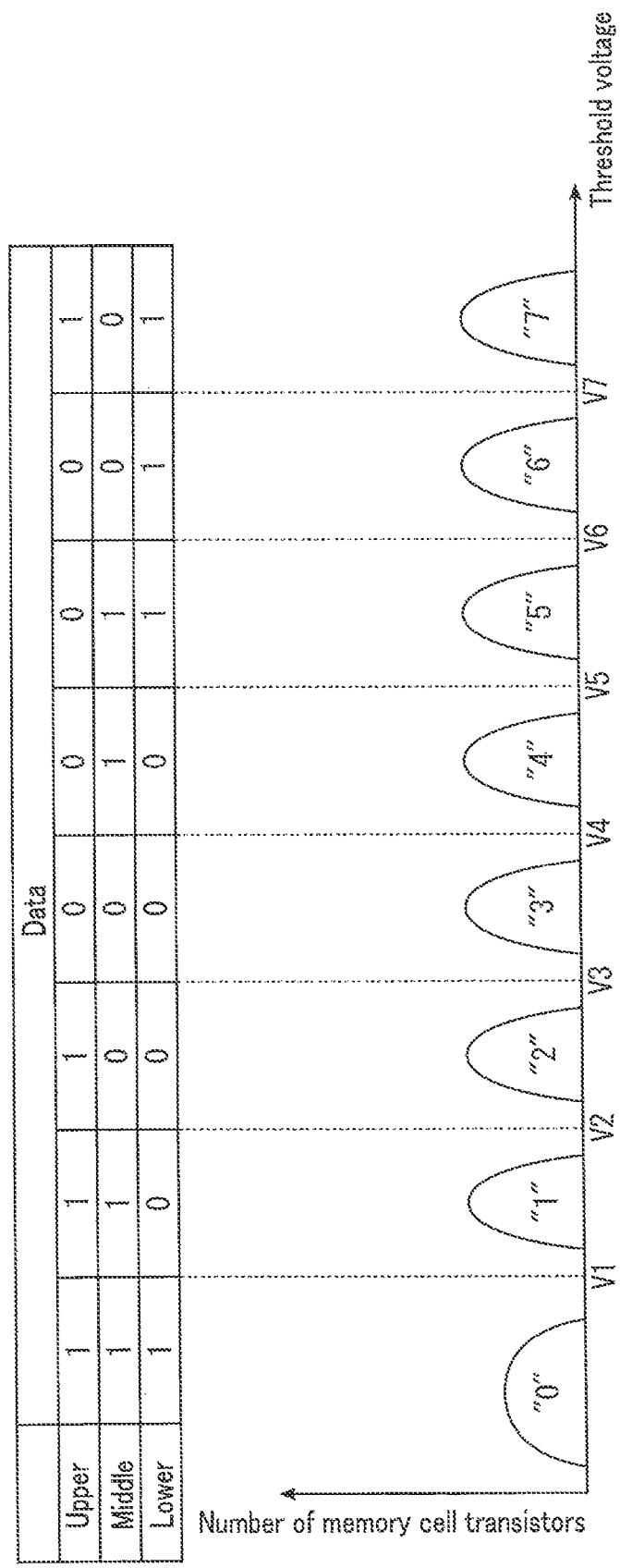
FIG. 13 illustrates an example of distribution of threshold voltages of memory cell transistors of a memory system according to a second embodiment.

FIG. 13 illustrates an example of distribution of threshold voltages of memory cell transistors MT storing 3-bit data per memory cell transistor MT of a memory system 5b according to the second embodiment and the mapping of the data. After D3 writing is performed, each memory cell transistor MT is in any of "0", "1", "2", "3", "4", "5", "6", and "7" states. However, the position of the threshold voltage lobe of each of the "0", "1", "2", "3", "4", "5", "6", and "7" states formed by D3 writing may be different from the position of the threshold voltage lobe of each of the "0", "1", "2", "3", "4", "5", "6", and "7" states formed by D4 writing.

3-bit data can be assigned to each state in any form. As an example, the memory cell transistor MT in each state is treated as having the following 3-bit data. Regarding "BCD" in the following description, B, C, and B indicate values of upper, middle, and lower bits, respectively.

The "0" state: "111"
The "1" state: "110"
The "2" state: "100"
The "3" state: "000"
The "4" state: "010"
The "5" state: "011"
The "6" state: "001"
The "7" state: "101"

When a plurality of threshold voltage lobes are formed in the same certain threshold voltage range, the smaller the number of threshold voltage lobes, the wider the interval between adjacent threshold voltage lobes. This suppresses overlapping of threshold voltage lobes and suppresses erroneous data reading (erroneous reading).

Alternatively, by utilizing the small number of threshold voltage lobes required, the range (in particular, the lower limit) in which the threshold voltage lobes are formed can be reduced. This leads to keeping low a difference between the maximum threshold voltages that the memory cell transistors MT can have.

FIG. 14 illustrates an example of the distribution of the threshold voltages of the memory cell transistors MT storing 2-bit data per memory cell transistor MT of the memory system 5b according to the second embodiment and the mapping of the data. After D2 writing is performed, each memory cell transistor MT is in any of the "0", "1", "2", and "3" states. However, the position of the threshold voltage lobe of each of the "0", "1", "2", and "3" states formed by D2 writing may be different from the position of the threshold voltage lobe of each of the "0", "1", "2", and "3" states formed by D4 writing and D3 writing.

2-bit data can be assigned to each state in any form. As an example, the memory cell transistor MT in each state is treated as having the following 2-bit data. Regarding "CD" in the following description, C and D indicate values of upper and lower bits, respectively.

The "0" state: "11"
The "1" state: "10"
The "2" state: "00"
The "3" state: "01"

A set of data of the second least significant bits (upper bits) of the memory cell transistors MT of each cell unit CU is referred to as an upper page.

2.1.2. Data Writing

The memory controller 2b writes data of a number T (T is a positive integer) of pages to the low erased state cell unit CUL and writes data of a number R (R is a positive integer less than T) of pages to the high erased state cell unit CUH. Several specific examples will be described below.

Figure 15:
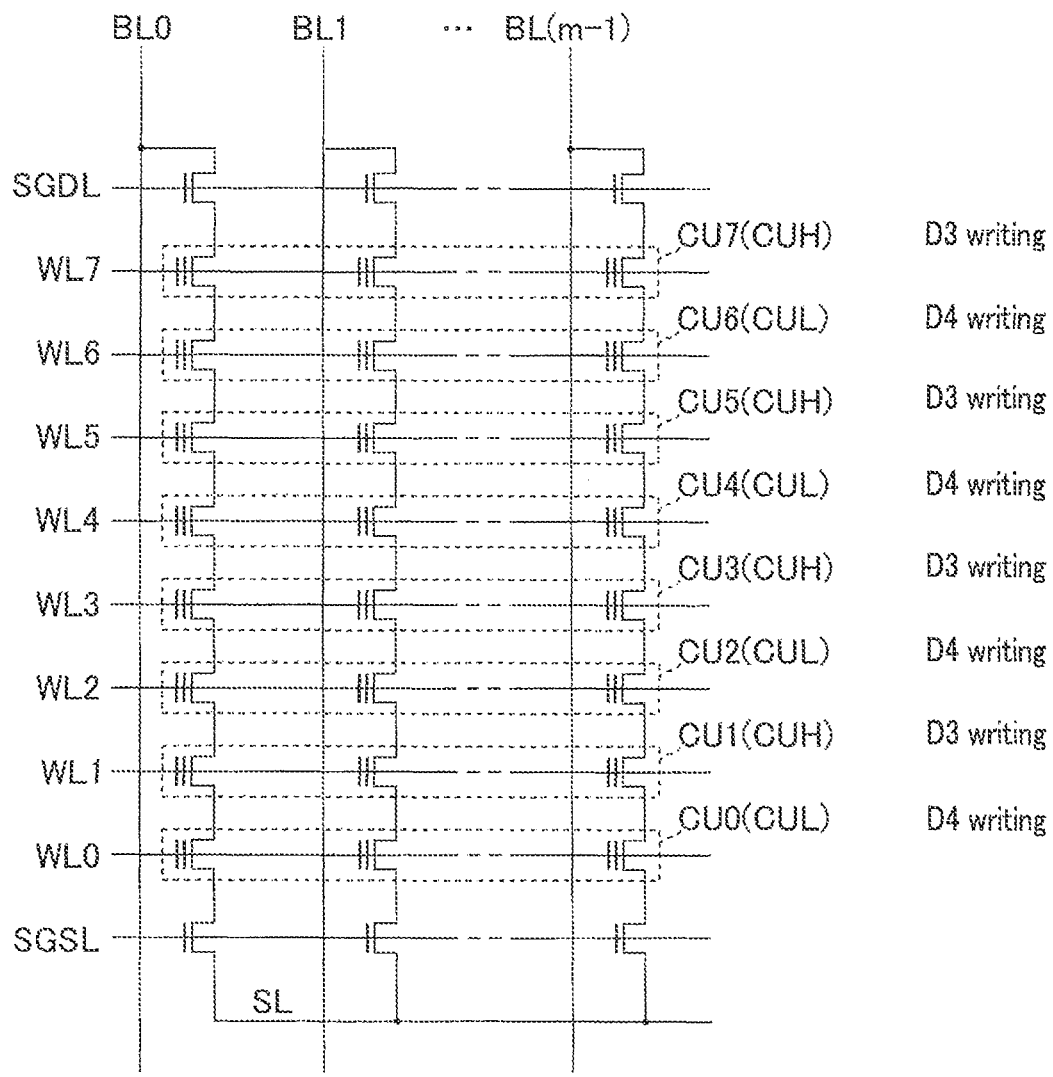
FIG. 15 illustrates a first example of data writing in the memory system according to the second embodiment.

FIG. 15 illustrates a first example of the data writing in the memory system 5b according to the second embodiment. As illustrated in FIG. 15, the memory controller 2b performs D4 writing to the low erased state cell unit CUL and performs D3 writing to the high erased state cell unit CUH.

Figure 16:
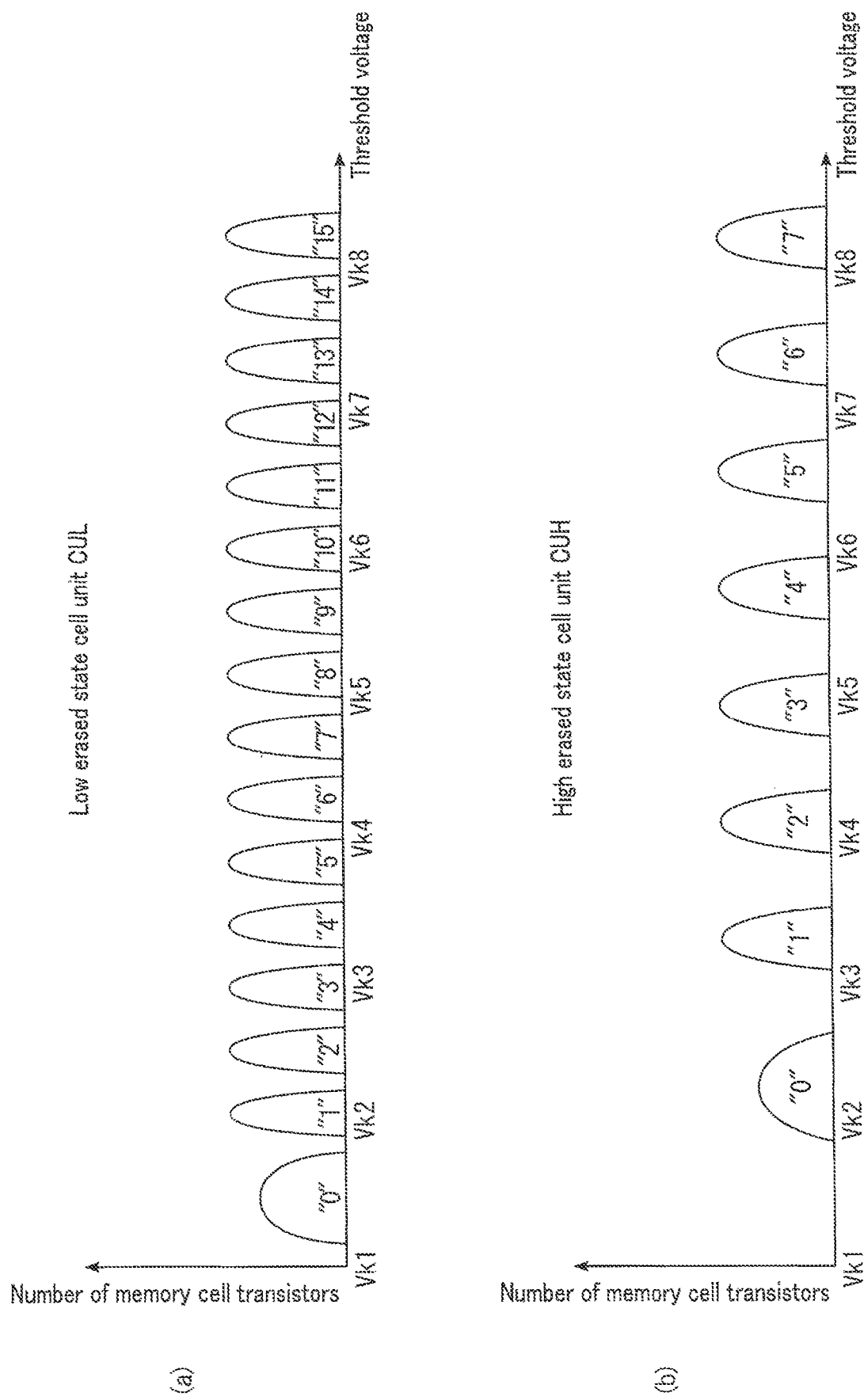
FIG. 16 illustrates an example of a threshold voltage distribution of memory cell transistors of the memory system according to the second embodiment.

FIG. 16 illustrates a threshold voltage distribution of the memory cell transistors MT of the cell unit CU in which the first example of the data writing in the memory system 5b according to the second embodiment has been performed. FIG. 16 illustrates a threshold voltage distribution of the memory cell transistors MT of the low erased state cell unit CUL in a part (a). FIG. 16 illustrates a threshold voltage distribution of the memory cell transistors MT of the high erased state cell unit CUH in a part (b).

As described with reference to FIG. 12 and illustrated in FIG. 16, the position of the threshold voltage lobe of the memory cell transistor MT (in the "0" state) of the high erased state cell unit CUH is higher than the position of the threshold voltage lobe of the memory cell transistor MT (in the "0" state) in the low erased state cell unit CUL. Based on this, the position of a lobe of a certain state in the high erased state cell unit CUH is higher than the position of a lobe of the same state in the low erased state cell unit CUL.

On the other hand, the memory device 1 has an upper limit to threshold voltages that the memory cell transistors MT can have. Therefore, based on the position of the threshold voltage lobe of the "0" state of the high erased state cell unit CUH and the upper limit of the possible threshold voltages, that is, to fall between them, the positions of the remaining "1", "2", "3", "4", "5", "6", and "7" states can be determined. For example, as illustrated in FIG. 16, the threshold voltage lobes of all the states of the high erased state cell unit CUH are distributed between a region near the higher end (right end) of the threshold voltage lobe of the "0" state of the low erased state cell unit CUL and a region near the right end of the threshold voltage lobe of the "15" state of the low erased state cell unit CUL. Therefore, the range of the threshold voltage distribution of the low erased state cell unit CUL, that is, the range in which all the threshold voltage lobes fall, is narrower than the range of the threshold voltage distribution of the high erased state cell unit CUH. This is established regardless of the combination of 4 bits and 3 bits as long as the number of bits stored per memory cell transistor MT in the high erased state cell unit CUH is smaller than the number of bits stored per memory cell transistor MT in the low erased state cell unit CUL.

Figure 17:
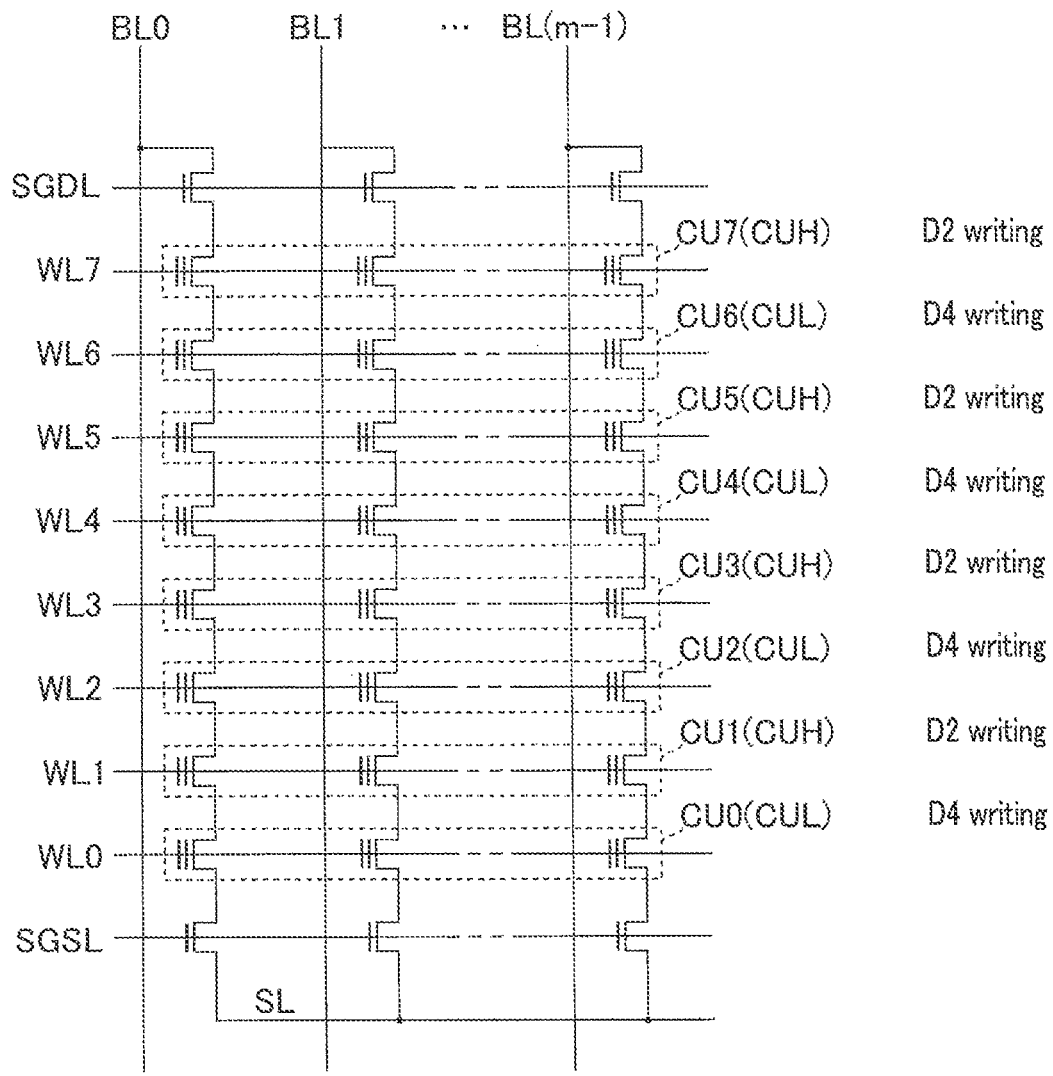
FIG. 17 illustrates a second example of the data writing in the memory system according to the second embodiment.

FIG. 17 illustrates a second example of the data writing in the memory system 5b according to the second embodiment. As illustrated in FIG. 16, the memory controller 2b performs D4 writing to the low erased state cell unit CUL and performs D2 writing to the high erased state cell unit CUH. Even when such writing is performed, the range of the threshold voltage distribution of the low erased state cell unit CUL is narrower than the range of the threshold voltage distribution of the high erased state cell unit CUE.

2.2. Advantages

According to the second embodiment, in addition to the advantages obtained according to the first embodiment, it is possible to provide a memory system in which erroneous reading of data is suppressed as described below.

The number of threshold voltage lobes of the memory cell transistors MT and the widths of the threshold voltage lobes of the memory cell transistors MT in each cell unit CU are determined based on various factors. For example, the threshold voltages are required to fall within a certain range, and as many threshold voltage lobes as fall within this range are selected. When the upper limit of the range in which the threshold voltages are distributed is a predetermined value, the range in which the threshold voltages can be distributed is narrower as the lower limit of the range is higher. When the number of threshold voltage lobes that need to be distributed in a narrow range is the same as the number of threshold voltage lobes that need to be distributed in a wide range, the width of each threshold voltage lobe needs to be narrower, and/or the spacing of the threshold voltage lobes needs to be narrower in the narrower range. Because of such large constraints, a threshold voltage lobe may overlap another threshold voltage lobe. This leads to erroneous reading of data.

According to the second embodiment, as in the first embodiment, by applying the low erase potential Vel and the high erase potential Veh to the word lines WL during the application of the erase bias voltage, the low erased state cell unit CUL and the high erased state cell unit CUH are formed. T-bit data is written to the memory cell transistors MT in the low erased state cell unit CUL, and R-bit (P<T) data is written to the memory cell transistors MT in the high erased state cell unit CUH. Thus, the number of threshold voltage lobes required for the high erased state cell unit CUH is less than the number of threshold voltage lobes required for the low erased state cell unit CUL. When the upper limit of the range in which the threshold voltages can be distributed in the high erased state cell unit CUH is the same as the upper limit of the range in which the threshold voltages can be distributed in the low erased state cell unit CUL, the range in which the threshold voltages can be distributed in the high erased state cell unit CUH is narrower than the range in which the threshold voltages can be distributed in the low erased state cell unit CUL. However, according to the second embodiment, the number of threshold voltage lobes required for the high erased state cell unit CUH is less than the number of threshold voltage lobes required for the low erased state cell unit CUL. Therefore, even in the high erased state cell unit CUH, it is possible to form the threshold voltage lobes while suppressing overlapping of the threshold voltage lobes. This suppresses erroneous reading from the high erased state cell unit CUH.

2.4. Modification

Figure 18:
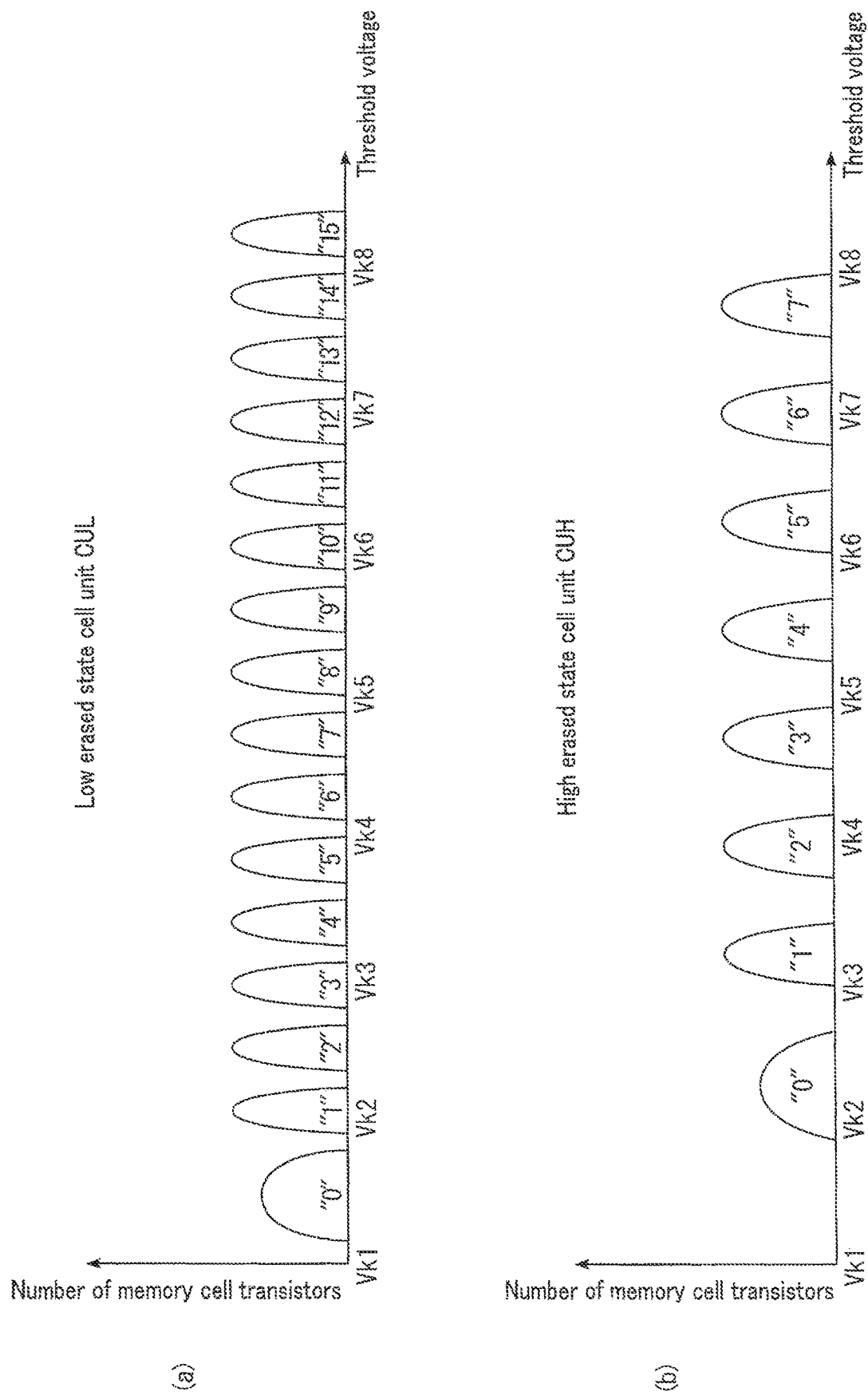
FIG. 18 illustrates an example of a threshold voltage distribution of memory cell transistors of a memory system according to a modification of the second embodiment.

FIG. 18 illustrates an example of a threshold voltage distribution of memory cell transistors MT of a memory system 5b according to a modification of the second embodiment. FIG. 18 illustrates a threshold voltage distribution of memory cell transistors MT of a low erased state cell unit CUL in a part (a). FIG. 18 illustrates a threshold voltage distribution of memory cell transistors MT of a high erased state cell unit CUH in a part (b). FIG. 18 illustrates an example in which D3 writing has been performed on the high erased state cell unit CUH.

As illustrated in the part (b) of FIG. 18, the respective threshold voltage lobes of all the states fall within a narrower range than the range illustrated in the part (b) of FIG. 16. The distance between the position of the threshold voltage lobe of the memory cell transistor MT in the "0" state in the low erased state cell unit CUL and the position of the threshold voltage lobe of the memory cell transistor MT in the highest state ("7") in the low erased state cell unit CUL is smaller than that in the case illustrated in FIG. 16. Therefore, the difference between the threshold voltages of two series-coupled memory cell transistors MTq and MT(q+1) is smaller than that in the case illustrated in FIG. 16. Therefore, it is possible to suppress movement of electrons in the charge storage layer IA. In particular, a decrease in the number of electrons in the memory cell transistor MT in a higher state in the low erased state cell unit CUL is reduced. That is, for example, it is assumed that the memory cell transistor MTq is in the "7" state in the high erased state cell unit CUH and the memory cell transistor MT(q+1) is in the "0" state in the low erased state cell unit CUL. Since the memory cell transistor MTq has a lower threshold voltage than that in the case illustrated in FIG. 16, the difference from the threshold voltage of the adjacent memory cell transistor MT(q+1) in the "0" state is smaller than that in the case illustrated in FIG. 16. Therefore, a decrease in the threshold voltage of the memory cell transistor MTq is suppressed as compared with the case illustrated in FIG. 16.

3. Third Embodiment

The third embodiment is implemented in combination with the first or second embodiment. The third embodiment relates to an operation mode of the memory device 1.

3.1. Configuration

Figure 19:
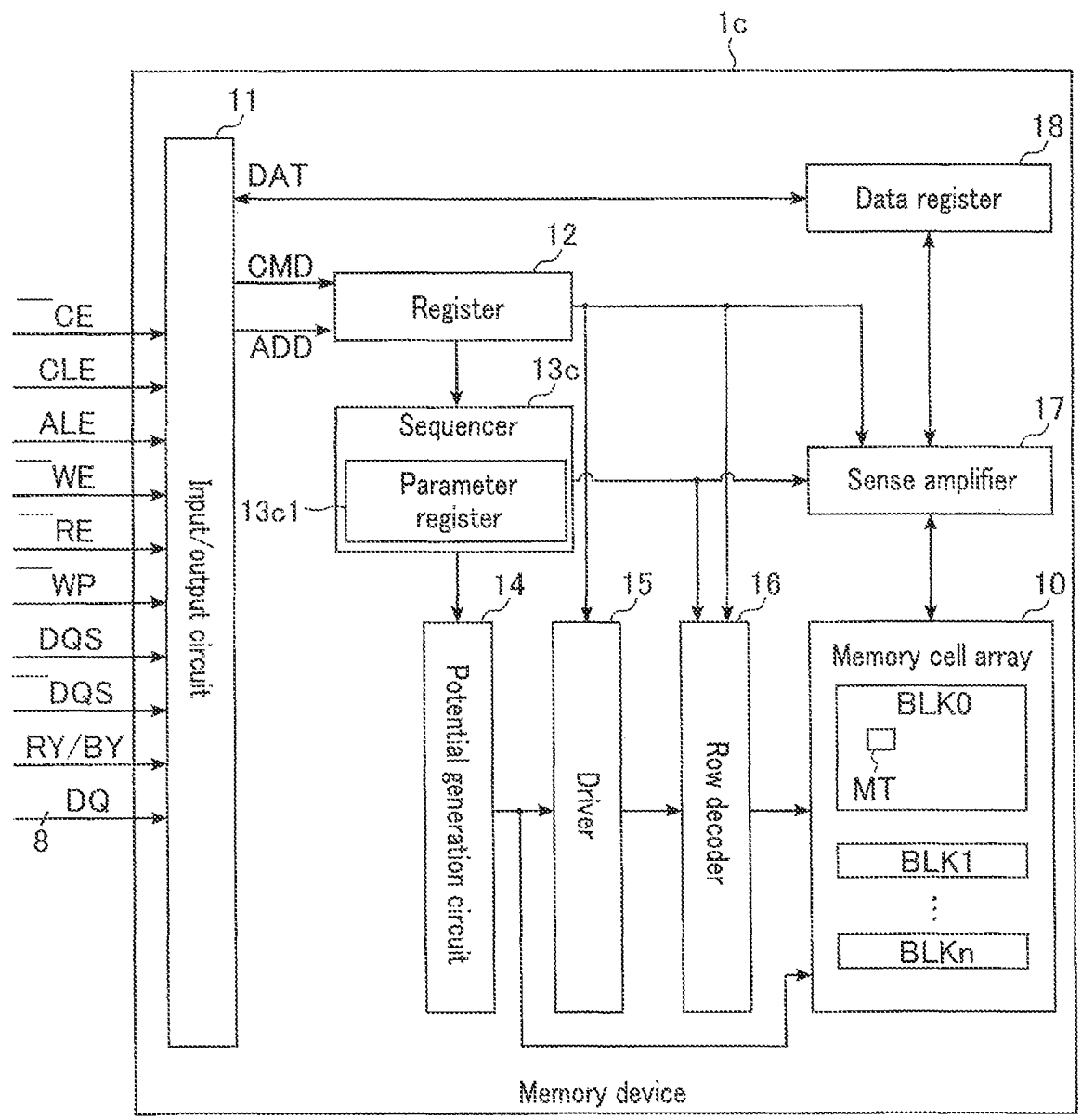
FIG. 19 illustrates an example of components and couplings of a memory device according to a third embodiment.

FIG. 19 illustrates an example of components and couplings of a memory device is according to the third embodiment. The memory device is includes a sequencer 13c. The sequencer 13c includes a parameter register 13c1 that holds values for various parameters used for the operation of the memory device 1c. The parameter register 13c1 includes areas each identified by a unique address, and each holds a value for a certain parameter in each region. The value for each parameter can be acquired by reading the parameter register 13c1 with designation of an address identifying a region storing the parameter. The sequencer 13c is configured to perform an operation described below.

3.2. Operation

The memory device 1c can operate in a single mode dynamically selected from among a plurality of operation modes. The plurality of operation, modes includes a first mode and a second mode. The first mode and the second mode are different in terms of details of the first and second groups of word lines WL.

3.2.1. Operation Modes of Memory Device

Figure 20:
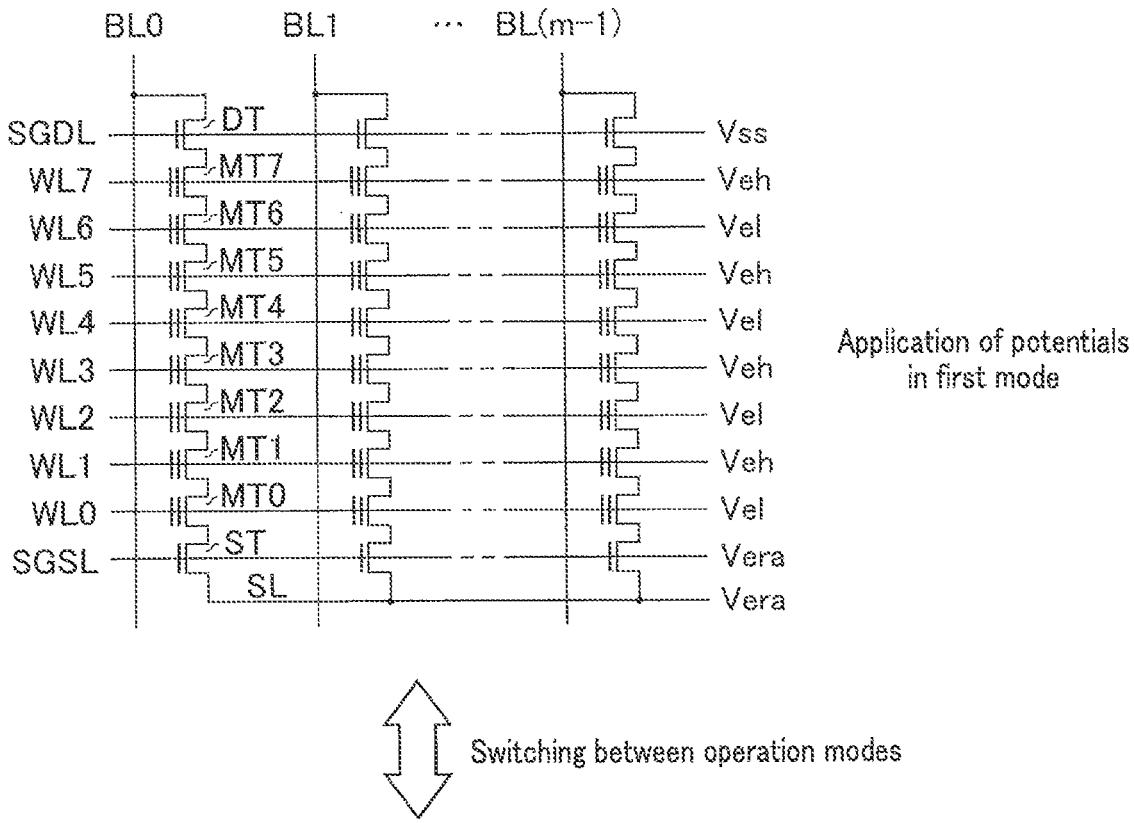
FIG. 20 illustrates potentials applied to some interconnects during an operation in two modes in the memory device according to the third embodiment.
Figure 20:
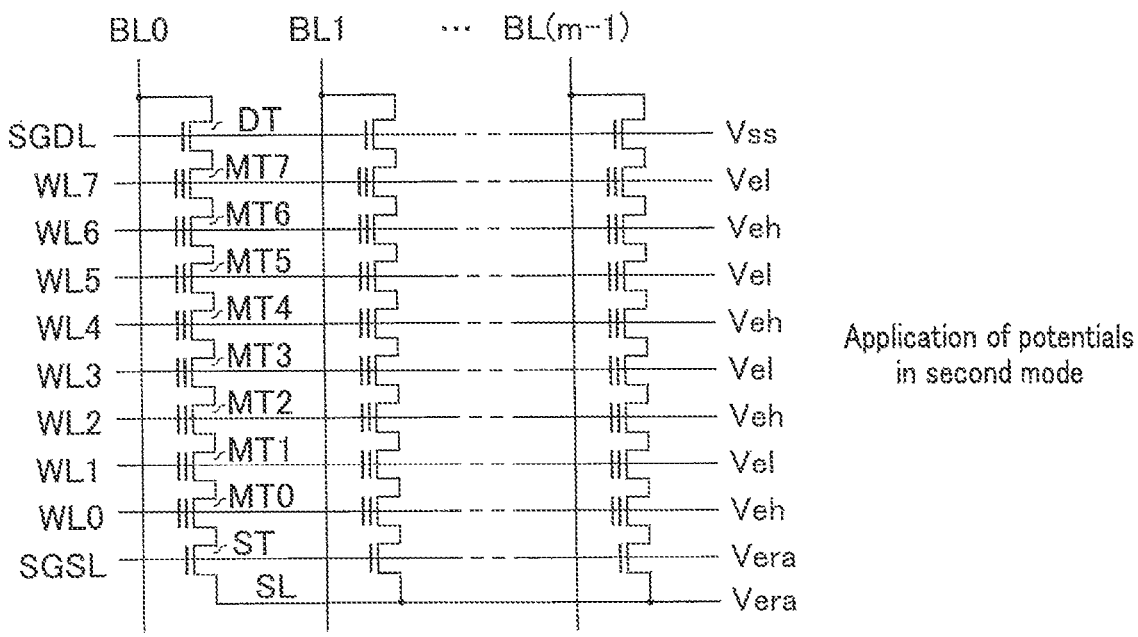

FIG. 20 illustrates potentials applied to the word lines WL during the application of the erase bias voltage in the first mode and the second mode of the memory device 1c according to the third embodiment. As illustrated in the upper part of FIG. 20, in the first mode, the word lines WL having even addresses are designated as the first group, and the word lines WL having odd addresses are designated as the second group. That is, during the application of the erase bias voltage, the low erase potential Vel is applied to the word lines WL having the even addresses, and the high erase potential Veh is applied to the word lines WL having the odd addresses.

On the other hand, as illustrated in the lower part of FIG. 20, in the second mode, the word lines WL having the odd addresses are designated as the first group, and the word lines WL having the even addresses are designated as the second group. That is, during the application of the erase bias voltage, the low erase potential Vel is applied to the word lines WL having the odd addresses, and the high erase potential Veh is applied to the word lines WL having the even addresses.

3.2.2. Switching Between Operation Modes of Memory Device

Switching between the first mode and the second mode can be performed, for example, based on a command from a memory controller 2c. That is, the memory device 1c and the memory controller 2c support transmission and reception of an instruction designating a certain operating condition of the memory device 1c. The memory controller 2c can designate the first mode or the second mode by transmitting such an instruction to the memory device 1c.

Figure 21:
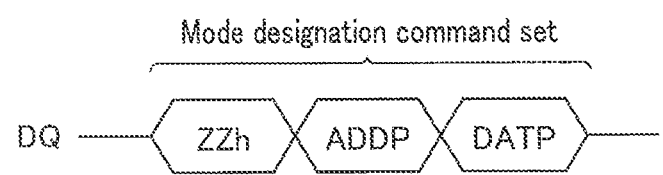
FIG. 21 illustrates an example of an instruction used in a memory system according to the third embodiment.

The instruction to designate the mode includes, for example, a command ZZh, address information ADDP, and data DATP as illustrated in FIG. 21. Hereinafter, the instruction including the command ZZh, the address information ADDP, and the data DATP may be referred to as a mode designation command set. The command ZZh is a command for giving an instruction to set parameter values, and transmits a unique value identifying the designation of a parameter. The address information ADDP is information of an address at which a value of a target parameter whose value in the parameter register 13c1 of the sequencer 13c is to be set is stored. The address information designates an address at which a value indicating the first mode or the second mode in the parameter register 13c1 is held in order to function as a mode designation command. The data DATP is a to-be-set value of a parameter whose a value is to be set. The set value has a value designating the first mode or the second mode.

Upon receiving the mode designation command set, the memory device 1c operates in the mode that is either the first or second mode and indicated by the received mode designation command set. For example, upon receiving a certain mode designation command set, the memory device 1c remains in the designated mode until another mode is designated by another mode designation command set. The sequencer 13c controls components including the potential generation circuit 14, the driver 15, and the row decoder 16 such that an operation based on the mode in which the memory device 1c is currently in is performed.

The memory controller 2c can switch the mode for each of one or more blocks BLK every time data is erased.

Alternatively, the memory controller 2c can switch the mode every time the total number of erase cycles for all the blocks BLK reaches a certain number. For this purpose, for example, the memory controller 2c can count the number of times of erasing data of a block BLK from a certain point of time, and store data indicating the counted number of times of erasing in the RAM 23. The counting of the number of erase cycles can be started, for example, from when the memory system 5c is powered on for the first time after being shipped. Alternatively, the counting can be started from when the memory system 5c is reset. The memory controller 2c refers to the data indicating the of erase cycles, and switches the mode of the memory device 1c when the total number of erase cycles of the block BLK reaches a certain threshold. Further, when the total number of erase cycles reaches another threshold, the mode is switched. Thus, each time a certain condition is satisfied, the mode is toggled.

The data erasing applies stress to the memory cell transistors MT, and the stress can shorten the life of the memory cell transistors MT. That is, the application of the erase bias voltage damages various portions that are included in the memory cell transistors MT and to which the voltage is applied, for example, the charge storage layer IA. The higher the applied voltage, the greater the damage done.

According to the third embodiment, the memory device 1c can operate in the two modes, and the two modes are switched based on a condition. In the first mode, during the application of the erase bias voltage, the low erase potential Vel is applied to the first group of word lines WL (having even (or odd) addresses), and the high erase potential Veh is applied to the second group of word lines WL (having odd (or even) addresses). In the second mode, during the application of the erase bias voltage, the high erase potential Veh is applied to the first group of word lines WL (having even (or odd) addresses), and the low erase potential Vel is applied to the second group of word lines WL (having odd (or even) addresses). Therefore, it is possible to avoid repetitive application of an erase bias voltage causing greater damage to a specific cell unit CU in a short period of time. That is, the erase stress is leveled over the plurality of cell units CU. This prevents only the specific cell unit CU from being damaged continuously and broken.

4. Fourth Embodiment

Figure 22:
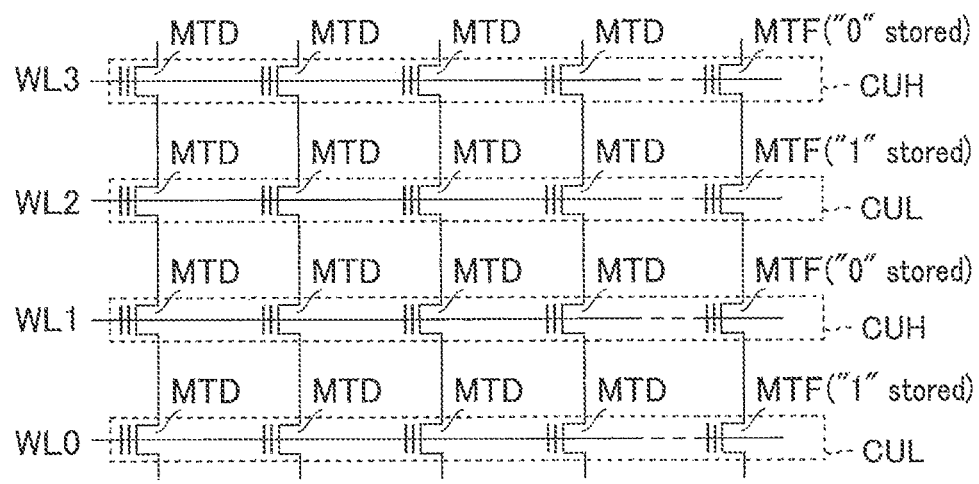
FIG. 22 illustrates types of roles of memory cell transistors of a memory device according to a fourth embodiment.

The fourth embodiment is implemented in combination with the second or third embodiment. The fourth embodiment relates to data reading from the memory device 1.
4.1. Configuration A memory controller 2d according to the fourth embodiment is configured to perform an operation described below. That is, for example, a ROM 22 included in the memory controller 2d stores a program that is executed by the CPU 24 to cause the memory controller 2d to perform the operation described below. A memory device 1d according to the fourth embodiment, particularly a sequencer 13d is configured to perform the operation described below.
4.2. Operation
4.2.1. Data Writing to Memory Device FIG. 22 illustrates types of roles of memory cell transistors MT in a cell unit CU of a memory device 1d according to the fourth embodiment. As illustrated in FIG. 22, each cell unit CU includes data memory cell transistors MTD and a flag memory cell transistor MTF. The data memory cell transistor MTD is, for example, a memory cell transistor MT coupled to each of bit lines BL of a certain number of consecutive addresses, and stores normal data. The normal data is data to be written to the memory device 1d by the memory controller 2d in order to execute a write request from the host device, or data that the memory controller 2d desires to write to the memory device 1d based on an autonomous operation not based on a request from the host device. Two or more bits of data are written to the data memory cell transistor MTD. That is, data with the number of bits equal to the number of pages written to the cell unit CU to which the data memory cell transistor MTD belongs is written to the data memory cell transistor MTD.

The flag memory cell transistors MTF store the value of multi-value bit flags. The multi-value bit flag indicates how many bits of data are stored in the data memory cell transistor MTD in the cell unit CU to which the flag memory cell transistor MTF belongs. That is, as described in the second embodiment, data of a larger number (hereinafter, it may be referred to as a multi-value) of pages of the two values is written to the low erased state cell unit CUL, and data of a smaller number (hereinafter, it may be referred to as a small-value) of pages of the two values is written to the high erased state cell unit CUH. When multi-value bit data is written to the data memory cell transistors MTD in the cell unit CU to which the flag memory cell transistor MTF belongs, the multi-value bit flag has a value to that effect. The flag has, for example, "1" to indicate a multi-value bit. On the other hand, when small-value bit data is written to the data memory cell transistors MTD in the cell unit CU to which the flag memory cell transistor MTF belongs, the flag has a value "0". The value of the multi-value bit flag may have a value opposite to the above example in a case where the value of the multi-value bit flag indicates storage of a multi-value bit and in a case where the value of the multi-value bit flag indicates storage of a small-value bit.

Figure 23:
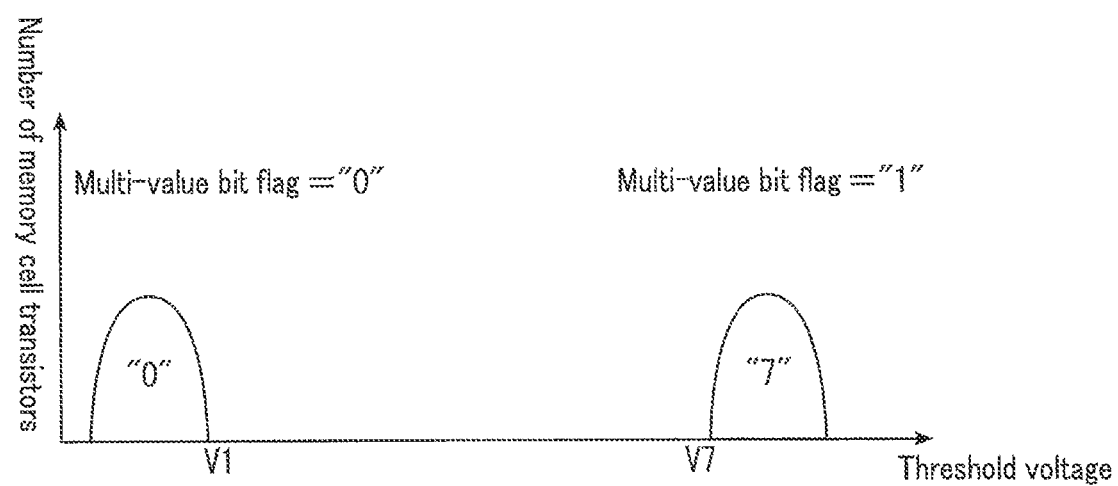
FIG. 23 illustrates a threshold voltage distribution of flag memory cell transistors of the memory device according to the fourth embodiment.

The multi-value bit flag is implemented by D1 writing, as described below with reference to FIG. 23. FIG. 23 illustrates a threshold voltage distribution of flag memory cell transistors MTF of the memory device 1d according to the fourth embodiment. FIG. 23 relates to an example in which the data memory cell transistors MTD store 4-bit data. As illustrated in FIG. 23, in order to store data "1" in the flag memory cell transistors MTF, a threshold voltage of memory cell transistors MT that are in any one of the "1" to "15" states or a state higher than that state is given to the flag memory cell transistor MTF. In FIG. 23, as an example, the flag memory cell transistors MTF that store data "1" have a threshold voltage of the "7" state or a state higher than the "7" state. In order to obtain such a state, the flag memory cell transistors MTF are treated as the target state thereof being the "7" state during writing. The following description is based on this example.

In writing to a certain cell unit CU, the threshold voltages of the data memory cell transistors MTD and the flag memory cell transistor MTF are shifted to their respective target states in parallel. The flag memory cell transistor MTF is treated in the same manner as the data memory cell transistor MTD that is to store data "0000". Then, when it is confirmed that the flag memory cell transistor MTF has the lowest voltage among voltages of memory cell transistors MT to be shifted to the target "7" state after writing, it is determined that the writing to the flag memory cell transistor MTF has been completed. On the other hand, the process of increasing the threshold voltage of the data memory cell transistor MTD shifted to a state higher than the "7" state further continues.

4.2.2. Data Reading From Memory Device

Figure 24:
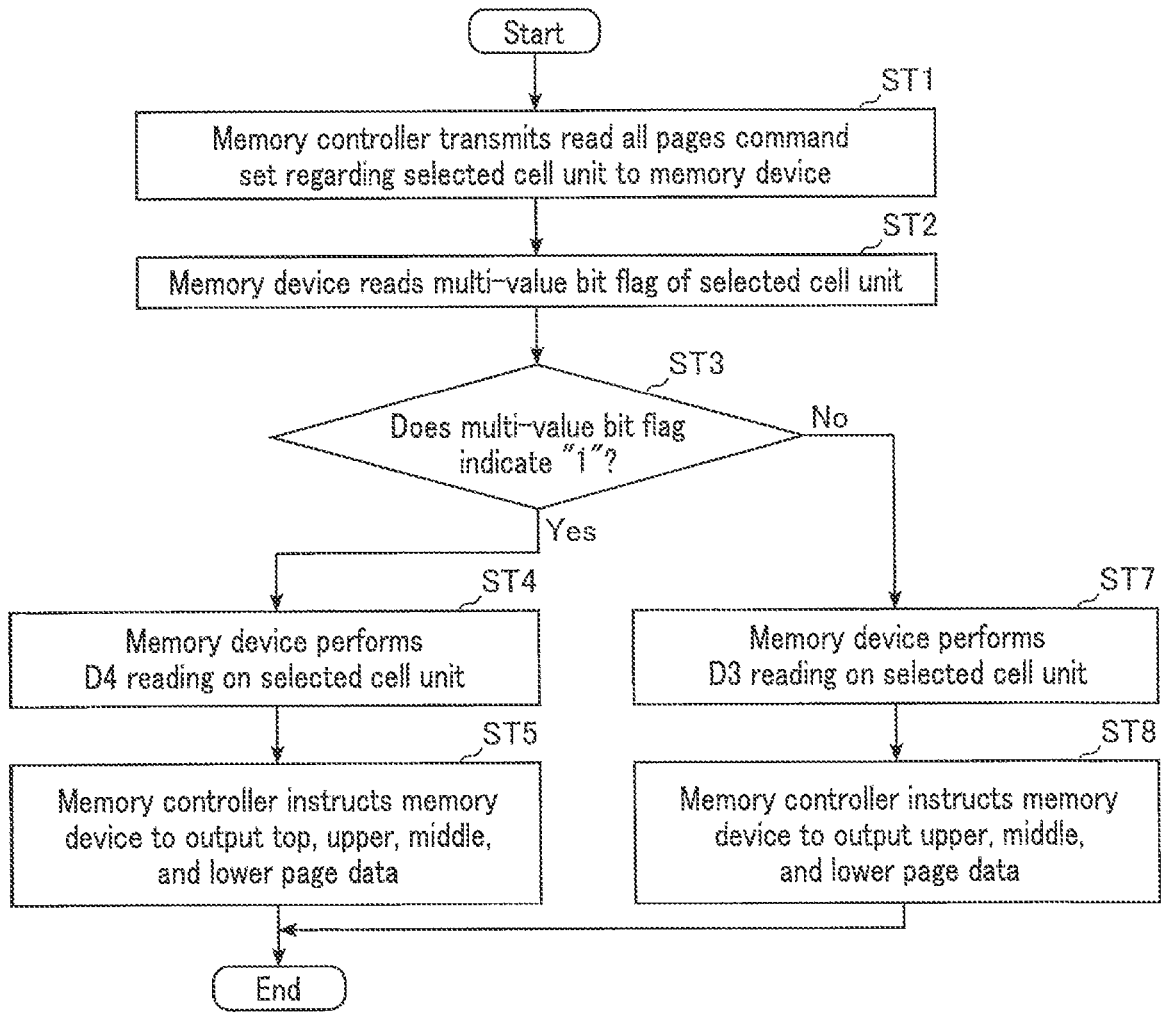
FIG. 24 illustrates a flow for data reading in a memory system according to the fourth embodiment.

FIG. 24 illustrates a flow for data reading in the memory system 5d according to the fourth embodiment. Each step is described in further detail below. The flow illustrated in FIG. 24 relates to a case where the memory controller 2d desires to read data of all pages of a certain cell unit CU (hereinafter, it may be referred to as a selected cell unit CUS). The flow illustrated in FIG. 24 starts when the memory controller 2d determines to read the data of all the pages of a certain selected cell unit CUS.

As illustrated in FIG. 24, the memory controller transmits a command set giving an instruction on data reading from all the pages to the memory device 1d (ST1). Hereinafter, the command set giving an instruction on the data reading from all the pages may be referred to as a read all pages command set. The read all pages command set may have any definition as long as the read all pages command set includes at least information giving an instruction on the reading of all the pages and address information ADD identifying a read target cell unit CU. The read all pages command set transmitted as step ST1 includes the address information ADD identifying the selected cell unit CUS.

When the memory device 1d receives the read all pages command set, the memory device 1d (particularly, the sequencer 13d) performs reading on the flag memory cell transistor MTF of the selected cell unit CUS to determine the value of the multi-value bit flag (ST2).

The multi-value bit flag has 1-bit information as described with reference to FIG. 23. Therefore, the sequencer 13d uses D1 reading as the reading of the multi-value bit flag of the flag memory cell transistor MTF of the selected cell unit CUS. D1 reading uses a read voltage Vcgr of a certain single magnitude. The read voltage Vcgr has a magnitude between the read voltage V1 and the read voltage V7 based on an example in which the data "1" of the multi-value bit flag uses the "7" state. As an example, D1 reading for reading the multi-value bit flag can be performed using the read voltage V5 used in D4 reading as the read voltage Vcgr. That is, when the flag memory cell transistor MTF has a threshold voltage equal to or higher than the read voltage V5, it is determined that the multi-value bit flag indicates "1". On the other hand, when the flag memory cell transistor MTF has a threshold voltage lower than the read voltage V5, it is determined that the multi-value bit flag indicates "0".

The memory device 1d, particularly, the sequencer 13d determines whether the value of the multi-value bit flag of the selected cell unit CUS is "1" (ST3). When the multi-value bit flag of the selected cell unit CUS is "1" (ST3_Yes), the sequencer 13d performs D4 reading on the selected cell unit CUS (ST4). The lower page data, the upper page data, the middle page data, and the top page data stored in the selected cell unit CUS are obtained by D4 reading. The lower page data, the upper page data, the middle page data, and the top page data include, for example, only data based on information (state) stored in the data memory cell transistor MTD of the selected cell unit CUS, and do not include data based on the states of the memory cell transistors MT other than the data memory cell transistor MTD. The lower page data, the upper page data, the middle page data, and the top page data are transmitted from the memory device 1d to the memory controller 2d based on an instruction from the memory controller 2d (ST5). When the transmission of the lower page data, the upper page data, the middle page data, and the top page data to the memory controller 2d is completed, the flow illustrated in FIG. 24 ends.

On the other hand, when the multi-value bit flag of the selected cell unit CUS is not "1" (ST3_No), the sequencer 13d performs D3 reading on the selected cell unit CUS (ST7). The upper page data, the middle page data, and the lower page data stored in the selected cell unit CUS are obtained by D3 reading. The upper page data, the middle page data, and the lower page data are transmitted from the memory device 1d to the memory controller 2d based on an instruction from the memory controller 2d (ST8). When the transmission of the upper page data, the middle page data, and the lower page data to the memory controller 2d is completed, the flow illustrated in FIG. 24 ends.

4.2.2.1. Read All Pages Command Set

Figure 25:
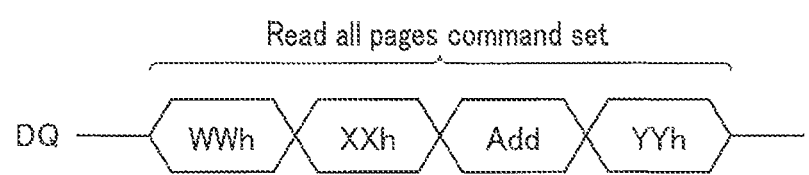
FIG. 25 illustrates an example of a read all pages command set of the memory system according to the fourth embodiment.

FIG. 25 illustrates an example of the read all pages command set of the memory system 5d according to the fourth embodiment. As illustrated in FIG. 25, the read all pages command set includes, for example, a command WWh, a command XXh, address information Add, and a command YYz. The command WWh, the command XXh, the address information Add, and the command YYz are transmitted in this order. The command WWh has a value for giving an instruction to read data from all the pages. The command XXh provides notification that the transmission of the address information ADD follows, and gives an instruction to read data from, for example, a certain one page. Flow of the command WWh preceding the command XXh can give an instruction to read the data from all the pages. Instead of using the command WWh and the command XXh, a single dedicated command designating reading from all the pages may be used.

The address information Add designates a plane PB, a block BLK, and a string unit SU that include the selected cell unit CUS, and a word line WL coupled to the selected cell unit CUS. The address information Add may transmit information to be transmitted by the address information Add in two or more cycles. The command YYh gives an instruction to perform data reading.

4.2.2.2. D4 Reading From Memory Device

Figure 27:
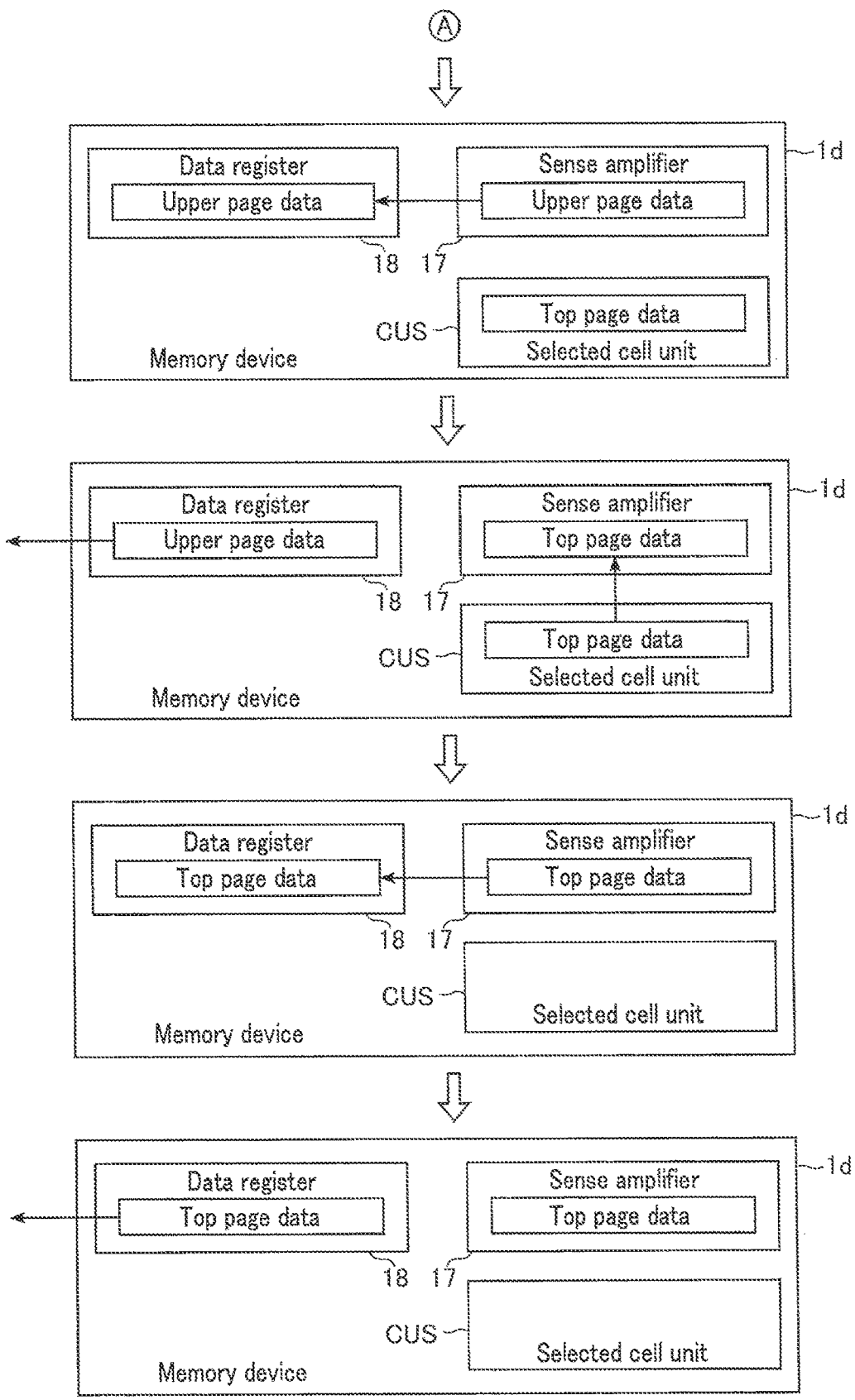
FIG. 27 illustrates an example of the generation and movement of data during D4 reading in the memory system according to the fourth embodiment.

FIGS. 26 and 27 illustrate an example of the generation and movement of data during D4 reading in the memory system 5d according to the fourth embodiment. FIG. 27 follows a state illustrated in FIG. 26.

The lower page reading, the middle page reading, the upper page reading, and the top page reading from the data memory cell transistor MTD of the selected cell unit CUS are performed by D4 reading based on the reception of the read all pages command set. The lower page reading, the middle page reading, the upper page reading, and the top page reading may be performed in any order. An example in which the lower page reading, the middle page reading, the upper page reading, and the top page reading are performed in this order is described below. Upon transmitting the read all pages command set, the memory controller 2d recognizes that page data should be prepared in the order of the lower page data, the middle page data, the upper page data, and the top page data in a case where the selected cell unit CUS as a target for the read all pages command set stores data of four pages.

As illustrated in the first row from the top of FIG. 26, the sequencer 13d reads the data of the lower page of the selected cell unit CUS. During the acquisition of the lower page data, the memory device 1d keeps outputting a ready/busy signal indicating busy. By reading the lower page data, the lower page data is obtained in a certain data latch in the sense amplifier 17. The lower page data is transferred to the data register 18. After the lower page data is transferred to the data register 18, the memory device 1d keeps the ready/busy signal RY/BY in a state indicating ready.

As illustrated in the second row from the top of FIG. 26, the memory controller 2d detects the transition of the memory device 1d to the ready state and instructs the memory device 1d to output the lower page data. The memory device 1d outputs the lower page data from the data register 18 based on the instruction. The lower page data is received by the memory controller 2d.

Once the lower page data is transferred to the data register 18, the sequencer 13d reads the data of the middle page of the selected cell unit CUS. The reading of the lower page data, the reading of the middle page data, the reading of the upper page data, or the reading of the top page data can be performed in parallel with the output of the data in the data register 18. Therefore, the reading of the middle page data can be performed in parallel with the output of the lower page data from the data register 18. By reading the middle page data, the middle page data is obtained in a certain data latch in the sense amplifier 17. The sequencer 13d monitors the completion of the output of the lower page data from the data register 18.

As illustrated in the third row from the top of FIG. 26, in a case where the output of the lower page data from the data register 18 has not been completed when middle page data is acquired, the sequencer 13d waits for the completion, and transfers the middle page data to the data register 18 after the completion. On the other hand, in a case where the output of the lower page data from the data register 18 has been completed when the middle page data is acquired, the sequencer 13d transfers the middle page data to the data register 18 when the acquisition of the middle page data is completed.

Once the middle page data is transferred to the data register 18, the memory device 1d notifies the memory controller 2d of the fact, that is, that the page data is ready to be output. The notification can be performed in any manner. For example, the memory device 1d can set the ready/busy signal RY/BY to a busy state for an extremely short period of time and then to a ready state for the notification.

As illustrated in the fourth row from the top of FIG. 26, upon recognizing that the middle page data is ready to be output, the memory controller 2d instructs the memory device 1d to output the middle page data. Based on the instruction, the middle page data is output from the memory device 1d and received by the memory controller 2d.

Once the middle page data is transferred to the data register 18, the sequencer 13d reads the upper page data of the selected cell unit CUS. The reading of the upper page data can be performed in parallel with the output of the middle page data from the data register 18. By reading the upper page data, the upper page data is obtained in a certain data latch in the sense amplifier 17. The sequencer 13d monitors the completion of the output of the middle page data from the data register 18.

As illustrated in the first row from the top of FIG. 27, in a case where the output of the middle page data from the data register 18 has not been completed when the upper page data is acquired the sequencer 13d waits for the completion, and transfers the upper page data to the data register 18 after the completion. On the other hand, in a case where the output of the middle page data from the data register 18 has been completed when the upper page data is acquired, the sequencer 13d transfers the upper page data to the data register 18 when the acquisition of the upper page data is completed.

Once the upper page data is transferred to the data register 18, the memory device 1d notifies the memory controller 2d of the fact, that is, that the page data is ready to be output. The notification can be performed in any manner. For example, the memory device 1d can set the ready/busy signal RY/BY to a busy state for an extremely short period of time and then to a ready state for the notification.

As illustrated in the second row from the top of FIG. 27, upon recognizing that the upper page data is ready to be output, the memory controller 2d instructs the memory device 1d to output the upper page data. Based on the instruction, the upper page data is output from the memory device 1d and received by the memory controller 2d.

Once the upper page data is transferred to the data register 18, the sequencer 13d reads the top page data of the selected cell unit CUS. The reading of the top page data can be performed in parallel with the output of the upper page data from the data register 18. By reading the top page data, the top page data is obtained in a certain data latch in the sense amplifier 17. The sequencer 13d monitors the completion of the output of the upper page data from the data register 18.

As illustrated in the third row from the top of FIG. 27, in a case where the output of the upper page data from the data register 18 has not been completed when the top page data is acquired, the sequencer 13d waits for the completion, and transfers the top page data to the data register 18 after the completion. On the other hand, in a case where the output of the upper page data from the data register 18 has been completed when the top page data is acquired, the sequencer 13d transfers the top page data to the data register 18 when the acquisition of the top page data is completed.

Once the top page data is transferred to the data register 18, the memory device 1d notifies the memory controller 2d of the fact, that is, that the page data is ready to be output. The notification can be performed in any manner. For example, the memory device 1d can set the ready/busy signal RY/BY to a busy state for an extremely short period of time and then to a ready state for the notification.

As illustrated in the fourth row from the top of FIG. 27, upon recognizing that the top page data is ready to be output, the memory controller 2d instructs the memory device 1d to output the top page data. Based on the instruction, the top page data is output from the memory device 1d and received by the memory controller 2d.

4.2.2.3. D3 Reading From Memory Device

The reading of the lower page data, the reading of the middle page data, and the reading of the upper page data from the data memory cell transistor MTD of the selected cell unit CUS are performed by D3 reading based on the reception of the read all pages command set. The reading of the lower page data, the reading of the middle page data, and the reading of the upper page data may be performed in any order. An example in which the reading of the lower page data, the reading of the middle page data, and the reading of the upper page data are performed in this order is described below. The memory controller 2d recognizes that, when the memory controller 2d transmits the read all pages command set, the page data should be prepared in the order of the lower page data, the middle page data, and the upper page data in a case where the selected cell unit CUS as a target of the read all pages command set stores data of the three pages.

Details of D3 reading are similar to those of D4 reading. More specifically, D3 reading corresponds to a mode in which the reading of the top page data is not performed in D4 reading described with reference to FIGS. 26 and 27. When the upper page data is transferred to the data register 18, the sequencer 13d ends the data reading from the selected cell unit CUS.

4.3. Advantages

According to the fourth embodiment, each cell unit CU stores a multi-value bit flag, and the read all pages command set is defined. Upon receiving the read all pages command set, the memory device 1d reads the multi-value bit flag of the selected cell unit CUS, and performs D4 reading or D3 reading on the selected cell unit CUS based on the value of the multi-value bit flag. The lower page data, the upper page data, the middle page data, and the top page data are sequentially obtained by D4 reading, and the lower page data, the upper page data, and the middle page data are sequentially obtained by D3 reading. Which one of D4 reading and D3 reading is performed is determined by the memory device 1d based on the value of the multi-value bit flag. Therefore, when the data of all the pages of the selected cell unit CUS is desired, the memory controller 2d can acquire the data of all the pages without requiring the transmission of the command set for reading each page. Therefore, the memory controller 2d can acquire desired data by transmitting a small number of command sets, and the data can be efficiently acquired in the memory system 5d.

5. Fifth Embodiment

The fifth embodiment is implemented in combination with the second embodiment and embodiments implemented in combination with the second embodiment, and relates to variations of details of writing.

A memory controller 2e according to the fifth embodiment is configured to perform an operation described below. That is, for example, a ROM 22 included in the memory controller 2e stores a program that is executed by the CPU 24 to cause the memory controller 2e to perform the operation described below.

5.1. Operation

The fifth embodiment relates to data writing to a plurality of cell units CU having consecutive addresses. Several examples will be described below.

5.1.1. First Example

In the first example, certain first-type writing is used to write data to the cell units CU. Hereinafter, the first-type writing may be referred to as one-step writing.

In the one-step writing, each memory cell transistor MT of the cell unit CU is shifted from the "0" state (erased state) to a target state by one-time data writing to a cell unit CU. The one-time writing includes the repetition of a plurality of program loops. Each program loop includes a program and program verify.

The program refers to increasing the threshold voltage of the write target memory cell transistor MT by injecting electrons into the charge storage layer IA of the write target memory cell transistor MT, or keeping the threshold voltage by inhibiting the injection of electrons.

The program verify refers to reading data from the write target memory cell transistor MT and determining whether or not the threshold voltage of the write target memory cell transistor MT has reached that of the target state. The fact that the threshold voltage of the write target memory cell transistor MT has reached the target state is referred to as "having passed the program verify", and the fact that that the threshold voltage of the write target memory cell transistor MT has not reached the target state is referred to as "having failed the program verify".

Once a write target memory cell transistor MT passes the program verify in a certain program loop, the write target memory cell transistor MT is kept in a condition in which electrons are not injected (or, suppressed) into the charge storage layer IA in the next and subsequent program loops.

When all or a certain number of the memory cell transistors MT in the write target cell unit CU pass program verify by the repetition of the program loop, the one-step writing ends.

Figure 28:
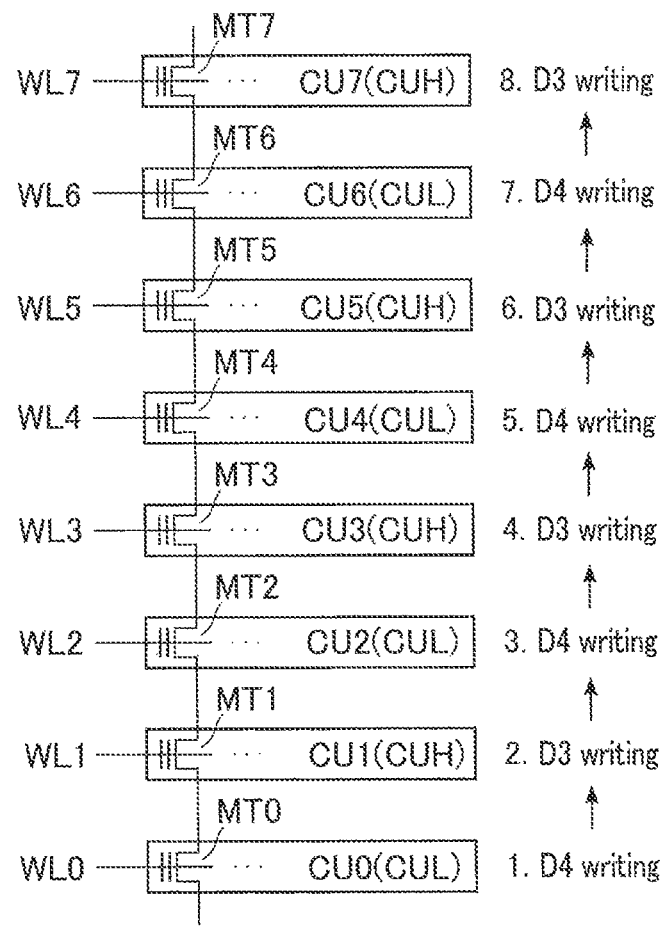
FIG. 28 illustrates a first example of data writing in a memory system according to a fifth embodiment.
Figure 29:
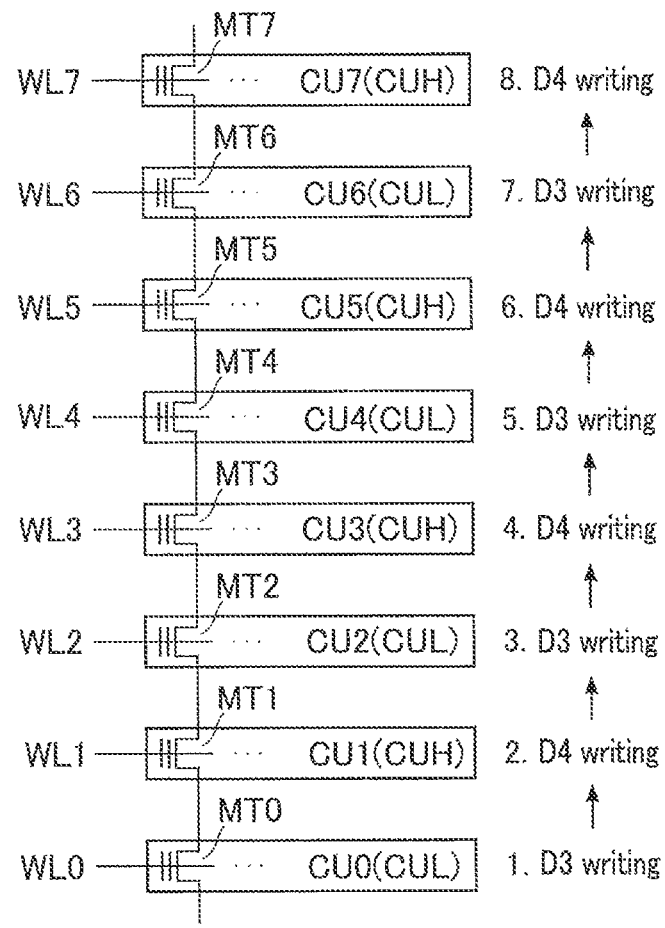
FIG. 29 illustrates the first example of the data writing in the memory system according to the fifth embodiment.

FIGS. 28 and 29 illustrate a first example of the data writing in the memory system 5e according to the fifth embodiment. FIG. 28 is based on an example in which multi-value page data is written to cell units CU having even addresses. FIG. 29 is based on an example in which multi-value page data is written to cell units CU having odd addresses.

As illustrated in FIG. 28, D4 writing or D3 writing is performed by one-step writing on write target cell units CU in ascending order of addresses of the write target cell units CU. That is, D4 writing is performed on the cell unit CU0, D3 writing is performed on the cell unit CU1, D4 writing is performed on the cell unit CU2, D3 writing is performed on the cell unit CU3, D4 writing is performed on the cell unit CU4, and D3 writing is performed on the cell unit CU5. Data is written to the cell unit CU6 and the cell unit CU having larger addresses according to the same rule.

As illustrated in FIG. 29, D4 writing or D3 writing is performed by one-step writing on write target cell units CU in ascending order of addresses of the write target cell units CU. That is, D3 writing is performed on the cell unit CU0, D4 writing is performed on the cell unit CU1, D3 writing is performed on the cell unit CU2, D4 writing is performed on the cell unit CU3, D3 writing is performed on the cell unit CU4, and D4 writing is performed on the cell unit CU5. Data is written to the cell unit CU6 and the cell units CU having larger addresses according to the same rule.

5.1.2. Second Example

In the second example, a cell unit CUJ (J is an integer of 0 or more) and CU(J+1) form a pair. Then, in each pair of cell units CU, data is first written to CU(J+1), and then data is written to a cell unit CUJ. Then, in each pair of cell units CU, data is first written to a cell unit CU to which multi-value page data is written. Further, pairs of cell units CU are selected in ascending order of J. That is, data is written to the cell units CU(J+1), CUJ, CU(J+3), CU(J+2), CU(J+5), CU(J+4), . . . in this order.

Figure 30:
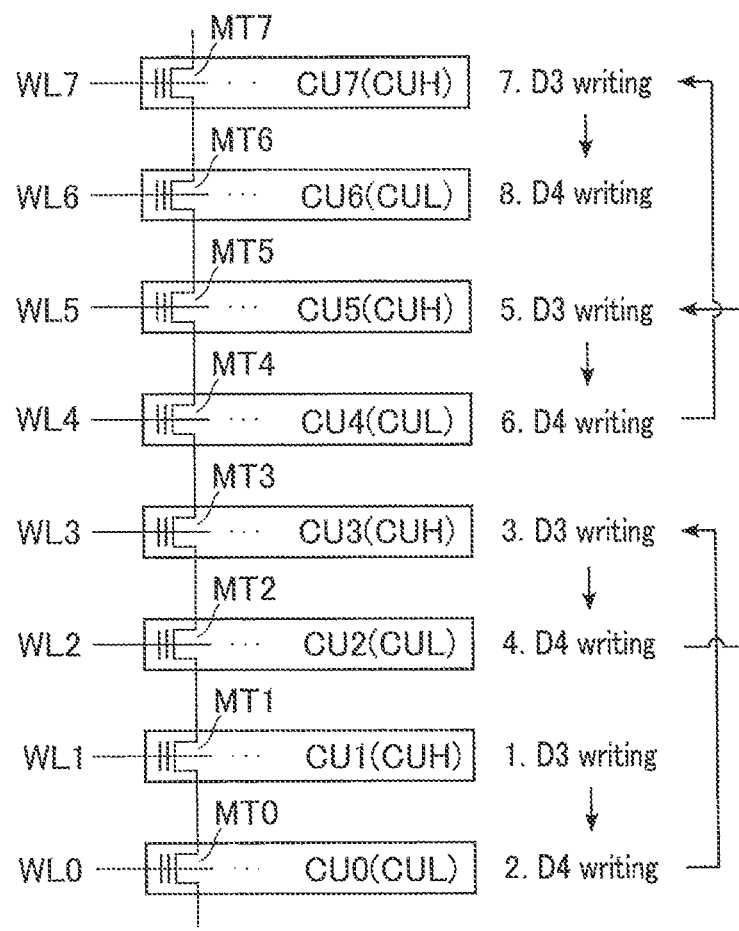
FIG. 30 illustrates a second example of the data writing in the memory system according to the fifth embodiment.
Figure 31:
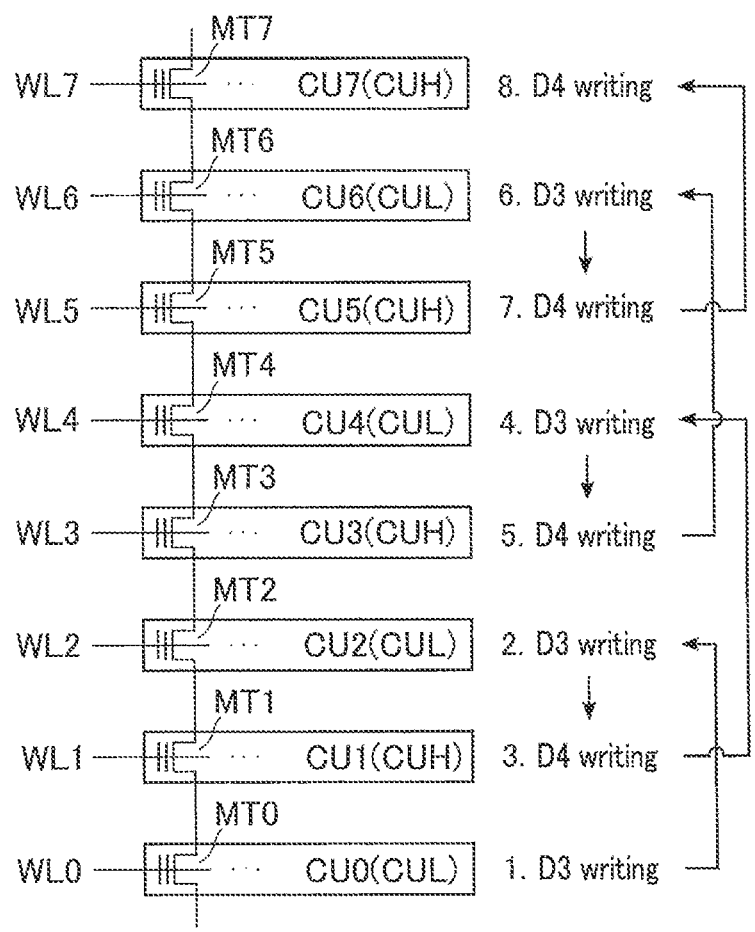
FIG. 31 illustrates the second example of the data writing in the memory system according to the fifth embodiment.

FIGS. 30 and 31 illustrate the second example of the data writing in the memory system 5e according to the fifth embodiment. FIG. 30 is based on an example in which multi-value page data is written to cell units CU having even addresses. FIG. 31 is based on an example in which multi-value page data is written to cell units CU having odd addresses.

As illustrated in FIG. 30, D3 writing is performed on the cell unit CU1, D4 writing is performed on the cell unit CU0, D3 writing is performed on the cell unit CU3, D4 writing is performed on the cell unit CU2, D3 writing is performed on the cell unit CU5, and D4 writing is performed on the cell unit CU4. Data is written to the cell unit CU6 and the cell units CU having larger addresses according to the same rule.

As illustrated in FIG. 31, first, D3 writing is performed on the cell unit CU0. Then, D3 writing is performed on the cell unit CU2, D4 writing is performed on the cell unit CU1, D3 writing is performed on the cell unit CU4, D4 writing is performed on the cell unit CU3, D3 writing is performed on the cell unit CU6, and D4 writing is performed on the cell unit CU5. Data is written to the cell unit CU7 and the cell units CU having larger addresses according to the same rule.

5.1.3. Third Example

The third example is based on the first example and different from the first example in that D2 writing is used instead of D3 writing.

Figure 32:
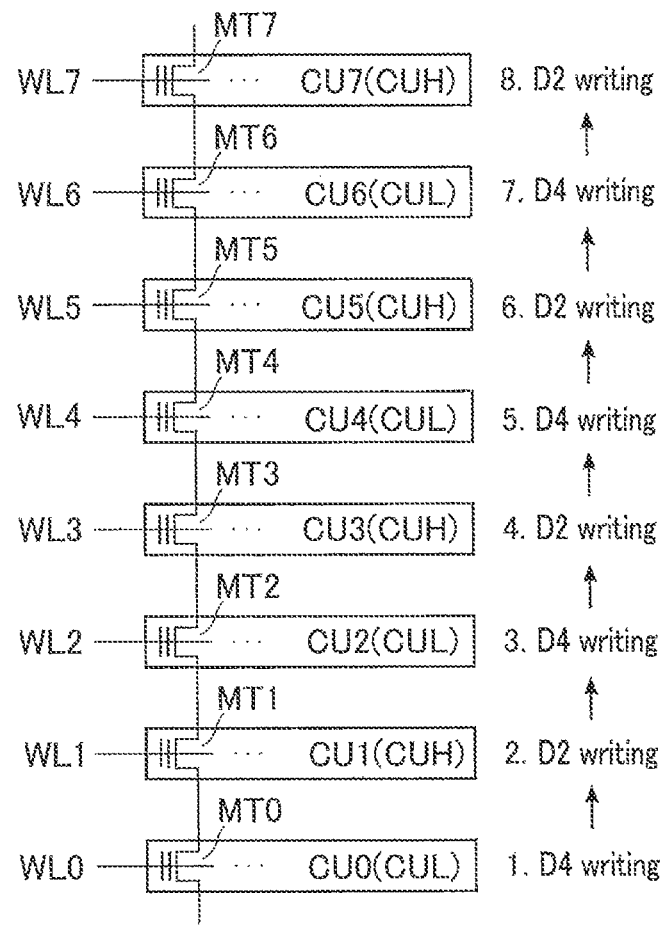
FIG. 32 illustrates a third example of the data writing in the memory system according to the fifth embodiment.
Figure 33:
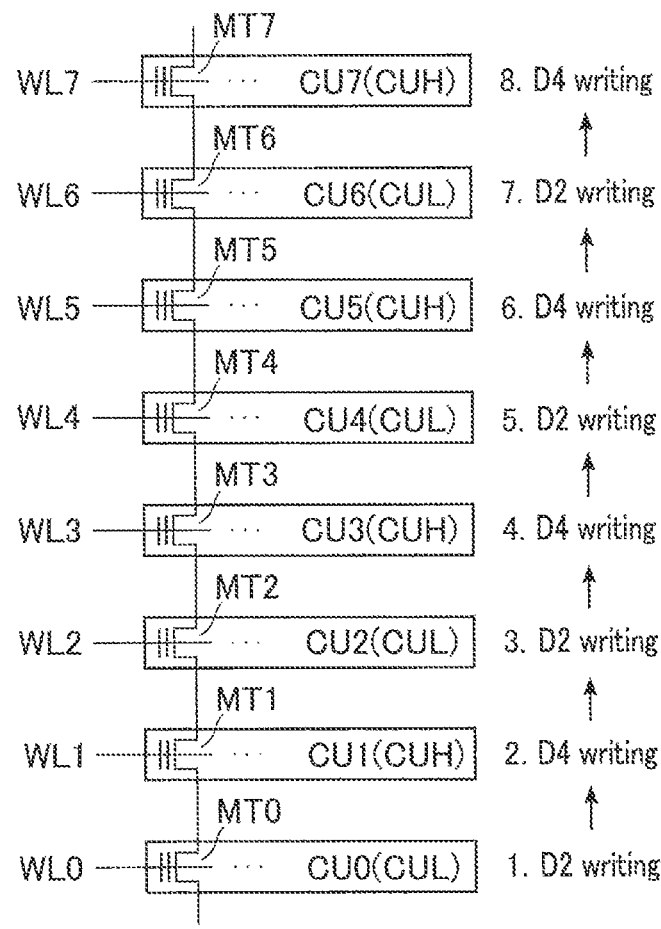
FIG. 33 illustrates the third example of the data writing in the memory system according to the fifth embodiment.

FIGS. 32 and 33 illustrate the third example of the data writing in the memory system 5e according to the fifth embodiment. FIG. 32 is based on an example in which multi-value page data is written to cell units CU having even addresses. FIG. 33 is based on an example in which multi-value page data is written to cell units CU having odd addresses.

As illustrated in FIG. 32, D4 writing is performed on the cell unit CU0, D2 writing is performed on the cell unit CU1, D4 writing is performed on the cell unit CU2, D2 writing is performed on the cell unit CU3, D4 writing is performed on the cell unit CU4, and D2 writing is performed on the cell unit CU5. Data is written to the cell unit CU6 and the cell units CU having larger addresses according to the same rule.

As illustrated in FIG. 33, D2 writing is performed on the cell unit CU0, D4 writing is performed on the cell unit CU1, D2 writing is performed on the cell unit CU2, D4 writing is performed on the cell unit CU3, D2 writing is performed on the cell unit CU4, and D4 writing is performed on the cell unit CU5. Data is written to the cell unit CU6 and the cell units CU having larger addresses according to the same rule.

5.1.4. Fourth Example

Figure 34:
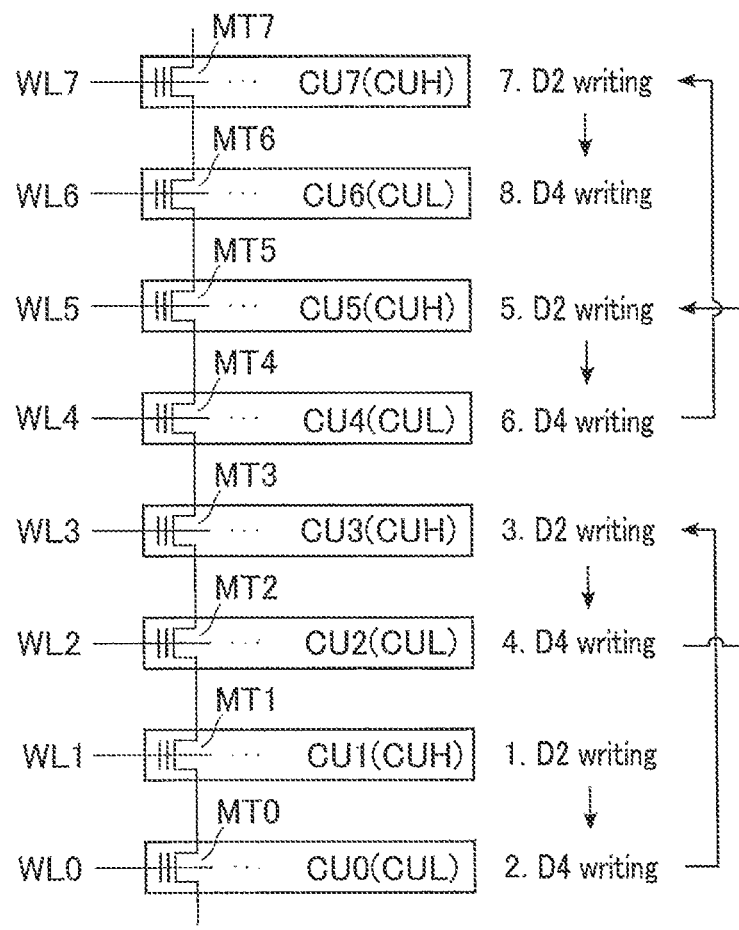
FIG. 34 illustrates a fourth example of the data writing in the memory system according to the fifth embodiment.
Figure 35:
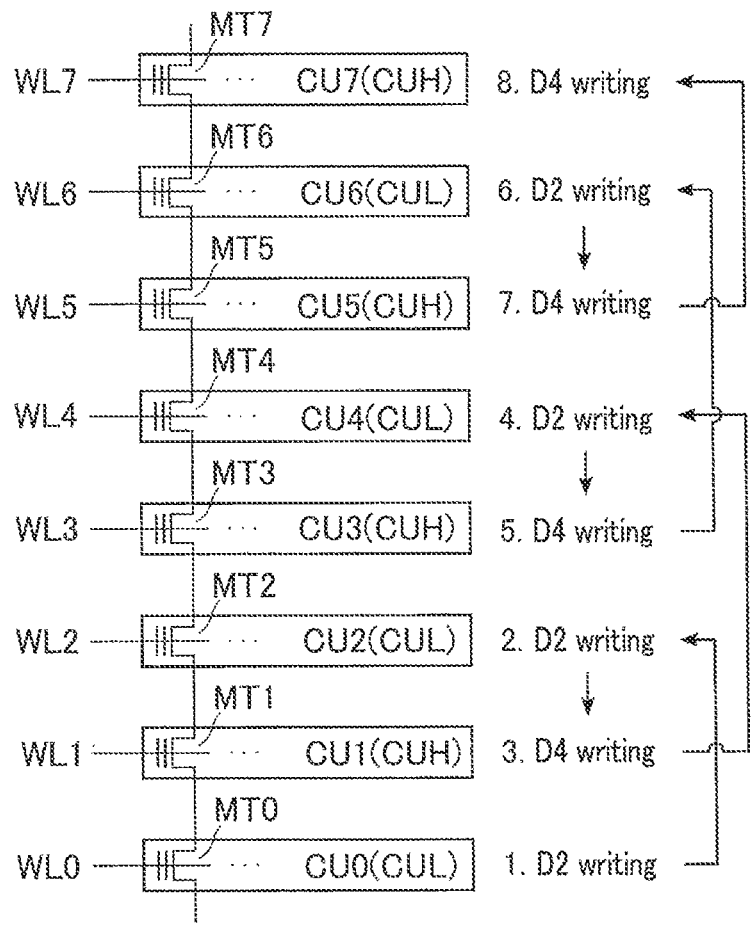
FIG. 35 illustrates the fourth example of the data writing in the memory system according to the fifth embodiment.

The fourth example is based on the second example and different from the second example in that D2 writing is used instead of D3 writing. FIGS. 34 and 35 illustrate the fourth example of the data writing in the memory system 5e according to the fifth embodiment. FIG. 34 is based on an example in which multi-value page data is written to cell units CU having even addresses. FIG. 35 is based on an example in which multi-value page data is written to cell units CU having odd addresses.

As illustrated in FIG. 34, D2 writing is performed on the cell unit CU1, D4 writing is performed on the cell unit CU0, D2 writing is performed on the cell unit CU3, D4 writing is performed on the cell unit CU2, D2 writing is performed on the cell unit CU5, and D4 writing is performed on the cell unit CU4. Data is written to the cell unit CU6 and the cell units CU having larger addresses according to the same rule.

As illustrated in FIG. 35, first, D2 writing is performed on the cell unit CU0. Next, D2 writing is performed on the cell unit CU2, D4 writing is performed on the cell unit CU1, D2 writing is performed on the cell unit CU4, D4 writing is performed on the cell unit CU3, D2 writing is performed on the cell unit CU6, and D4 writing is performed on the cell unit CU5. Data is written to the cell unit CU7 and the cell units CU having larger addresses according to the same rule.

5.1.5. Fifth Example

In the fifth example, certain second-type writing is used to write data to some cell units CU, and more specifically, the second-type writing is applied to D4 writing. Hereinafter, the second-type writing may be referred to as two-step writing.

Figure 36:
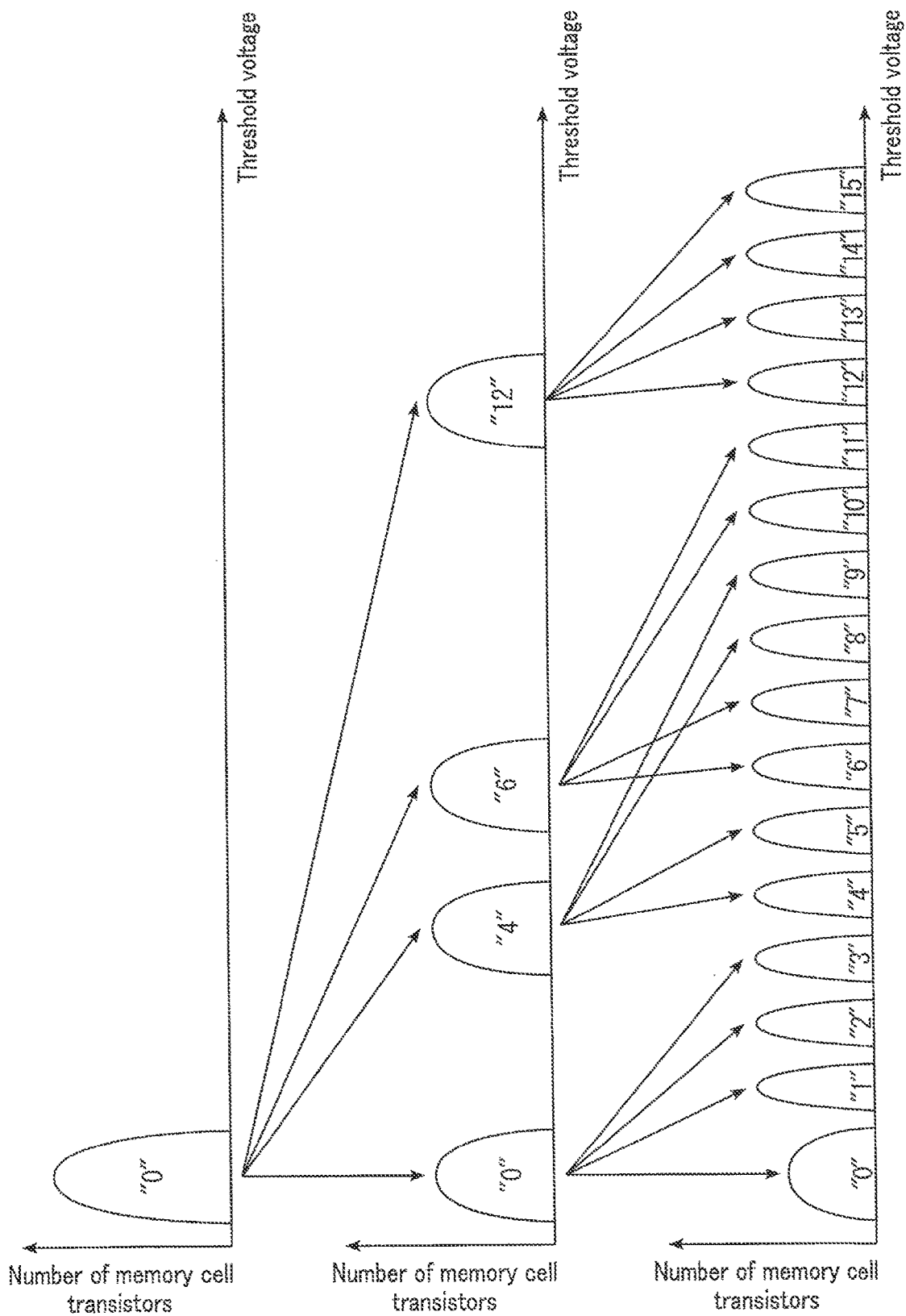
FIG. 36 illustrates changes in threshold voltages of memory cell transistors by two-step writing in the memory system according to the fifth embodiment.

FIG. 36 illustrates changes in threshold voltages of memory cell transistors by the two-step writing in the memory system 5e according to the fifth embodiment. In the two-step writing, each memory cell transistor MT of a cell unit CU is shifted from the "0" state (erased state) to a target state by data writing performed twice on the cell unit CU. Hereinafter, the first writing may be referred to as first-step writing, and the second writing may be referred to as second-step writing. Each of the first-step writing and the second-step writing includes the repetition of a plurality of program loops as in the one-step writing.

As illustrated in FIG. 36, the intermediate state before reaching the target states of the write target memory cell transistors MT is formed by the first-step writing. For example, in the case of D4 writing, each write target memory cell transistor MT is shifted to one of the four states by the first-step writing. That is, D2 writing is performed as the first-step writing. Next, by the second-step writing, each write target memory cell transistor MT is shifted from one of the four intermediate states to a target stage among the final 16 target states. That is, D4 writing is performed as the second-step writing.

The four intermediate states formed by D2 writing performed as the first-step writing may be different from the completed four states formed by D2 writing (for example, the writing described with reference to FIG. 14). Hereinafter, the four intermediate states may be referred to as an "A" state, a "B" state, a "C" state, and a "D" state. The position of the threshold voltage lobe of the "A" state is the same as the position of the threshold voltage lobe of the "0" state. The position of the threshold voltage lobe of the "B" state is higher than the position of the threshold voltage lobe of the "A" state, for example, the threshold voltage lobe of the "B" state is positioned in a region between the left end of the threshold voltage lobe of the "3" state and the right end of the threshold voltage lobe of the "4" state. The position of the threshold voltage lobe of the "C" state is higher than the position of the threshold voltage lobe of the "B" state, for example, the threshold voltage lobe of the "C" state is positioned in a region between the left end of the threshold voltage lobe of the "5" state and the right end of the threshold voltage lobe of the "6" state. The position of the threshold voltage lobe of the "D" state is higher than the position of the threshold voltage lobe of the "C" state, for example, the threshold voltage lobe of the "D" state is positioned in a region between the left end of the threshold voltage lobe of the "11" state and the right end of the threshold voltage lobe of the "12" state.

An intermediate state to which each write target memory cell transistor MT is shifted can be discretionally determined. An example is described below, and the following description is based on this example. The write target memory cell transistors MT whose target states are the "0", "1", "2", or "3" state are kept in the "A" state. The write target memory cell transistors MT whose target states are the "4", "5", "8", or "9" state are shifted to the "B" state. The write target memory cell transistors MT whose target states are the "6", "7", "10", or "11" state are shifted to the "C" state. The write target memory cell transistors MT whose target states are the "12", "13", "14", or "15" state are shifted to the "D" state.

In the second-step writing, each write target memory cell transistor MT in the "A" state is kept in or shifted to its target state among the "0", "1", "2", and "3" states. The write target memory cell transistor MT in the "B" state is shifted to its target state among the "4", "5", "8", and "9" states. The write target memory cell transistor MT in the "C" state is shifted to its target state among the "6", "7", "10", and "11" states. The write target memory cell transistor MT in the "D" state is shifted to its target state among the "12", "13", "14", and "15" states.

In the fifth example, in each pair of cell units CUJ and CU(J+1), the first-step writing (that is, D2 writing) is performed on a certain first cell unit CU, the one-step writing is performed on the remaining second cell unit CU, and the second-step writing is performed on the first cell unit CU. Further, pairs of cell units CU are selected in ascending order of J.

Figure 37:
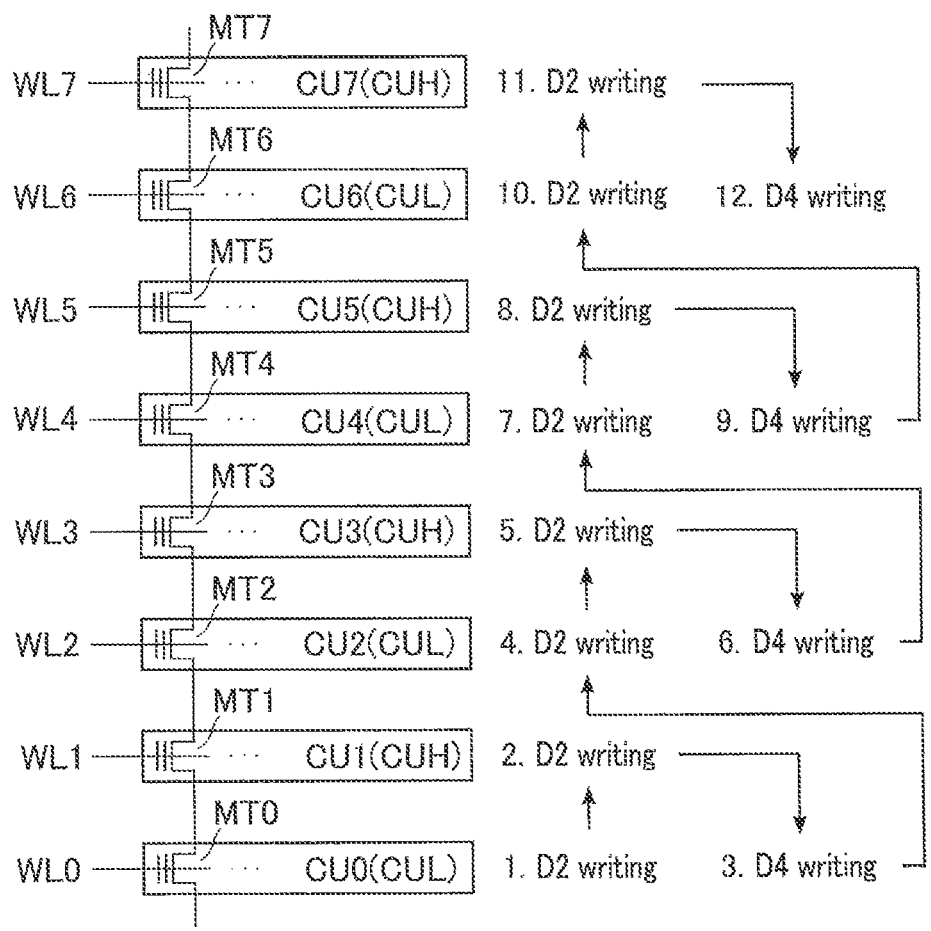
FIG. 37 illustrates a fifth example of the data writing in the memory system according to the fifth embodiment.
Figure 38:
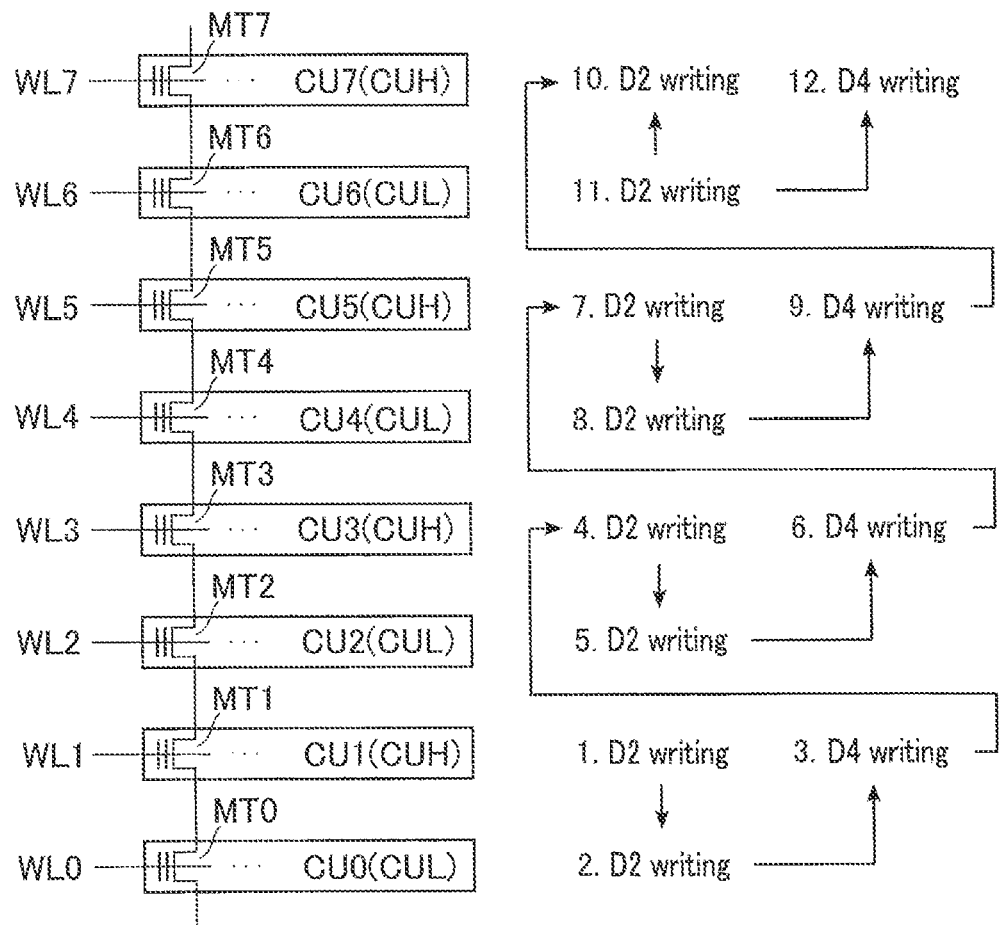
FIG. 38 illustrates the fifth example of the data writing in the memory system according to the fifth embodiment.

FIGS. 37 and 38 illustrate the fifth example of the data writing in the memory system 5e according to the fifth embodiment. FIG. 37 is based on an example in which multi-value page data is written to cell units CU having even addresses. FIG. 38 is based on an example in which multi-value page data is written to cell units CU having odd addresses. Hereinafter, DH writing (H is a positive integer) as a part of the first-step writing may be referred to as "first step DH writing" in order to distinguish from normal DR writing, which is not a part of the two-step writing and is completed by DR writing. Similarly, DH writing as a part of the second-step writing may be referred to as "second step DH writing".

As illustrated in FIG. 37, the first step D2 writing for D4 writing is performed on the cell unit CU0, D2 writing is performed on the cell unit CU1, and the second step D4 writing is performed on the cell unit CU0. D2 writing performed in one step in the fifth example may cause the same transition of the threshold voltage as the first-step writing for D4 writing. Next, the first step D2 writing for D4 writing is performed on the cell unit CU2, D2 writing is performed on the cell unit CU3, and the second step D4 writing is performed on the cell unit CU2. The first step D2 writing for D4 writing is performed on the cell unit CU4, D2 writing is performed on the cell unit CU5, and the second step D4 writing is performed on the cell unit CU4. Data is written to the cell unit CU6 and the cell units CU having larger addresses according to the same rule.

As illustrated in FIG. 38, the first step D2 writing for D4 writing is performed on the cell unit CU1, D2 writing is performed on the cell unit CU0, and the second step D4 writing is performed on the cell unit CU1. The first step D2 writing for D4 writing is performed on the cell unit CU3, D2 writing is performed on the cell unit CU2, and the second step D4 writing is performed on the cell unit CU3. The first step D2 writing for D4 writing is performed on the cell unit CU5, D2 writing is performed on the cell unit CU4, and the second step D4 writing is performed on the cell unit CU5. Data is written to the cell unit CU6 and the cell units CU having larger addresses according to the same rule.

5.1.6. Sixth Example

In the sixth example, the two-step writing is used to write data to some cell units CU, and more specifically, the two-step writing is applied to D4 writing.

Figure 39:
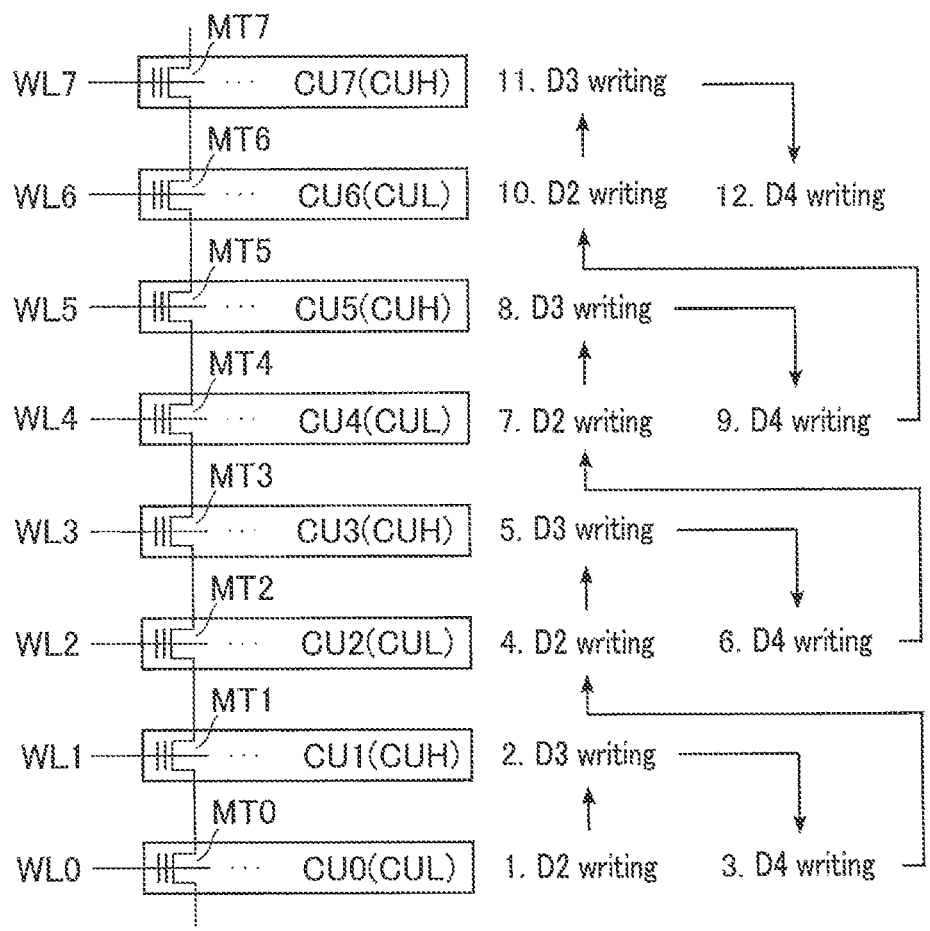
FIG. 39 illustrates a sixth example of the data writing in the memory system according to the fifth embodiment.
Figure 40:
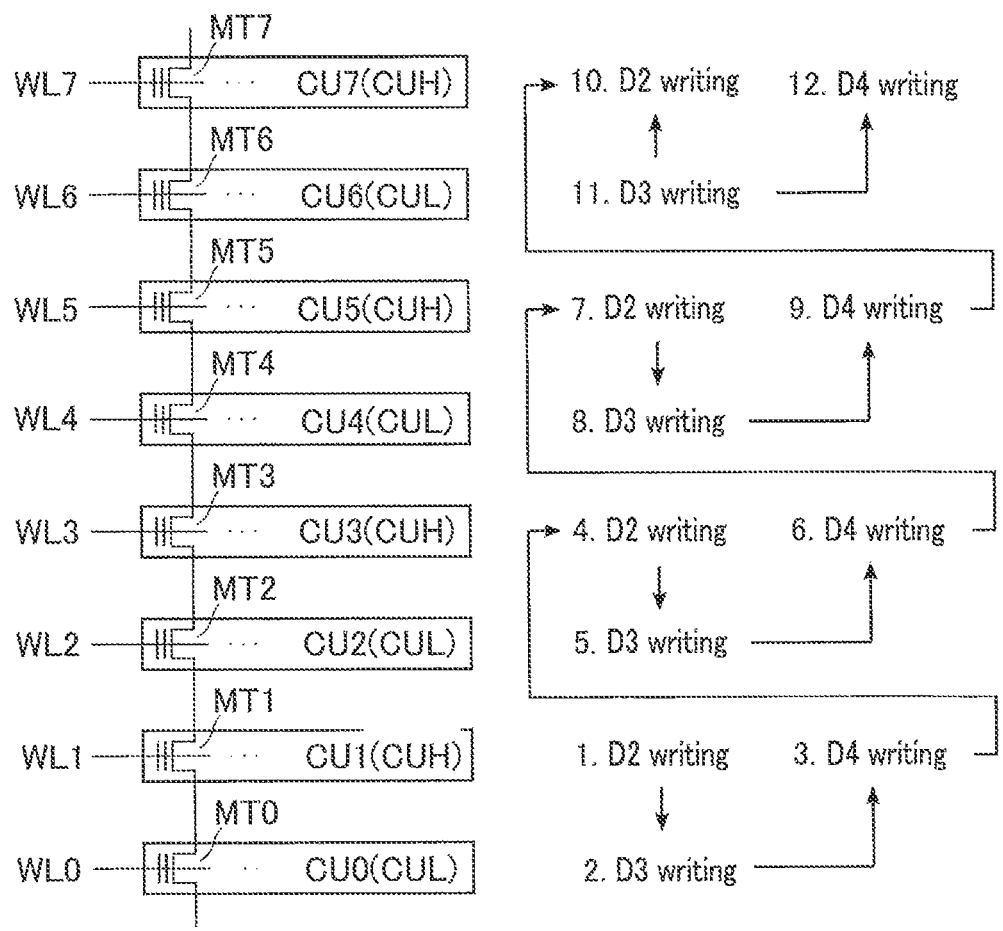
FIG. 40 illustrates the sixth example of the data writing in the memory system according to the fifth embodiment.

FIGS. 39 and 40 illustrate the sixth example of the data writing in the memory system 5e according to the fifth embodiment. FIG. 39 is based on an example in which multi-value page data is written to cell units CU having even addresses. FIG. 40 is based on an example in which multi-value page data is written to cell units CU having odd addresses.

As illustrated in FIG. 39, the first step D2 writing for D4 writing is performed on the cell unit CU0, D3 writing is performed on the cell unit CU1, and the second step D4 writing is performed on the cell unit CU0. The first step D2 writing for D4 writing is performed on the cell unit CU2, D3 writing is performed on the cell unit CU3, and the second step D4 writing is performed on the cell unit CU2. The first step D2 writing for D4 writing is performed on the cell unit CU4, D3 writing is performed on the cell unit CU5, and the second step D4 writing is performed on the cell unit CU4. Data is written to the cell unit CU6 and the cell units CU having larger addresses according to the same rule.

As illustrated in FIG. 40, the first step D4 writing for D4 writing is performed on the cell unit CU1, D3 writing is performed on the cell unit CU0, and the second step D4 writing is performed on the cell unit CU1. The first step D4 writing is performed on the cell unit CU3, D3 writing is performed on the cell unit CU2, and the second step D4 writing is performed on the cell unit CU3. The first step D2 writing for D4 writing is performed on the cell unit CU5, D3 writing is performed on the cell unit CU4, and the second step D4 writing is performed on the cell unit CU5. Data is written to the cell unit CU6 and the cell units CU having larger addresses according to the same rule.

5.2. Advantages

According to the fifth embodiment, the same advantages as those obtained by the embodiment to which the fifth embodiment is added can be obtained. According to the fifth embodiment, the memory system 5e that can retain data with high accuracy can be provided as described below.

The threshold voltages of the two memory cell transistors MT coupled in series can affect each other. That is, when a first memory cell transistor MT is shifted to a target state and then a second memory cell transistor MT is shifted to a target state, an increase in the threshold voltage based en the transition of the state of the second memory cell transistor MT can change the threshold voltage of the first memory cell transistor MT after the transition of the state is completed. This effect is noticeable when the target states of the two memory cell transistors MT are greatly distanced. This is particularly noticeable when the target state of the first memory cell transistor MT is the lowest state (for example, the "0" state) and the target state of the second memory cell transistor MT is the highest state (for example, the "15" state). This is because an increase in the threshold voltage of the second memory cell transistor MT before and after data is written to the second memory cell transistor MT is very large. Such an effect is caused by the occurrence of the writing of data (change in state) to the adjacent second memory cell transistor MT after the writing of data to the first memory cell transistor MT (after the determination of the state), in other words, the state of the second memory cell transistor MT is not finalized at the time of the writing to the first memory cell transistor MT.

According to the second example of the fifth embodiment, in each pair of the cell unit CUJ and the CU(J+1), data of a smaller-value page is written in the cell unit CU(J+1), and then data of a larger number of pages is written in the cell unit CUJ. Therefore, writing by the cell unit CUJ is performed after the state of the cell unit CU(J+1) is determined. Therefore, it is possible to prevent the state of the cell unit CUJ after data writing from being affected by a change in the state of the cell unit CU(J+1). This improves the data retention characteristic of the cell unit CU.

According to the third example of the fifth embodiment, in each pair of cell units CUJ and CU(J+1), data of a certain number of pages (for example, four pages) is written to a first cell unit CU, and data of a smaller number of pages (for example, two pages) than the number of pages of the first cell unit CU is written to a second cell unit CU. As described with reference to FIGS. 13 and 14, as the number of pages written to the first cell unit CU and thus the number of required threshold voltage lobes are smaller, the highest position among positions at which the threshold voltage lobes are distributed can be kept lower. Therefore, the difference between the highest state (eventually, the maximum threshold voltage) in the first cell unit CU and the lowest state (eventually, the minimum threshold voltage) in the second cell unit CU can be reduced by D2 writing to the second cell unit CU. This improves the data retention characteristic of the cell unit CU.

The fourth example of the fifth embodiment corresponds to a combination of the second example and the third example. Therefore, the fourth example provides the respective advantages of the second example and the third example.

According to the fifth example of the fifth embodiment, in each pair of cell units CUJ and CU(J+1), the first-step writing is performed on a first cell unit CU, the one-step writing is performed on the second cell unit CU, and the second-step writing is performed on the first cell unit CU. In the first-step writing, although how the target cell unit CU is not determined in the final form, it is set to an intermediate form that is closer to the final form than the unwritten state is. Therefore, writing to the second cell unit CU is performed in consideration of the intermediate state of the first cell unit CU while the first cell unit CU is in the intermediate state. Therefore, even when the second-step writing to the first cell unit CU is performed, the amount of an increase in the threshold voltage of the memory cell transistor MT of the first cell unit CU is smaller than that when the one-step writing is performed on the first cell unit CU. Therefore, it is possible to suppress an effect on the second cell unit CU due to the second-step writing to the first cell unit CU. This improves the data retention characteristic of the cell unit CU.

According to the sixth example of the fifth embodiment, in each pair of cell units CUJ and CU(J+1), the first-step writing is performed on a first cell unit CU, the one-step writing is performed on a second cell unit CU, and the second-step writing is performed on the first cell unit CU. Therefore, the same advantages as those of the fifth example can be obtained. Furthermore, according to the sixth example, a larger amount of data than in the fifth example can be stored by using D3 writing.

5. Sixth Embodiment

The sixth embodiment is implemented in combination with the first to fifth embodiments and relates to program verify.

A memory device 1*f* according to the sixth embodiment, particularly, a sequencer 13*f* is configured to perform an operation described below.

5.1. Operation

6.1.1. First Example

The first example is applied to an example in which data is written in ascending order of addresses of the cell units CU, such as the first example of the fifth embodiment.

Figure 41:
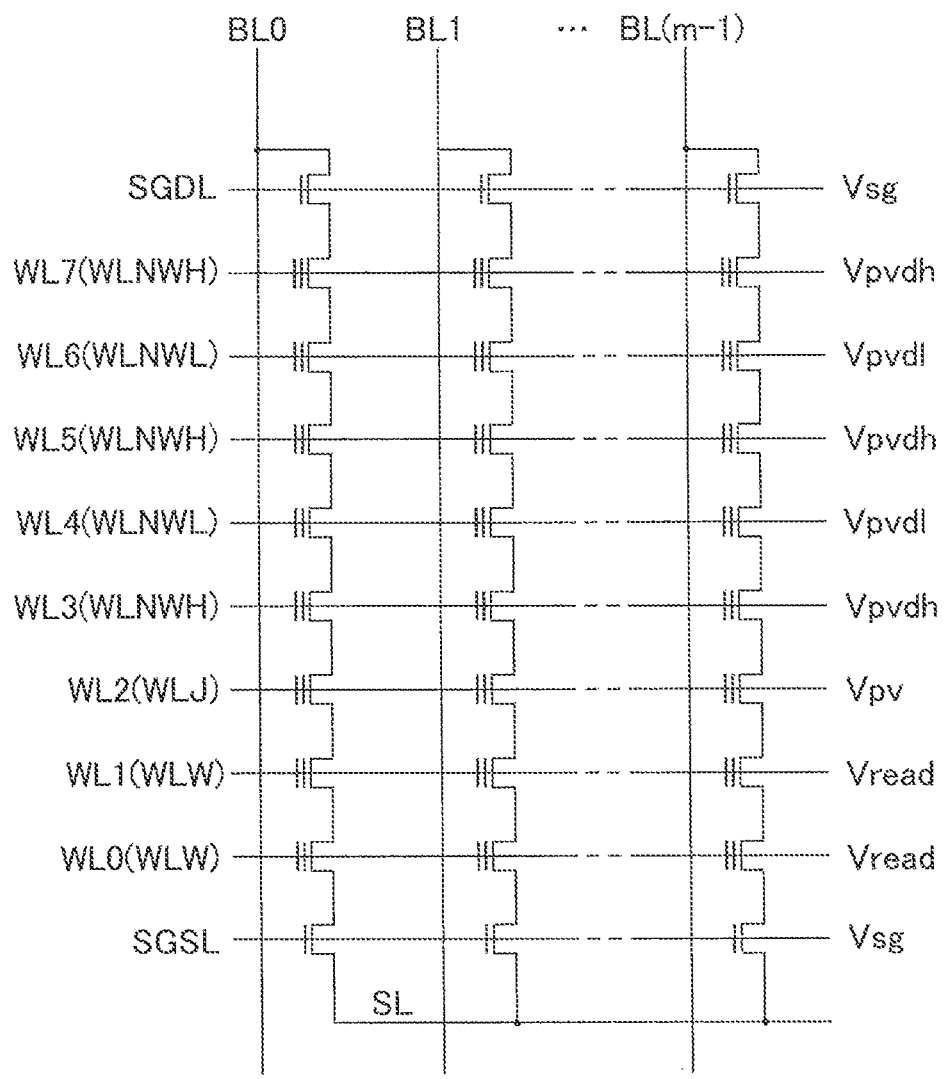
FIG. 41 illustrates an example of potentials applied to word lines during program verify in a memory device according to a sixth embodiment.

FIG. 41 illustrates an example of potentials applied to word lines during program verify in the memory device 1*f* according to the sixth embodiment. FIG. 41 is based on an example in which multi-value page data is written to cell units CU having even addresses. Also in an example in which multi-value page data is written to cell units CU having odd addresses, the potentials applied to the word lines WL are the same as the potentials described below with reference to FIG. 41.

As illustrated in FIG. 41, the potential Vsg is continuously applied to the select gate lines SGDL and SGSL. A program verify potential Vpv is applied to a word line (selected word line) WLJ coupled to the write target cell unit CU. The program verify potential Vpv has a variable magnitude depending on a state to be determined whether the program has been completed by the application of the program verify potential Vpv. That is, in the program verify that verifies whether the memory cell transistor MT as a program target has been shifted to, for example, the "3" state, the program-verify potential Vpv of a magnitude for the "3" state is used. The magnitude of the program verify potential Vpv is, for example, slightly smaller than the minimum threshold voltage that the memory cell transistor MT in the state targeted for the program verify desirably has, and slightly smaller than the read voltage Vcgr for this state. When it is determined by the program verify that the certain program target memory cell transistor MT has a threshold voltage higher than the program verify potential Vpv for a certain target "W" state (W is an integer of 0 or more), it is determined that the transition of the program target memory cell transistor MT to the "W" state has been completed.

During the program verify, a potential for turning on one or more memory cell transistors MT coupled to one or more non-selected word lines WL is applied to the one or more word lines WL (hereinafter, it may be referred to as non-selected word lines WL) other than the selected word line WLJ. This potential has a different magnitude based on the address of the applied non-selected word lines WL.

In the first example, a cell unit CU coupled to a non-selected word line WL that is among non-selected word lines WL and has an address smaller than the address of the selected word line WLJ, that is, the non-selected word line WL that is closer to the select gate transistor ST than the selected word line WLJ is has a ready written data. Hereinafter, the non-selected word line WL coupled to the cell unit CU to which data s already been written may be referred to as a written non-selected word line WLW.

On the other hand, a cell unit CU coupled to a non-selected word line WL that is among the non-selected word lines WL and has an address larger than the address of the selected word line WLJ, that is, the non-selected word line WL that is closer to the select gate transistor DT than the selected word line WLJ is has no written data. Hereinafter, the non-selected word line WL coupled to the cell unit CU to which data has not yet been written may be referred to as an unwritten non-selected word line WLNW.

Furthermore, among the unwritten non-selected word lines WLNW, a word line to which the low erase potential Vel is applied during erasing may be referred to as a low erase potential unwritten non-selected word line WLNWL. Among the unwritten non-selected word lines WLNW, a word line to which the high erase potential Veh is applied during erasing may be referred to as a high erase potential unwritten non-selected word line WLNWH.

During the program verify, the read pass potential Vread is applied to the written non-selected word line WLW. The read pass potential Vread is higher than the threshold voltages of all the memory cell transistors MT in the memory device 1*f*. Therefore, the application of the read pass potential Vread to the word line WL turns on the memory cell transistor MT coupled to the word line WL regardless of the state.

During the program verify, the low erase potential unwritten non-selected word line WLNWL receives the low verify read pass potential Vpvdl. The low verify read pass potential Vpvdl is lower than the read pass potential Vread, and for example, has a magnitude slightly larger than half of the magnitude of the read pass potential Vread.

During the program verify, the high erase potential unwritten non-selected word line WLNWH receives the high verify read pass potential Vpvdh. The high verify read pass potential Vpvdh is higher than the low verify read pass potential vpvdl and lower than the read pass potential Vread. The difference between the high verify read pass potential Vpvdh and the low verify read pass potential Vpvdl can be based on the relative relationship between the position of the threshold voltage lobe of the "0" state of the memory cell transistor MT to which the high erase potential Veh is applied and the position of the threshold voltage lobe of the "0" state of the memory cell transistor MT to which the low erase potential Vel is applied. For example, the difference between the high verify read pass potential Vpvdh and the low verify read pass potential Vpvdl can be the same as the difference between the threshold voltage at the maximum position of the threshold voltage lobe of the "0" state of the memory cell transistor MT to which the high erase potential Veh is applied and the threshold voltage at the maximum position of the threshold voltage lobe of the "0" state of the memory cell transistor MT to which the low erase potential Vel is applied. That is, the high verify read pass potential Vpvdh is as high as a value by which the position of the threshold voltage lobe of the "0" state of the memory cell transistor MT to which the high erase potential Veh is applied is higher than the position of the threshold voltage lobe of the "0" state of the memory cell transistor MT to which the low erase potential Vel is applied.

6.1.2. Second Example

The second example is applied to an example in which, of each pair of cell units CUJ and CU(J+1), small-value page data is written to the cell unit CU(J+1) and then multi-value page data is written to the cell unit CUJ, such as the second example of the fifth embodiment.

Figure 42:
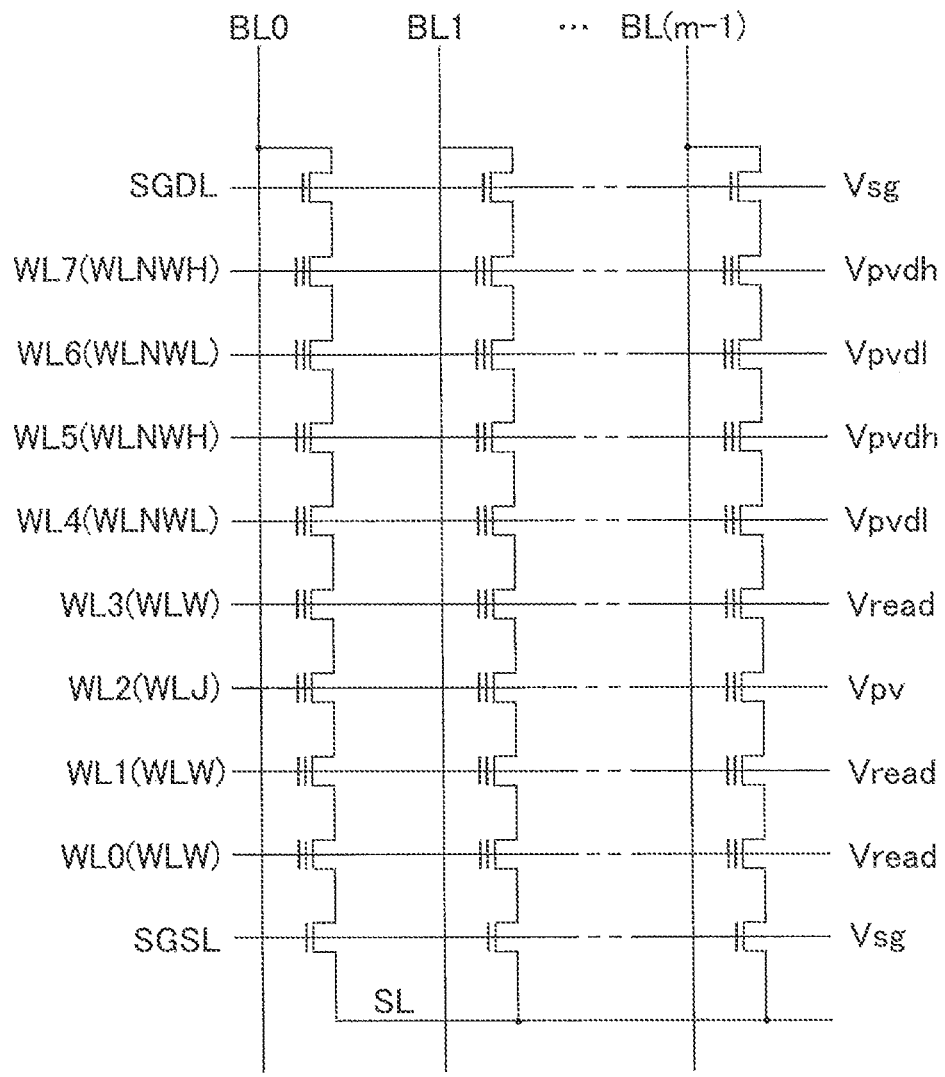
FIG. 42 illustrates another example of the potentials applied to the word lines during the program verify in the memory device according to the sixth embodiment.

FIG. 42 illustrates an example of potentials applied to the word lines during program verify in the memory device if according to the sixth embodiment. FIG. 42 is based on an example in which multi-value page data is written to cell units CU having even addresses. Also in an example in which multi-value page data is written to cell units CU having odd addresses, the potentials applied to the word lines WL are the same as potentials described below with reference to FIG. 42.

As illustrated in FIG. 42, in the second example, a cell unit CU coupled to a non-selected word line WL that is among non-selected word lines WL and has an address larger than the address of the selected word line WLJ by 1, that is, the cell unit CU coupled to the non-selected word line WL adjacent to the selected word line WLJ on the select gate transistor DT side has already written data. Therefore, the non-selected word line WL adjacent to the selected word line WLJ on the select gate transistor DT side is a written non-selected word line WLW. During the program verify, the read pass potential Vread is applied to the written non-selected word line WLW. The description of the first example is applied to other features.

6.2. Advantages

According to the sixth embodiment, a memory having a narrow threshold voltage lobe for each state can be provided as described below.

The program verify is similar to the reading, and the memory cell transistors MT of the unwritten non-selected cell unit CU need to be turned on during the program verify as in data reading. Therefore, it is conceivable to apply the read pass potential Vread to the unwritten non-selected word line WLNW as in the reading. However, how the unwritten cell unit CU is differs from how the written cell unit CU is. That is, all the memory cell transistors MT of the unwritten cell units CU are in the "0" state and have a low threshold voltage. Therefore, if the read pass potential Vread is applied to the unwritten non-selected word line WLNW, a larger current (cell current) may flow than in the case of data reading from the memory cell transistor MT of the unwritten cell unit CU. It is desirable that the cell current flowing through the memory cell transistor MT in a certain state during the program verify be the same as the cell current flowing through the memory cell transistor MT during the data reading. However, since how the cell unit CU having an address larger than the address of the write target cell unit CUJ is differs between the program verify (unwritten) and the data reading (written), the cell current may also be different between the program verify and the data reading. This may cause an erroneous program.

According to the sixth embodiment, the unwritten non-selected word line WLNW receives the high verify read pass potential Vpvdh lower than the read pass potential Vread or receives the low verify read pass potential Vpvdl. Therefore, the difference between the cell current during the program verify and the cell current during the reading is smaller than the difference when the read pass potential Vread is applied to the unwritten non-selected word line WLNW during the program verify. Therefore, it is possible to suppress erroneous programming as compared with the case where the read pass potential Vread is applied to the unwritten non-selected word line WLNW during the program verify.

In the sixth embodiment, during the program verify, the low verify read pass potential Vpvdl is applied to the low erased state cell unit CUL, and the high verify read pass potential Vpvdh is applied to the high erased state cell unit CUH. The high verify read pass potential Vpvdh is higher than the low verify read pass potential Vpvdl. Therefore, the difference between the cell current during the program verify and the cell current during the data reading is smaller than the difference when the read pass potential Vread is applied to the unwritten non-selected word line WLNW during the program verify. Therefore, it is possible to suppress erroneous programming as compared with the case where the read pass potential Vread is applied to the unwritten non-selected word line WLNW during the program verify.

7. Modification

The first to sixth embodiments are described based on the case where four bits are stored per memory cell transistor MT. That is, the embodiments are described based on examples of a combination of storing four bits and storing three bits, which is one bit less than four bits, and a combination of storing four bits and storing two bits, which is two hits less than four bits. However, the first to sixth embodiments are not limited to the examples and may be based on the case of storing five bits and bits more than five bits.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first conductor;
a first semiconductor extending along a first axis and in contact with the first conductor at an end;
a first layer that is spaced from the first semiconductor, extends along the first axis, and is made of an insulator;
a second conductor facing the first conductor and sandwiching the first layer together with the first semiconductor;
a third conductor sandwiching the first layer together with the first semiconductor and positioned farther from the first conductor than the second conductor is;
a fourth conductor that sandwiches the first layer together with the first semiconductor, is positioned farther from the first conductor than the third conductor is, and is aligned with the third conductor;
a first circuit configured to apply a first potential to the first conductor, apply a second potential lower than the first potential to the third conductor in parallel with the application of the first potential, and apply a third potential higher than the second potential and lower than the first potential to the fourth conductor in parallel with the application of the first potential;
a sixth conductor sandwiching the first layer together with the first semiconductor and positioned between the second conductor and the third conductor;
a seventh conductor sandwiching the first layer together with the first semiconductor and positioned between the sixth conductor and the third conductor;
an eighth conductor sandwiching the first layer together with the first semiconductor and positioned farther from the first conductor than the fourth conductor is; and
a ninth conductor positioned farther from the first conductor than the seventh conductor is, and aligned with the seventh conductor,
wherein:
the first circuit is further configured to:
apply a seventh potential to the second conductor and the eighth conductor,
apply an eighth potential to the seventh conductor in parallel with the application of the seventh potential,
apply a ninth potential higher than the eighth potential to the sixth conductor in parallel with the application of the seventh potential,
apply a tenth potential lower than the ninth potential to the third conductor in parallel with the application of the seventh potential,
apply an eleventh potential higher than the tenth potential and lower than the ninth potential to the fourth conductor in parallel with the application of the seventh potential, and
apply the ninth potential to the ninth conductor in parallel with the application of the seventh potential.

2. The memory device according to claim 1, further comprising a fifth conductor sandwiching the first layer together with the first semiconductor and positioned farther from first conductor than the fourth conductor is,
wherein the first circuit is further configured to apply a fourth potential to the second conductor and the fifth conductor, apply a fifth potential to the third conductor in parallel with the application of the fourth potential, and apply a sixth potential to the fourth conductor in parallel with the application of the fourth potential.

3. The memory device according to claim 1, wherein:
the first circuit is configured to operate in a dynamically selected one of a first mode and a second mode,
in the first mode, the third conductor is positioned at an even-numbered position from the first conductor among a plurality of conductors arranged in line from the first conductor, and
in the second mode, the third conductor is positioned at an odd-numbered position from the first conductor among the plurality of conductors.

4. The memory device according to claim 1, wherein:
the first layer includes a first portion facing the third conductor,
the first semiconductor includes a second portion facing the first portion,
a part of the third conductor, the first portion, and the second portion constitute a part of a first memory cell transistor,
the memory device further comprises a second semiconductor facing the third conductor,
the second semiconductor includes a third portion facing the third conductor,
a part of the third conductor and the third portion constitute a part of a first transistor, and
the first circuit is further configured to read, upon receiving a data read instruction designating the third conductor, data of first bits from the first memory cell transistor when the first transistor stores 1-bit data of a first value, and data of second bits less than the first bits from the first memory cell transistor when the first transistor stores the 1-bit data of a second value.

5. A memory system comprising:
a memory controller; and
a memory device comprising:
a first conductor;
a first semiconductor extending along a first axis and in contact with the first conductor at an end;
a first layer that is spaced from the first semiconductor, extends along the first axis, and is made of an insulator;
a second conductor facing the first conductor and sandwiching the first layer together with the first semiconductor;
a third conductor sandwiching the first layer together with the first semiconductor and positioned farther from the first conductor than the second conductor is;
a fourth conductor that sandwiches the first layer together with the first semiconductor, is positioned farther from the first conductor than the third conductor is, and is aligned with the third conductor; and
a first circuit configured to apply a first potential to the first conductor, apply a second potential lower than the first potential to the third conductor in parallel with the application of the first potential, and apply a third potential higher than the second potential and lower than the first potential to the fourth conductor in parallel with the application of the first potential, wherein:
the first layer includes a fourth portion and a fifth portion, the fourth portion facing the third conductor, and the fifth portion facing the fourth conductor,
the first semiconductor includes a sixth portion and a seventh portion, the sixth portion facing the fourth portion, and the seventh portion facing the fifth portion,
a part of the third conductor, the fourth portion, and the sixth portion constitute a part of a second memory cell transistor,
a part of the fourth conductor, the fifth portion, and the seventh portion constitute a part of a third memory cell transistor, and
the memory controller is configured to write data of a first number of bits to the second memory cell transistor, and write data of a second number of bits smaller than the first number to the third memory cell transistor.

6. The memory system according to claim 5, wherein:
the memory device further includes a third semiconductor facing the third conductor and the fourth conductor,
the third semiconductor includes an eighth portion and a ninth portion, the eighth portion facing the third conductor, and the ninth portion facing the fourth conductor,
a part of the third conductor and the eighth portion constitute a part of a second transistor,
a part of the fourth conductor and the sixth portion constitute a part of a third transistor, and
the memory controller is further configured to write 1-bit data of a first value to the second transistor, and write 1-bit data of a second value to the third transistor.

7. The memory system according to claim 5, wherein the memory controller is further configured to:
write data of the second number of bits to the second memory cell transistor,
write data of the second number of bits to the third memory cell transistor after the writing to the second memory cell transistor, and
write data of the first number of bits to the second memory cell transistor after the writing to the third memory cell transistor.

8. The memory system according to claim 5, wherein the memory controller is further configured to:
write data of the second number of bits to the third memory cell transistor,
write data of the second number of bits to the second memory cell transistor after the writing to the third memory cell transistor, and
write data of the first number of bits to the third memory well transistor after the writing to the second memory cell transistor.

9. The memory system according to claim 5, wherein the memory controller is further configured to:
write data of the second number of bits to the second memory cell transistor,
write data of a third number of bits larger than the second number and smaller than the first number to the third memory cell transistor after the writing to the second memory cell transistor, and
write data of the first number of bits to the second memory cell transistor after the writing to the third memory cell transistor.

10. The memory system according to claim 5, wherein the memory controller is further configured to:
write data of the second number of bits to the third memory cell transistor,
write data of a fourth number of bits larger than the second number and smaller than the first number to the second memory cell transistor after the writing to the third memory cell transistor, and
write data of the first number of bits to the third memory cell transistor after the writing to the second memory cell transistor.

11. A memory device comprising:
a first conductor;
a first semiconductor extending along a first axis and in contact with the first conductor at an end;
a first layer that is spaced from the first semiconductor, extends along the first axis, and is made of an insulator;
a second conductor facing the first conductor and sandwiching the first layer together with the first semiconductor;
a third conductor sandwiching the first layer together with the first semiconductor and positioned farther from the first conductor than the second conductor is;
a fourth conductor that sandwiches the first layer together with the first semiconductor, is positioned farther from the first conductor than the third conductor is, and is aligned with the third conductor;
a first circuit configured to apply a first potential to the first conductor, apply a second potential lower than the first potential to the third conductor in parallel with the application of the first potential, and apply a third potential higher than the second potential and lower than the first potential to the fourth conductor in parallel with the application of the first potential;
a plurality of tenth conductors including the third conductor; and
a plurality of eleventh conductors including the fourth conductor,
wherein:
the tenth conductors and the eleventh conductors are alternately arranged one by one, and
the first circuit is configured to apply the second potential to the tenth conductors in parallel with the application of the first potential, and apply the third potential to the eleventh conductors in parallel with the application of the first potential.

12. The memory device according to claim 11, further comprising a twelfth conductor sandwiching the first layer together with the first semiconductor and positioned farther from the first conductor than the tenth conductors and the eleventh conductors are,
wherein the first circuit is further configured to:
apply a twelfth potential to the second conductor and the twelfth conductor,
apply a thirteenth potential to the tenth conductors in parallel with the application of the twelfth potential, and
apply a fourteenth potential to the eleventh conductors in parallel with the application of the twelfth potential.

13. The memory device according to claim 11, wherein:
the first circuit is configured to operate in a dynamically selected one of a first mode and a second mode,
in the first mode, the tenth conductors are positioned at even-numbered positions from the first conductor among a plurality of conductors arranged in line from the first conductor and the eleventh conductors are positioned at odd-numbered positions from the first conductor among the plurality of conductors, and
in the second mode, the tenth conductors are positioned at odd-numbered positions from the first conductor among the plurality of conductors and the eleventh conductors are positioned at the even-numbered positions from the first conductor among the plurality of conductors.

14. The memory device according to claim 12, further comprising a thirteenth conductor sandwiching the first layer together with the first semiconductor and positioned farther from the first conductor than the tenth conductors and the eleventh conductors are,
wherein the first circuit is further configured to:
apply a fifteenth potential to the second conductor and the thirteenth conductor,
apply a sixteenth potential to a fourteenth conductor that is one of the tenth conductors and the eleventh conductors in parallel with the application of the fifteenth potential,
apply a seventeenth potential higher than the sixteenth potential to one or more of the tenth conductors that are positioned closer to the first conductor than the fourteenth conductor is and one or more of eleventh conductors that are positioned closer to the first conductor than the fourteenth conductor is in parallel with the application of the fifteenth potential,
apply an eighteenth potential lower than the seventeenth potential to one or more of tenth conductors that are positioned farther from the first conductor than the fourteenth conductor is in parallel with the application of the fifteenth potential, and
apply a nineteenth potential higher than the eighteenth potential and lower than the seventeenth potential to one or more of eleventh conductors that are positioned farther from the first conductor than the fourteenth conductor is in parallel with the application of the fifteenth potential.

15. The memory device according to claim 14, wherein:
the first circuit is further configured to apply the seventeenth potential to a fifteenth conductor that is one of the tenth conductors and the eleventh conductors in parallel with the application of the fifteenth potential, and
the fifteenth conductor is aligned with the fourteenth conductor and farther from the first conductor than the fourteenth conductor is.

16. A memory system comprising:
the memory device according to claim 12; and
a memory controller,
wherein:
the tenth conductors include a sixteenth conductor and a seventeenth conductor,
the eleventh conductors include an eighteenth conductor and a nineteenth conductor,
the first layer includes a ninth portion facing the sixteenth conductor, a tenth portion facing the seventeenth conductor, an eleventh portion facing the eighteenth conductor, and a twelfth portion facing the nineteenth conductor,
the first semiconductor includes a thirteenth portion facing the ninth portion, a fourteenth portion facing the tenth portion, a fifteenth portion facing the eleventh portion, and a sixteenth portion facing the twelfth portion,
a part of the sixteenth conductor, the ninth portion, and the thirteenth portion constitute a part of a fourth memory cell transistor,
a part of the eighteenth conductor, the eleventh portion, and the fifteenth portion constitute a part of a fifth memory cell transistor,
a part of the seventeenth conductor, the tenth portion, and the fourteenth portion constitute a part of a sixth memory cell transistor,
a part of the nineteenth conductor, the twelfth portion, and the sixteenth portion constitute a part of a seventh memory cell transistor,
the fourth memory cell transistor to the seventh memory cell transistor are arranged in the order of the fourth memory cell transistor, the fifth memory cell transistor, the sixth memory cell transistor, and the seventh memory cell transistor, and
the memory controller is configured to:
write data of a fourth number of bits to the fourth memory cell transistor;
write data of a fifth number of bits smaller than the fourth number to the fifth memory cell transistor;
write data of the fourth number of bits to the sixth memory cell transistor; and
write data of the fifth number of bits to the seventh memory cell transistor.

17. The memory system according to claim 16, wherein the memory controller is further configured to:
perform the writing to the fifth memory cell transistor after the writing to the fourth memory cell transistor,
perform the writing to the sixth memory cell transistor after the writing to the fifth memory cell transistor, and
perform the writing to the seventh memory cell transistor after the writing to the sixth memory cell transistor.

18. The memory system according to claim 16, wherein the memory controller is further configured to:
perform the writing to the fourth memory cell transistor after the writing to the fifth memory cell transistor,
perform the writing to the seventh memory cell transistor after the writing to the fourth memory cell transistor, and
perform the writing to the seventh memory cell transistor after the writing to the sixth memory cell transistor.

* * * * *